(12) United States Patent
Baumann et al.

(10) Patent No.: US 8,710,913 B2
(45) Date of Patent: Apr. 29, 2014

(54) CIRCUIT ARRANGEMENT AND METHOD FOR OPERATING A CIRCUIT ARRANGEMENT

(75) Inventors: Thomas Baumann, Anzing (DE); Christian Pacha, Grasbrunn-Neukeferloh (DE); Peter Mahrla, Zorneding (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/462,855

(22) Filed: May 3, 2012

(65) Prior Publication Data

US 2013/0293281 A1    Nov. 7, 2013

(51) Int. Cl.
*G05F 1/10*   (2006.01)

(52) U.S. Cl.
USPC ........... 327/540; 327/541; 327/393; 327/394; 327/395; 327/400

(58) Field of Classification Search
USPC ......... 327/158, 161, 262, 269, 270, 271, 276, 327/277, 392, 393, 394, 395, 396, 399, 400, 327/401, 403, 404, 419, 538, 540, 541
See application file for complete search history.

(56) References Cited

U.S. PATENT DOCUMENTS 6,389,091 B1 *   5/2002   Yamaguchi et al. .......... 375/376
8,324,974 B1 *   12/2012   Bennett ........................... 331/57

OTHER PUBLICATIONS

Manninger, M. "Power Management for Portable Devices". European Solid State Circuits Conference 2007 IEEE, pp. 167-173.
Alon, E., & Horowitz, M. "Integrated Regulation for Energy-Efficient Digital Circuits", Journal of Solid-State Circuits (IEEE), vol. 43, No. 8, Aug. 2008, pp. 1795-1807.
Gammie, B.G. et al., SmartReflex Power and Performance Management Technologies for 90 nm, 65 nm, and 45 nm Mobile Application Processors, Proceedings of the IEEE, vol. 98, No. 2, Feb. 2010, pp. 144-159.
Dean Truong et al., "A 167-processor 65 nm Computational Platform with Per-Processor Dynamic Supply Voltage and Dynamic Clock Frequency Scaling", 2008 IEEE, Symposium on VLSI Circuits Digest of Technical Papers, pp. 22-23.
Yasuyuki Okuma et al., "0.5-V Input Digital LDO with 98.7% Current Efficiency and 2.7-μA Quiescent Current in 65nm CMOS", 2010 IEEE, pp. 1-4.

* cited by examiner

*Primary Examiner* — Lincoln Donovan
*Assistant Examiner* — Jung H Kim

(57) ABSTRACT

According to one aspect of this disclosure, a circuit arrangement is provided, the circuit arrangement including an electronic component coupled to at least one common power supply node and configured to provide a first signal having a variation in time that is based on power supply via the at least one common power supply node; a detecting circuit coupled to the electronic component, the detecting circuit being configured to detect the first signal and to provide a digital switch array control signal based on the variation in time of the first signal; and a switch array coupled between the at least one common power supply node and at least one power supply source, the switch array being configured to control the power supply via the at least one common power supply node based on the digital switch array control signal.

20 Claims, 27 Drawing Sheets

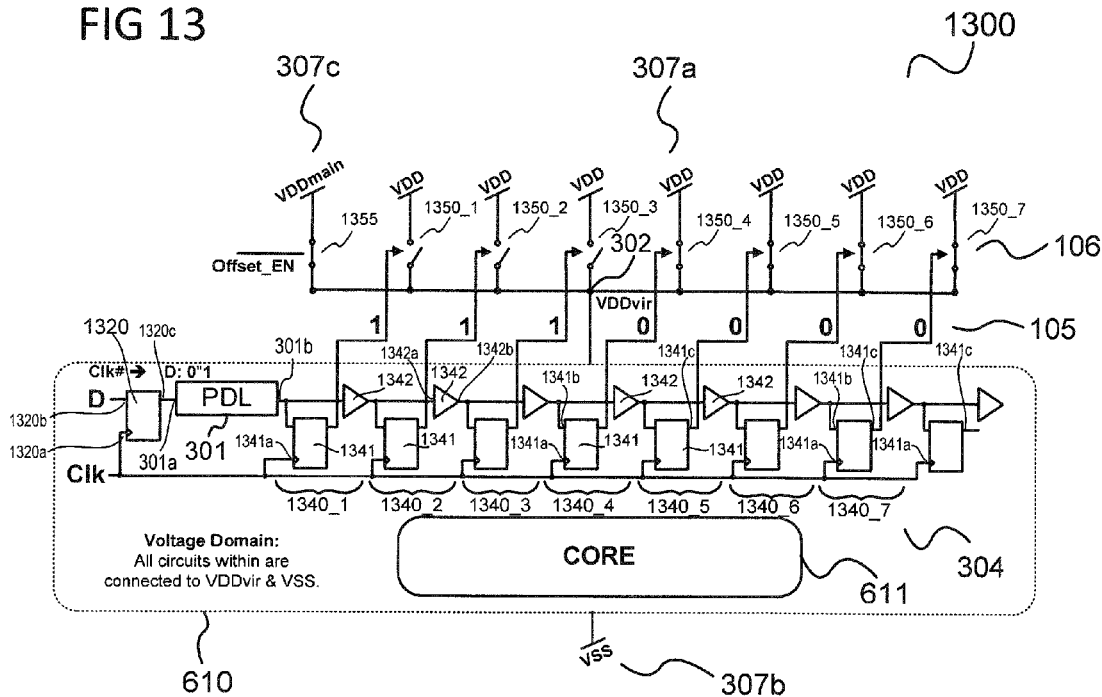
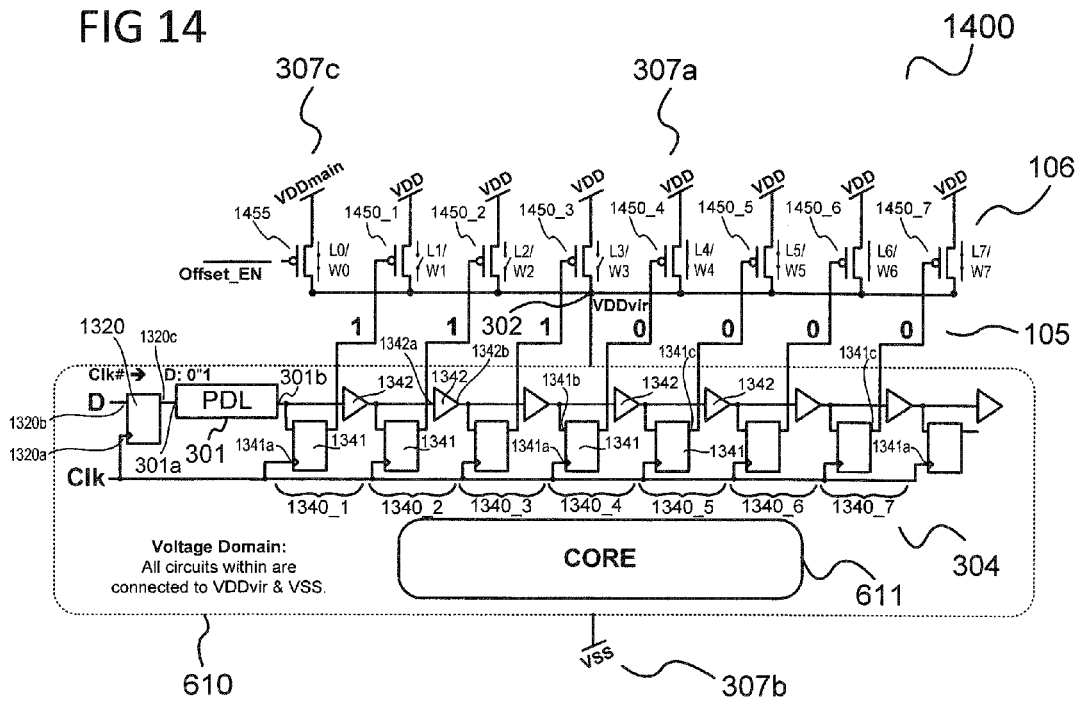

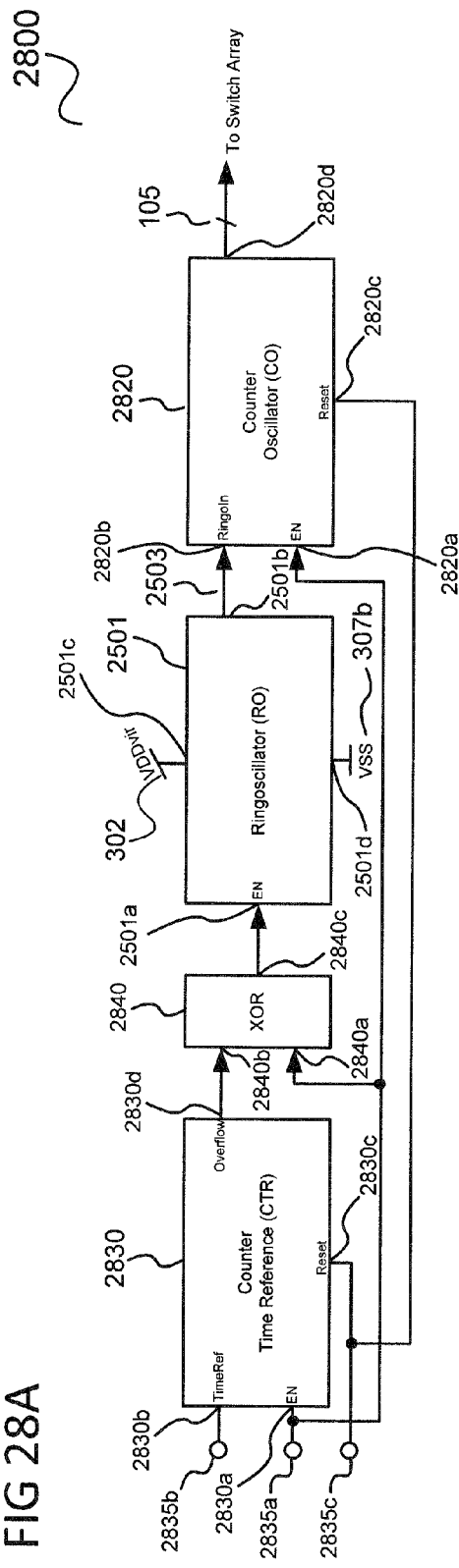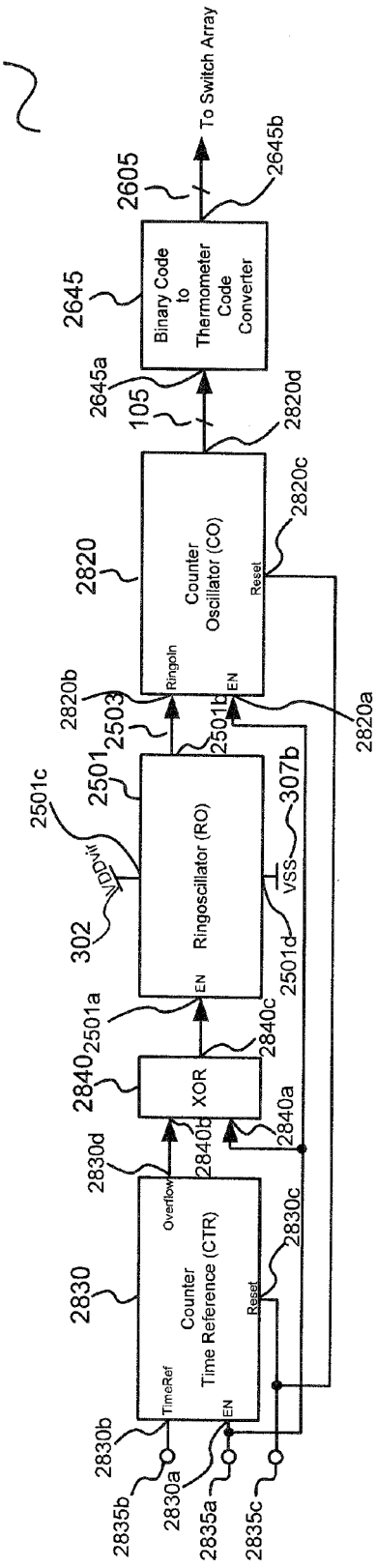

CIRCUIT ARRANGEMENT AND METHOD FOR OPERATING A CIRCUIT ARRANGEMENT

TECHNICAL FIELD

The invention relates generally to circuit arrangements and methods for operating a circuit arrangement.

BACKGROUND

Process and environmental variations (PVT) may affect performance of a circuit. It may be desirable to provide concepts that may enable a circuit to react quickly to such variations.

In deep submicron CMOS (complementary metal oxide semiconductor) technologies, the delay sensitivity of digital circuits to process and environmental variations (PVT), i.e. dynamic changes of e.g. supply voltage and temperature, increases significantly. For instance, a voltage drop of about 100 mV (10% VDD) as used in traditional timing sign-off may result in a frequency decrease of about 20-30% in 40 nm and 28 nm CMOS technology.

Due to unpredictable environmental variations as well as global and local process variations, which are hard to model on circuit scale, large performance margins are conventionally implemented to ensure proper circuit operation even for a worst case scenario. The major part of the margin accounts for environmental variations of about 30-40% of nominal circuit delay (voltage drop and temperature).

With technology shrink delay sensitivities may further increase, resulting in deeper impact of environmental variations. Additionally, more complex circuit structures due to the implementation of more sophisticated microarchitectures may lead to higher circuit sensitivity to PVT variations. Thus, technology shrink as well as microarchitecture changes may demand higher performance margins for traditional sign-off.

In addition to technological issues, the increasing circuit complexity, e.g. the increasing number of microprocessor cores in multi- and many-core microprocessors, and/or the large number of heterogeneous functional units in highly integrated System-On-Chips (SoC), may lead to locally varying and fast changing operating conditions. Therefore it may be desirable to react globally as well as locally on environmental variations, i.e. a distributed sense and react system may be needed.

Even though there are techniques to adapt e.g. supply voltage prior to an known increase of load current, these techniques still lack the capability to react very quickly to an unpredictable increase of load current as may be caused by the system's interrupt handling.

The reduction of performance margins by nearly "instantaneous" reaction to delay variations generally is of great interest as many publications about adaptive systems and monitoring concepts in the past few years show.

Reduction of speed margins and compensation of delay variations are objectives of conventional methodologies addressing adaptive systems and monitoring concepts.

Conventionally, sensors and monitor circuits are implemented to measure certain circuit parameters such as supply voltage, temperature, aging and process to be able to analyze chip status. The knowledge about chip status may allow for static and dynamic adaptation of operating parameters such as supply voltage, to ensure a proper circuit operation e.g. for slow process dies or in the case of temperature-induced delay variations during operation.

Conventionally, process classes are already determined by monitoring circuit performance. To account for process variations, a corresponding voltage setting (e.g. VDD setting) is taken from a pre-determined lookup-table (LUT) to ensure that the circuit operates at correct performance. But in addition to static process variations, dynamic variations such as voltage drop, temperature and aging may also affect circuit performance. To allow for the reduction of performance margins, circuit performance has also to be adapted to dynamic variations. This can also be done by using monitor circuits for sensing and LUTs which contain information about the amount of e.g. AVDD to compensate for temperature-variation induced delay changes.

Besides margin reduction, the significant increase of circuit sensitivity to PVT variations may demand a kind of emergency handling on circuit level in case of fast and significant dynamic variation events which may have the potential to cause system failures. Since most low-power circuits and systems already use dynamic voltage scaling (DVS) for power reasons, adapting supply voltage VDD according to the pre-determined chip status is conventionally the measure of first choice in literature.

Conventional concepts to suppress the impact of PVT on circuit performance are usually based on the measurement of a single parameter such as supply voltage, temperature, aging & process. To suppress PVT induced performance variations, according to conventional techniques either multi-dimensional look-up tables (LUT) are needed to map several circuit parameters to a single regulator value, or various countermeasures have to be taken based on the measurement of every single parameter measurement.

The conventional approach of adaptive/dynamic VDD techniques is shown in FIG. 30. As shown, according to the conventional approach VDD adaptation is done by the PMU (power management unit) according to the current chip status. Chip status is obtained by monitoring e.g. process class (fast, slow), temperature, aging etc. For a certain set of the parameters the amount of VDD adaptation is stored in a lookup-table. According to the stored value the PMU adjusts the supply voltage VDD. As can be seen, this procedure may take a significant amount of time, e.g. several microseconds.

Adaptation of supply voltage is conventionally achieved by changing the setting of the implemented voltage regulators.

In case of common DC-DC buck converters, the time-scale of dynamic variations of e.g. supply voltage (nanosecond time-scale) is much smaller than the time the voltage regulator takes for voltage adaptation according to the changed settings (10-100 microseconds). Thus, fast dynamic variations cannot be compensated by changing voltage regulator settings of a common DC-DC buck converter as used in low-power circuits and systems.

Even the faster low-dropout voltage regulators (LDO) may not be able to adapt supply voltage on nanosecond-scale. The basic principle of LDOs is to sense VDD and compare it to a pre-defined reference voltage. If the sensed voltage differs from the reference, the resistance of the serial resistor between a higher potential voltage source and VDD is changed. To allow for fast adaption, high-bandwidth error amplifiers are needed. Implementing an LDO based regulation scheme has two major drawbacks. On the one hand LDO circuits contain a large fraction of analog circuits or blocks like error amplifier and reference circuits (bandgap reference) or comparators. Compared to a fully digital solution, analog circuits are usually quite large and do not scale with technology as digital concepts do. On the other hand, due to sensing VDD, the voltage regulator only reacts to variations of supply voltage but not to e.g. temperature induced delay changes.

Hence, these kinds of regulators cannot be used as single solution to allow for compensation of variation induced delay changes, i.e. stable operation at a pre-defined circuit performance. Thus an LDO based fast voltage regulation technique would have to be combined with further adaptive circuit concepts to also compensate temperature and aging induced delay variations.

SUMMARY

A circuit arrangement according to one aspect of this disclosure may include: an electronic component coupled to at least one common power supply node and configured to provide a first signal having a variation in time that is based on (e.g. dependent on) power supply via the at least one common power supply node; a detecting circuit coupled to the electronic component, the detecting circuit being configured to detect the first signal and to provide a digital switch array control signal based on (e.g. dependent on) the variation in time of the first signal; and a switch array coupled between the at least one common power supply node and at least one power supply source, the switch array being configured to control the power supply via the at least one common power supply node based on (e.g. dependent on) the digital switch array control signal.

A circuit arrangement according to another aspect of this disclosure may include: a delay line coupled to at least one common power supply node and configured to provide a signal, wherein a delay of the signal is dependent on power supply via the at least one common power supply node; a time-to-digital converter coupled to the delay line, the time-to-digital converter being configured to detect the signal provided by the delay line and to provide a digital switch array control signal dependent on the delay of the signal; and a switch array coupled between the at least one common power supply node and at least one power supply source, the switch array being configured to control the power supply via the at least one common power supply node dependent on the digital switch array control signal.

A circuit arrangement according to another aspect of this disclosure may include: an oscillator coupled to at least one common power supply node and configured to provide a signal, wherein an oscillation frequency of the signal is dependent on power supply via the at least one common power supply node; a detecting circuit coupled to the oscillator, the detecting circuit being configured to detect the signal provided by the oscillator and to provide a digital switch array control signal dependent on the oscillation frequency of the signal; and a switch array coupled between the at least one common power supply node and at least one power supply source, the switch array being configured to control the power supply via the at least one common power supply node dependent on the digital switch array control signal.

A method for operating a circuit arrangement according to another aspect of this disclosure may include: providing a signal by an electronic component coupled to at least one common power supply node, wherein variation in time of the signal is dependent on power supply via the least one common power supply node; providing a digital switch array control signal dependent on the variation in time of the signal provided by the electronic component; and controlling the power supply via the at least one common power supply node by means of a switch array coupled between the at least one common power supply node and at least one power supply source, dependent on the digital switch array control signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of this disclosure are described with reference to the following drawings, in which:

FIG. 13 shows a circuit arrangement according to another aspect of this disclosure;

FIG. 14 shows a circuit arrangement according to another aspect of this disclosure;

FIGS. 28A and 28B show exemplary implementations of a ring oscillator based sensor for use in circuit arrangements according to various aspects of this disclosure;

DESCRIPTION

The following detailed description refers to the accompanying drawings that show, by way of illustration, specific details and aspects of this disclosure in which the invention may be practiced. These aspects are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

The terms "coupling" or "connection" as used herein may be understood to include both a direct "coupling" or "connection" and an indirect "coupling" or "connection".

Figure 1A:
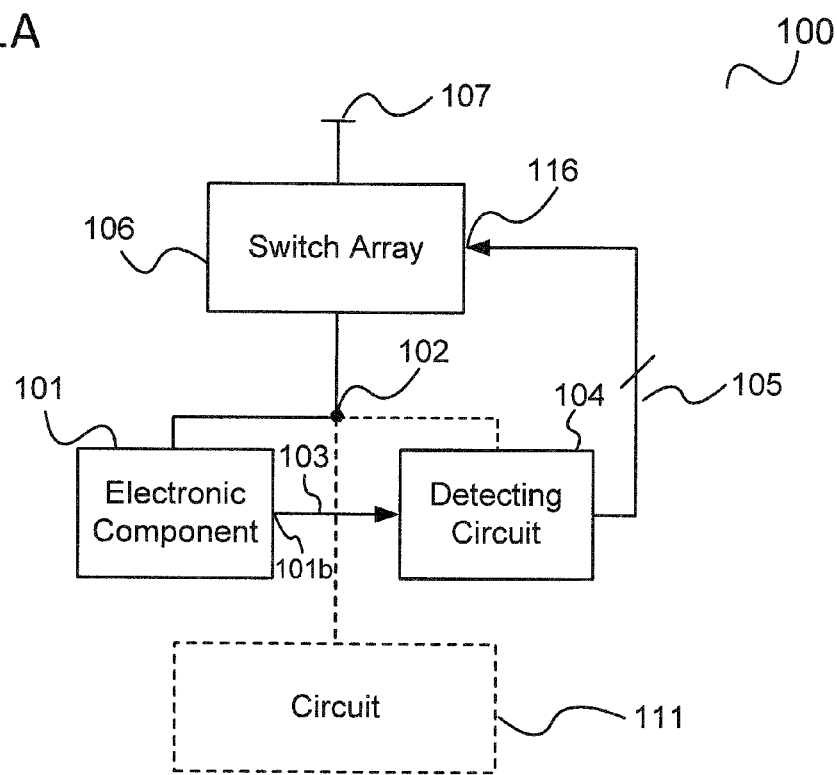
FIG. 1A shows a circuit arrangement according to an aspect of this disclosure.

FIG. 1A shows a circuit arrangement 100 according to an aspect of this disclosure.

The circuit arrangement 100 includes an electronic component 101.

The electronic component 101 is coupled to at least one common power supply node 102. For example, the electronic component 101 may include at least one power supply input that may be coupled to the at least one common power supply node 102. Thus, power may be supplied to the electronic component 101 via the at least one common power supply node 102.

The electronic component 101 is configured to provide a signal 103 wherein variation in time of the signal 103 is dependent on the power supply via the at least one common power supply node 102. In other words, the temporal behavior or time characteristics of the signal 103 may depend on the power supply via the at least one common power supply node 102. The signal 103 may, for example, be provided at a signal output 101b of the electronic component 101.

Figure 3:
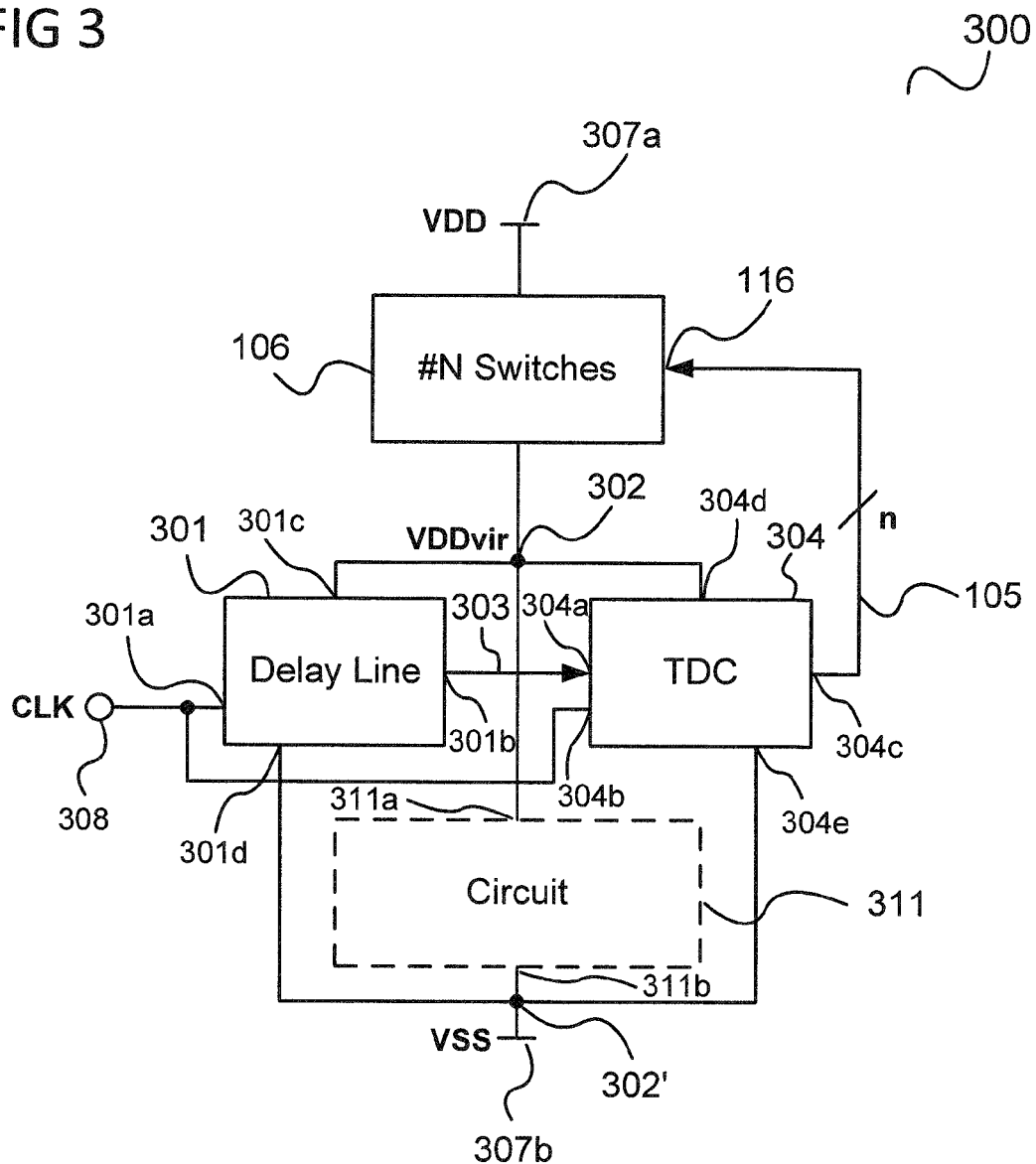
FIG. 3 shows a circuit arrangement according to another aspect of this disclosure.

As an example, the electronic component 101 may include or may be a delay line, e.g. a programmable delay line (see e.g. FIG. 3). In this case, the signal 103 may be a signal propagating through the delay line and provided at an output of the delay line, wherein a propagation delay of the signal may be dependent on the power supply via the at least one common power supply node 102.

Figure 25:
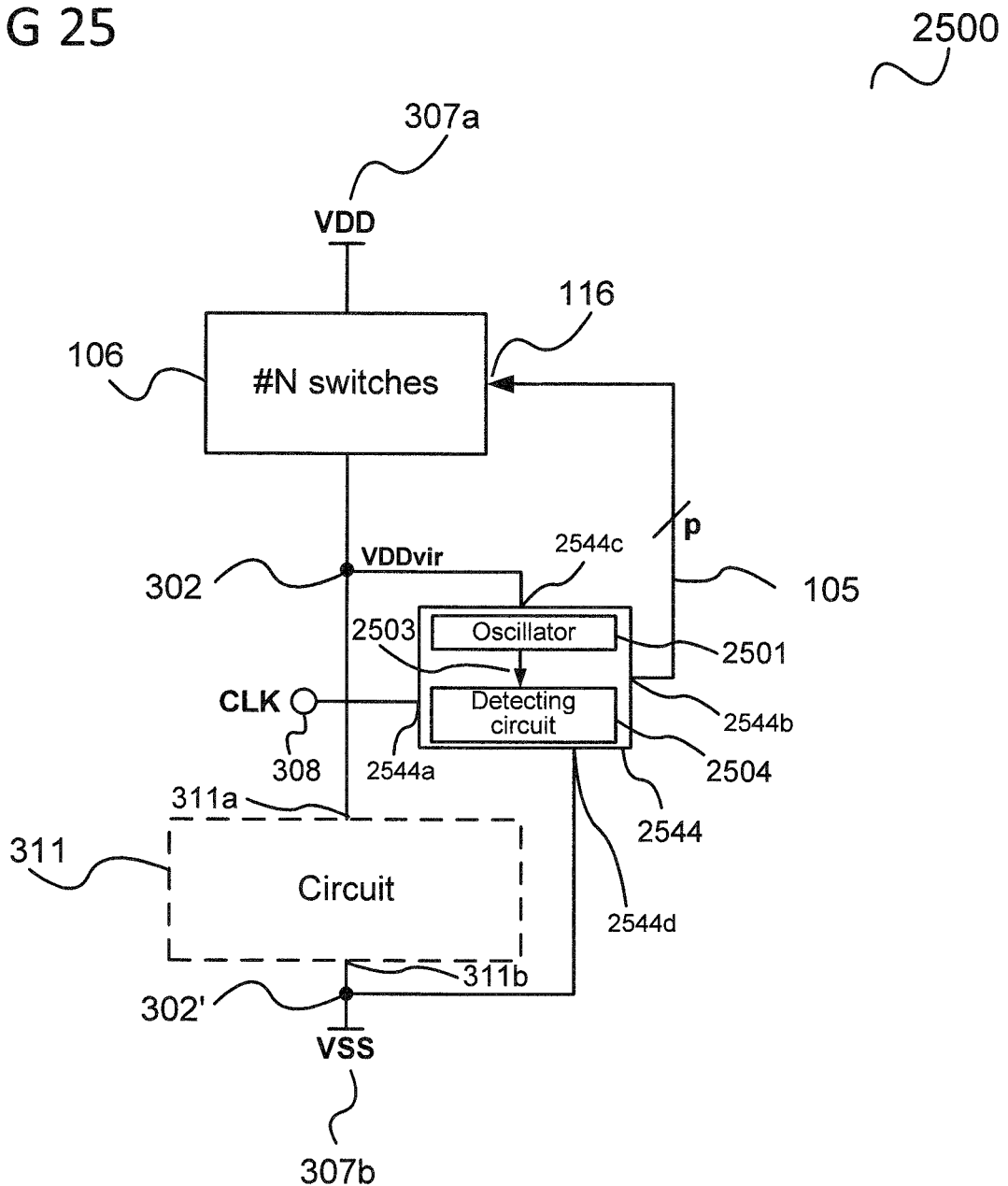
FIG. 25 shows a circuit arrangement according to another aspect of this disclosure.

As another example, the electronic component 101 may include or may be an oscillator, e.g. a ring oscillator (see e.g. FIG. 25). In this case the signal 103 may be a signal provided by the oscillator, wherein an oscillation frequency of the signal may be dependent on the power supply via the at least one common power supply node 102.

As described above, the variation in time of the signal 103 (e.g. the signal propagation delay of a signal propagating through a delay line, or the oscillation frequency of an oscillator signal) is dependent on the power supply via the at least one common power supply node 102. In case that the variation in time of the signal 103 deviates from a predetermined or nominal behavior (e.g. the delay of a signal propagating through the delay line deviates from a predetermined or nominal signal delay, or the oscillation frequency of the oscillator signal deviates from a predetermined or nominal oscillator frequency), e.g. due to process and environmental variations (PVT), for example due to an increase/decrease of the temperature above/below a nominal temperature, the power supply via the at least one common power supply node 102 may be controlled (in other words, changed) such that the variation in time of the signal 103 may return to the predetermined behavior.

Control of the power supply via the at least one common power supply node 102 may be achieved by a switch array 106 coupled between the at least one common power supply node 102 and at least one power supply 107 (herein also referred to as power supply source).

The circuit arrangement 100 further includes a detecting circuit 104 coupled to the electronic component 101.

The detecting circuit 104 is configured to detect the signal 103 provided by the electronic component 101 and to provide a digital switch array control signal 105 dependent on the variation in time of the signal 103 provided by the electronic component 101. In other words, the detecting circuit 104 may be configured to translate the time characteristics or temporal behavior of the electronic component 101's signal 103 into a digital switch array control signal 105.

As an example, the detecting circuit 104 may include or may be a time-to-digital converter (TDC), for example in case that the electronic component 101 includes or is a delay line (see e.g. FIG. 3). The time-to-digital converter (TDC) may, for example, be coupled to the output of the delay line and may be configured to detect the signal provided at the output of the delay line and to provide the digital switch array control signal 105 dependent on the propagation delay of the signal by the delay line. In other words, the TDC may translate the delay line's signal delay into a corresponding digital switch array control signal, wherein the digital switch array control signal may change when the delay changes (e.g. due to PVT variations).

As another example, the detecting circuit 104 may include or may be a frequency determination circuit, for example in case that the electronic component 101 includes or is an oscillator (see e.g. FIG. 25). The frequency determination circuit may, for example, be coupled to the output of the oscillator and may be configured to detect the signal provided at the output of the oscillator and to provide the digital switch array control signal 105 dependent on the oscillation frequency of the signal. In other words, the frequency determination circuit may translate the oscillator's oscillation frequency into a corresponding digital switch array control signal, wherein the digital switch array control signal may change when the oscillation frequency changes (e.g. due to PVT variations).

The circuit arrangement 100 further includes the switch array 106 coupled between the at least one common power supply node 102 and at least one power supply 107. The at least one power supply 107 may provide an upper supply voltage (e.g. "VDD") and/or a lower supply voltage (e.g. "VSS"). The switch array 106 is configured to control the power supply via the at least one common power supply node 102 dependent on the digital switch array control signal 105. To this end, the digital switch array control signal 105 may be coupled to at least one control signal input 116 of the switch array 106, as shown.

The switch array 106 may include at least one switch, or a plurality of switches, (see e.g. FIG. 11) coupled between the at least one common power supply node 102 and the at least one power supply 107. The switch(es) may be controlled by the digital switch array control signal 105. For example, the digital switch array control signal 105 may be provided to a respective control terminal or respective control terminals of the switch(es).

In an example, at least one of the switches, e.g. a plurality of the switches, e.g. all of the switches, of the switch array 106 may include or may be a transistor, for example a MOS transistor, e.g. a PMOS transistor or an NMOS transistor (see e.g. FIG. 14).

Figure 15:
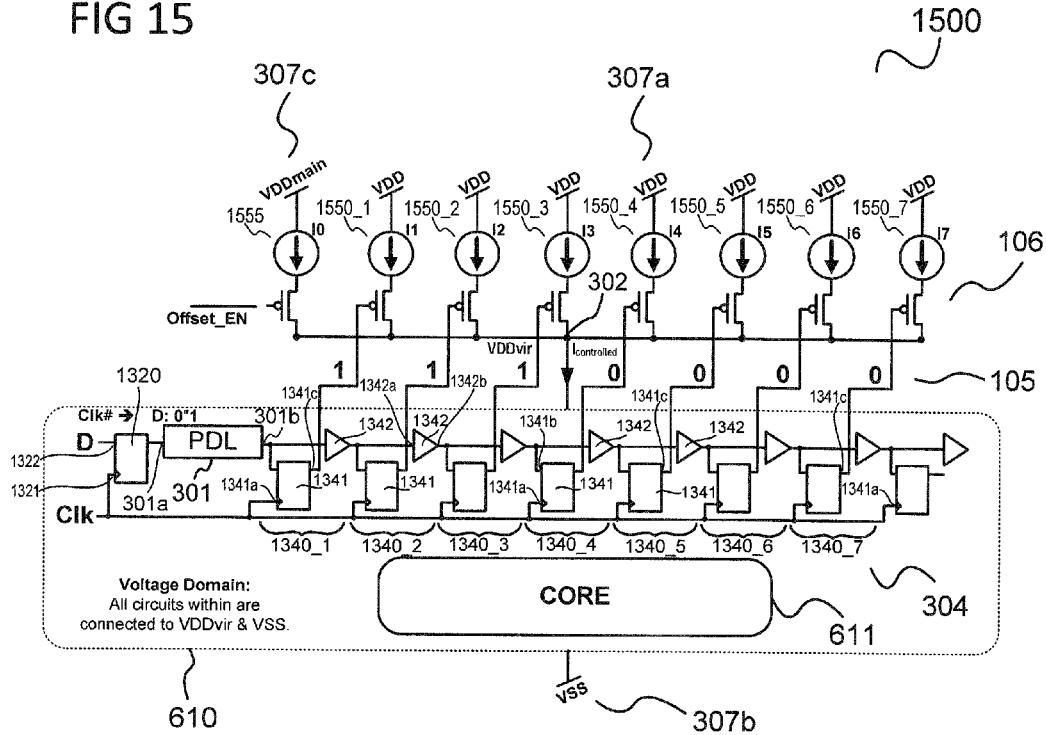
FIG. 15 shows a circuit arrangement according to another aspect of this disclosure.

In another example, at least one of the switches, e.g. a plurality of the switches, e.g. all of the switches, may include or may be a switched current source, including e.g. a series connection of a switch (e.g. a transistor, e.g. a MOS transistor, e.g. a PMOS transistor or NMOS transistor) and a current source (see e.g. FIG. 15).

Figure 16:
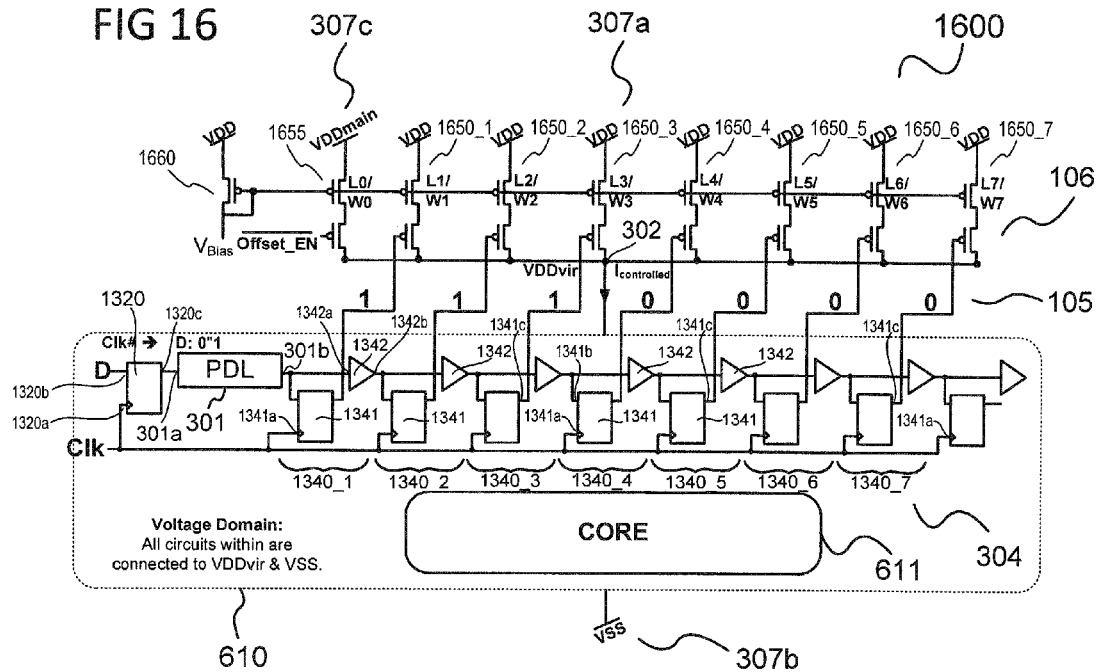
FIG. 16 shows a circuit arrangement according to another aspect of this disclosure.

In another example, at least one of the switches, e.g. a plurality of the switches, e.g. all of the switches, may include or may be a switched current mirror, including e.g. a series connection of a switch (e.g. a transistor, e.g. a MOS transistor, e.g. a PMOS transistor or NMOS transistor) and a current minor (e.g. a MOS current minor, e.g. a PMOS or NMOS current minor), see e.g. FIG. 16.

According to one aspect of this disclosure, the switch or switches of the switch array 106 may be controlled by the digital switch array control signal 105. For example, the digital switch array control signal 105 may be a digital output word containing a number of bits. In an example, the number of bits may correspond or be equal to the number of switches of the switch array 106 to be controlled by the digital switch array control signal 105. However, it may also be possible that the number of bits is different from the number of switches to be controlled by the digital switch array control signal, for example in case that a plurality of switches are controlled by the same bit of the digital switch array control signal 105 (see e.g. FIG. 17).

Illustratively, the detecting circuit 104 detecting the signal 103 provided by the electronic component 101 and providing the digital switch array control signal 105 dependent on the variation in time of the signal 103, and the switch array 106 controlling power supply to the electronic component 101 via the at least one common power supply node 102 dependent on the digital switch array control signal 105, may be regarded as a feedback loop or feedback control. This feedback loop or feedback control may be used for performance regulation of a circuit 111 to be kept at constant performance (for example, a functional circuit, e.g. a core circuit), which may be coupled to the at least one common power supply node 102 (as shown by a dashed line in FIG. 1).

The detecting circuit 104 may be coupled to the at least one common power supply node 102 (as shown by a dashed line in FIG. 1) so that the switch array 106 may also control power supply to the detecting circuit 104 via the at least one common power supply node 102. Alternatively, the detecting circuit 104 may be coupled to the at least one power supply 107 without the switch array 106 coupled in-between.

Figure 1B:
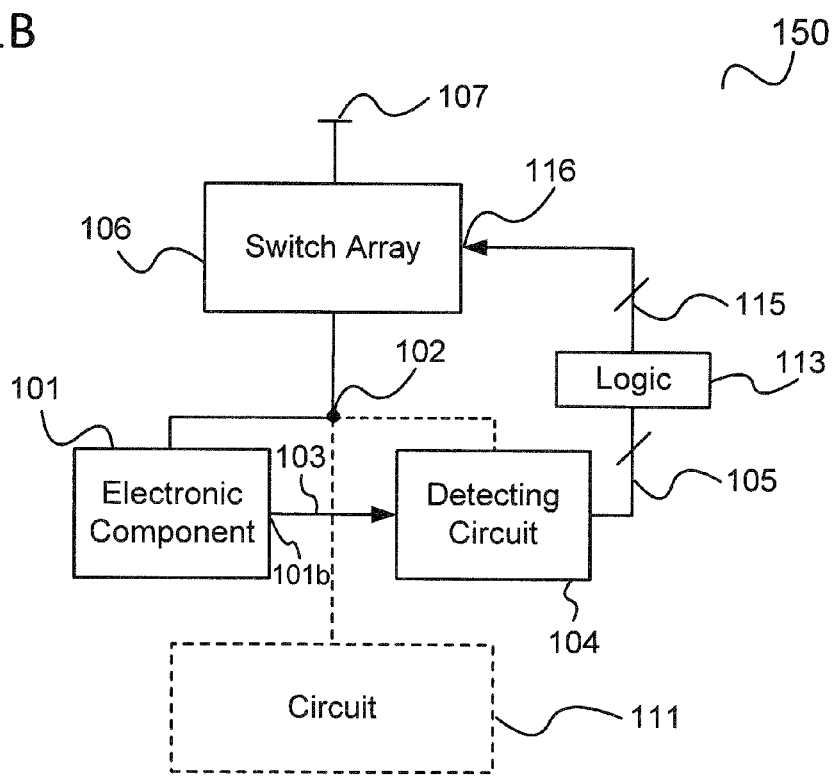
FIG. 1B shows a circuit arrangement according to an aspect of this disclosure.

FIG. 1B shows a circuit arrangement 150 according to another aspect of this disclosure.

The circuit arrangement 150 is to some degree similar to the circuit arrangement 100 shown in FIG. 1A, and identical reference signs denote the same or similar elements as there and will not be described in detail again here. Reference is made to the description above.

The circuit arrangement 150 differs from the circuit arrangement 100 in that a logic circuit 113 (herein also referred to as logic block or, short, logic) is coupled between the detecting circuit 104 and the switch array 106. The logic circuit 113 may receive the digital switch array control signal 105 from the detecting circuit 104 and may be configured to apply some operation or perform some functions onto the digital switch array control signal 105 and provide a digital control signal 115 to the switch array 106 based on that operation. The digital control signal 115 may be a digital output word containing a number of bits. The number of bits of the digital control signal 115 may be the same as the number of bits of the digital switch array control signal 105 provided by the detecting circuit 104. Alternatively, the number of bits of the digital control signal 115 may be different from the number of bits of the digital switch array control signal 105.

The logic circuit 113 may, for example, implement at least one of the following functionalities: a buffer functionality, a hysteresis functionality, a filter functionality, an enable-disable functionality, a bitwise re-mapping functionality, an encoding functionality, a decoding functionality, a compression functionality, a decompression functionality. Alternatively or in addition, the logic circuit 113 may implement other functionalities.

For example, the logic circuit 113 may be configured to achieve a linear mapping, e.g. mapping the bits of the digital switch array control signal 105 to the bits of the digital control signal 115.

As another example, the logic circuit 113 may be configured as a digital filter. The filter may, for example, be tuned to obtain an improved stability of the feedback control. For example, the filter may be configured to filter high frequency parts of the digital switch array control signal 105.

The circuit arrangements 100 and 150 may be used to regulate the performance of the circuit 111. To this end, the electronic component 101 may be configured such that a nominal variation in time of the signal 103 provided by the electronic component 101 is equal to or substantially equal to a nominal variation in time of a signal provided by at least one circuit structure of the circuit 111. For example, in case that the electronic component 101 is configured as a delay line, a nominal signal delay of the delay line may be equal to or substantially equal to a nominal signal delay of at least one circuit structure in the circuit 111. Furthermore, a sensitivity of the signal delay of the delay line to PVT variations may, for example, be equal to or substantially equal to a sensitivity of the signal delay of the at least one circuit structure of the circuit 111 to PVT variations, as will be described further below.

Figure 2:
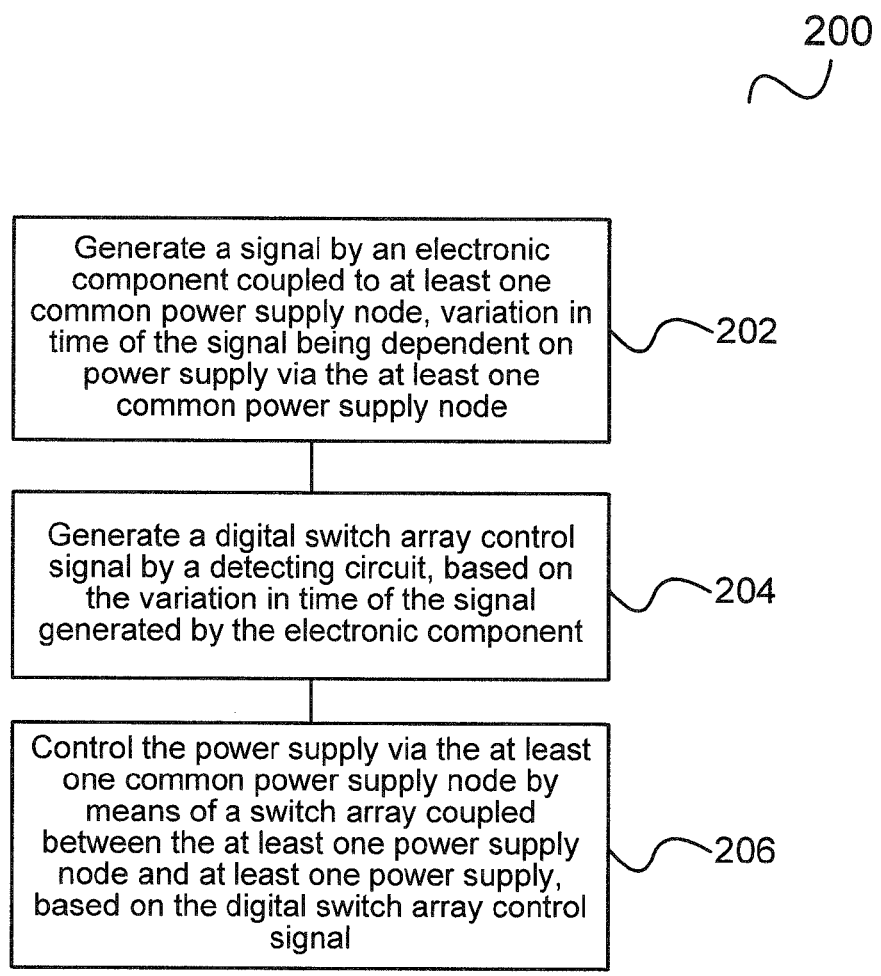
FIG. 2 shows a method for operating a circuit arrangement according to another aspect of this disclosure.

FIG. 2 shows a method 200 for operating a circuit arrangement according to another aspect of this disclosure.

In 202, an electronic component coupled to at least one common power supply node generates a signal, wherein variation in time of the signal is dependent on power supply via the least one common power supply node. The electronic component may, for example, be configured according to one or more aspects of this disclosure, for example as a delay line or as an oscillator (e.g. ring oscillator).

In 204, a detecting circuit generates a digital switch array control based on the variation in time of the signal generated by the electronic component in step 202. The detecting circuit may, for example, be configured according to one or more aspects of this disclosure, for example as a time-to-digital converter (TDC) or as a frequency determination circuit.

In 206, a switch array coupled between the at least one common power supply node and at least one power supply (or power supply source) controls the power supply via the at least one common power supply node based on the digital switch array control signal generated in step 204. The switch array may, for example, be configured according to one or more aspects of this disclosure.

FIG. 3 shows a circuit arrangement 300 according to another aspect of this disclosure.

The circuit arrangement 300 includes an electronic component configured as a delay line 301. The delay line 301 may include a first power supply input 301c that may be coupled to a first common power supply node 302. Thus, power may be supplied to the delay line 301 via the first common power supply node 302. A voltage level at the first common power supply node 302 is denoted as VDDvir. The voltage level VDDvir at the first common power supply node 302 may illustratively represent an effective upper supply voltage (herein also referred to as virtual upper supply voltage). The delay line 301 may further include a second power supply input 301d that may be coupled to a second common power supply node 302'. The second common power supply node 302' may be coupled to a second power supply 307b (herein also referred to as second power supply source). The second power supply 307b may be a lower power supply providing e.g. a lower supply voltage VSS as shown in FIG. 3. Illustratively, the delay line 301 may be coupled between a virtual upper supply voltage VDDvir at the first common power supply node 302 and a lower supply voltage VSS at the second common power supply node 302'.

The delay line 301 is configured to provide a signal 303. The signal 303 provided by the delay line 301 may be a signal that enters the delay line 301 at a signal input 301a of the delay line 301, propagates along a signal propagation path through the delay line 301 and exits the delay line 301 with a certain time delay at a signal output 301b of the delay line 301. The signal entering the delay line 301 at the signal input 301a may, for example, be a clock signal CLK, as shown in FIG. 3. The clock signal CLK may be provided at a signal input 308 (herein also referred to as clock signal input) of the circuit arrangement 300, which may be coupled to the signal input 301a of the delay line 301, as shown.

The delay line 301 may, for example, include one or more delay elements or structures in the signal propagation path (in other words, elements or structures that may have a delaying effect on a signal propagating along the signal propagation path) between the signal input 301a and the signal output 301b of the delay line 301 (see e.g. FIGS. 9A to 9C and FIG. 10). For example, the delay line 301 may include one or more elements or structures that are similar or identical to elements or structures of a circuit 311 to be operated at constant performance (e.g. a core circuit). Examples for such elements or structures may include, but are not limited to, critical paths, replicas of critical paths, memory paths, replicas of memory paths, input/output (I/O) paths, replicas of I/O paths (see e.g. FIG. 10). A (nominal) time delay of the signal 303 provided at the signal output 301b of the delay line 301 may be determined, for example, by the number and/or type of delay elements or structures that are present in the signal propagation path between the signal input 301a and signal output 301b of the delay line 301.

According to one aspect of this disclosure, the delay line 301 may be configured as a programmable delay line (PDL). In this case, a (nominal) signal propagation delay of the delay line 301 may be programmed or set, for example by setting the number and/or type of "active" delay elements or structures present in the signal propagation path. To this end, the delay line 301 may, for example, include a signal propagation delay setting input for setting the (nominal) signal propagation delay of the delay line 301.

A delay of the signal 303 by the delay line 301 is dependent on the power supply via the first common power supply node 302. In other words, the signal propagation delay by the delay line 301 may be influenced, inter alia, by the power supply to the delay line 301 via the first common power supply node 302. For example, the signal propagation delay 301 may be dependent on the difference between the effective upper supply voltage VDDvir and the lower supply voltage VSS, i.e. VDDvir–VSS. For example, according to one aspect of this disclosure, increasing the voltage level VDDvir at the first common power supply node 302 (or, increasing charge injection via the first common power supply node 302) may lead to a decrease in the signal propagation delay, while decreasing the voltage level VDDvir (or, decreasing the charge injection via the first common power supply node 302) may lead to an increase in the signal propagation delay. Illustratively, a signal propagating through the delay line 301 may be "faster" when the voltage difference VDDvir=VSS is increased, and "slower" when VDDvir–VSS is decreased.

Thus, in case that the signal propagation delay of the delay line 301 deviates from a predetermined or nominal value, e.g. due to PVT variations, e.g. due to a temperature change or change in the supply voltage, the voltage level VDDvir at the first common power supply node 302 (or, charge injection via the first common power supply node 302) may be controlled such that the signal propagation delay of the delay line 301 returns to the predetermined or nominal value. For example, if the signal propagation delay of the delay line 301 increases above the predetermined or nominal value, the voltage level VDDvir at the first common power supply node 302 (or, charge injection via the first common power supply node 302) may be increased to decrease the signal propagation delay again. On the other hand, if the signal propagation delay of the delay line 301 decreases below the predetermined or nominal value, the voltage level VDDvir at the first common power supply node 302 (or, charge injection via the first common power supply node 302) may be decreased to increase the signal propagation delay again.

Control of the voltage level VDDvir at the first common power supply node 302 (or, of charge injection via the first common power supply node 302) may be achieved by means of a switch array 106 coupled between the first common power supply node 302 and a first power supply 307a (herein also referred to as first power supply source). The first power supply 307a may provide an upper supply voltage VDD, as shown. The upper supply voltage VDD may be coupled to each of a number (e.g. a plurality) of switches of the switch array 106, see e.g. FIG. 11.

The circuit arrangement 300 further includes a detecting circuit 304 configured as a time-to-digital converter (TDC) and coupled to the delay line 301. The TDC 304 may include a first signal input 304a coupled to the signal output 301b of the delay line 301, and a second signal input 304b coupled to the clock signal input 308 of the circuit arrangement 300. Thus, the signal 303 provided by the delay line 301 (illustratively, the delayed clock signal CLK) may be applied to the first signal input 304a of the TDC 304, and the (non-delayed) clock signal CLK may be applied to the second signal input 304b of the TDC 304.

The TDC 304 is configured to detect the signal 303 provided by the delay line 301 and to provide a digital switch array control signal 105 dependent on the propagation delay of the signal 303 by the delay line 301. Illustratively, the TDC 304 may be configured to detect or measure a time delay between the non-delayed clock signal CLK applied to the second signal input 304b of the TDC 304 and the delayed signal 303 applied to the first signal input 304a of the TDC 304, and to translate the detected or measured time delay into the digital switch array control signal 105.

In the circuit arrangement 300 of FIG. 3, the digital switch array control signal 105 is configured as a digital output word containing n bits (n being a positive integer, i.e. n≥1). Thus, the digital switch array control signal 105 may also be referred to as n bit digital output word in the following. The number n of bits of the digital switch array control signal 105 may correspond to a number of switches of the switch array 106, which may be opened and closed according to the n bit digital output word 105, as will be described in more detail further below. The n bit digital output word 105 provided by the TDC 304 may, for example, be a thermometer code representation corresponding to the time delay. In this case, it may be possible that each bit of the n bits controls a respective switch of the switch array 106. In other words, according to the state of a given bit, the respective switch may be open or closed.

A first power supply input 304d of the TDC 304 may be coupled to the first common power supply node 302 and thus to the virtual upper supply voltage, and a second power supply input 304e of the TDC 304 may be coupled to the second common power supply node 302' and thus to the lower supply voltage VSS. Illustratively, the TDC 304 may be coupled between the virtual upper supply voltage VDDvir at the first common power supply node 302 and the lower supply voltage VSS at the second common power supply node 302'.

The circuit arrangement 300 further includes the switch array 106 coupled between the first common power supply node 302 and the first power supply 307a.

The switch array 106 is configured to control the power supply via the first common power supply node 302 dependent on the digital switch array control signal 105. To this end, the digital switch array control signal 105 may be coupled to at least one control signal input 116 of the switch array 106, as shown. The switch array 106 may include n switches (n being equal to or greater than one), wherein each of the switches may be coupled between the first common power supply node 302 and an upper supply voltage VDD provided by the first power supply 307a (see e.g. FIG. 11).

The switch state (i.e. open or closed) of the n switches may be controlled by the n bit digital output word 105. That is, the state of a first switch of the n switches may be controlled by a first bit of the n bit digital output word 105 (provided e.g. to a control terminal of the first switch), the state of a second switch of the n switches may be controlled by a second bit of the n bit digital output word 105 (provided e.g. to a control terminal of the second switch), etc., . . . , and the state of an n-th switch of the n switches may be controlled by an n-th bit of the n bit digital output word 105 (provided e.g. to a control terminal of the n-th switch).

Thus, the switch array 106 may connect the upper supply voltage VDD up to n times to the first common power supply node 302, depending on the switch states (i.e. open or closed) of the individual switches of the switch array 106.

Illustratively, the TDC 304 detecting the signal 303 provided by the delay line 301 and providing the digital switch array control signal 105 dependent on the delay of the signal 303, and the switch array 106 controlling power supply to the delay line 301 via the first common power supply node 302 dependent on the digital switch array control signal 105, may be regarded as a feedback loop or feedback control.

According to one aspect of this disclosure, the circuit arrangement 300 may further include a circuit 311 to be operated at constant performance (e.g. a core circuit). A first power supply input 311a of the circuit 311 may be coupled to the first common power supply node 302 and thus to the virtual upper supply voltage VDDvir, and a second power supply input 311b of the circuit 311 may be coupled to the second common power supply node 302' and thus to the lower power supply voltage VSS. Illustratively, the circuit 311 may be coupled between the virtual upper supply voltage VDDvir at the first common power supply node 302 and the lower supply voltage VSS at the second common power supply node 302'.

The circuit 311 may reside in the same voltage domain as the delay line 301. That is, the circuit 311, or elements or structures of the circuit 311, may be fed with the same supply voltages as the delay line 301, i.e. with the virtual upper supply voltage VDDvir via the first common power supply node 302 and the lower supply voltage VSS via the second common power supply node 302', as shown in FIG. 3.

According to another aspect of this disclosure, the delay line 301 may have a structure that is similar or identical to at least one circuit structure of the circuit 311, for example a critical path or replica of a critical path of the circuit 311 (if present in the circuit 311), or an I/O path or replica of an I/O path of the circuit 311 (if present in the circuit 311), or a memory path or replica of a memory path of the circuit 311 (if present in the circuit 311), or others. Thus, the delay line 301's (nominal) signal propagation delay and/or the sensitivity of the delay line 301's signal propagation delay to process and environmental variations (PVT) may be similar or the same as for the corresponding circuit structure of the circuit 311. In other words, the delay line 301 may react in a similar or identical manner to PVT variations as the corresponding circuit structure of the circuit 311, and controlling the voltage level of the virtual upper supply voltage VDDvir by means of the feedback loop may have the same influence on the signal delay of the circuit 311's circuit structure as on the signal delay of the delay line 301.

In the circuit arrangement 300 shown in FIG. 3, the first power supply input 304d of the TDC 304 is coupled to the first common power supply node 302 and thus to the virtual upper supply voltage VDDvir, and the second power supply input 304e of the TDC 304 is coupled to the second common power supply node 302' and thus to the lower supply voltage VSS. Thus, the TDC 304 illustratively resides in the same voltage domain as the delay line 301 and the circuit 311, so that the switch array 106 may also control power supply to TDC 304 via the first common power supply node 302. Alternatively, the TDC 304 may be coupled to the upper supply voltage VDD without the switch array 106 coupled in-between.

Illustratively, FIG. 3 shows an example of a circuit arrangement, where the level of an upper virtual supply voltage VDDvir may be controlled by means of a feedback loop. Alternatively or in addition, the level of a lower virtual supply voltage VSSvir may be controlled, as will be described in connection with FIG. 4 and FIG. 5.

Figure 4:
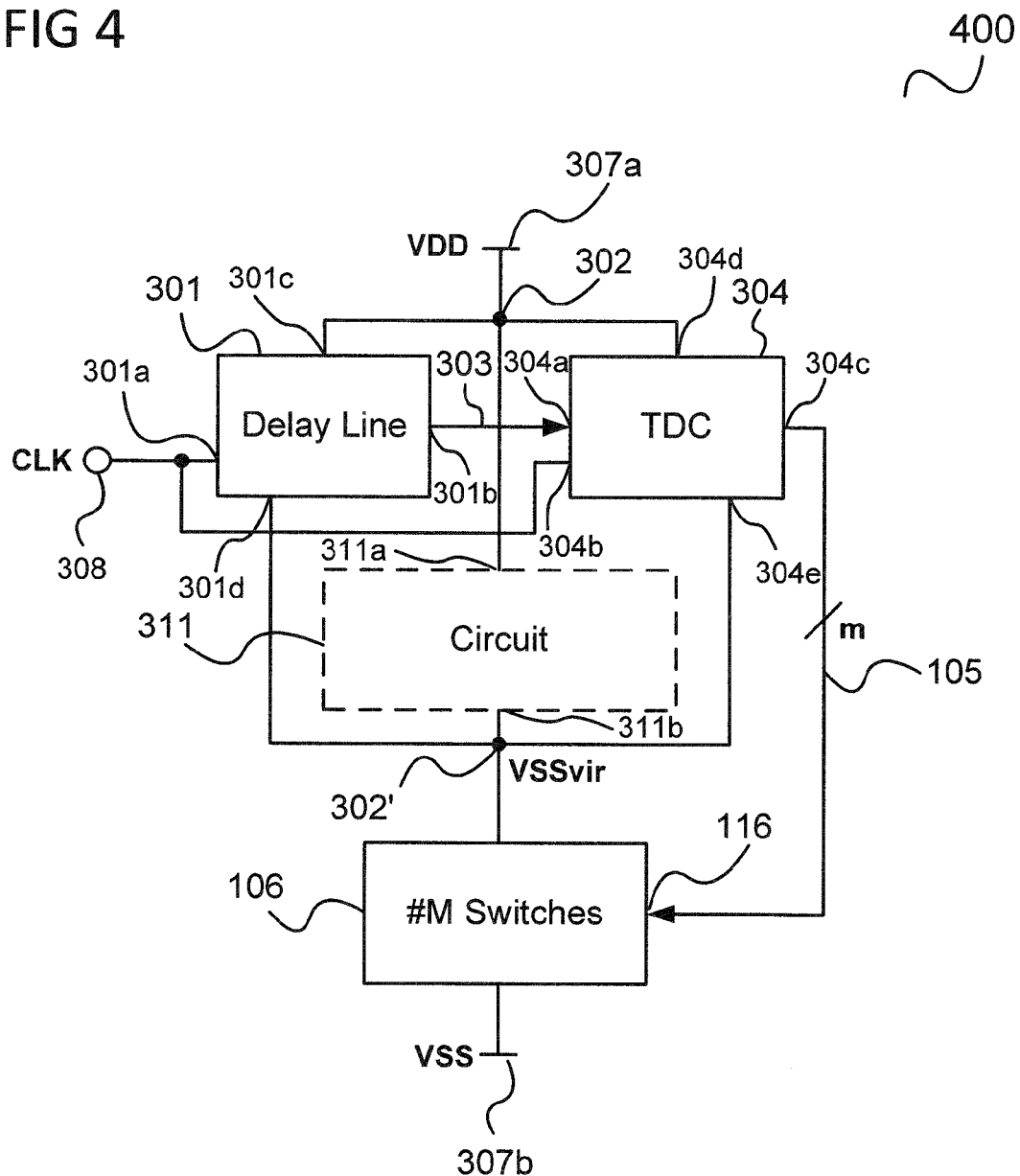
FIG. 4 shows a circuit arrangement according to another aspect of this disclosure.

FIG. 4 shows a circuit arrangement 400 according to another aspect of this disclosure.

The circuit arrangement 400 is to some degree similar to the circuit arrangement 300 shown in FIG. 3, and identical reference signs denote the same or similar elements as there and will not be described in detail again here. Reference is made to the description above.

The circuit arrangement 400 differs from the circuit arrangement 300 in that a switch array 106 is coupled between the second common power supply node 302' and the second power supply 307b, while the first common power supply node 302 is coupled to the first power supply 307a without a switch array coupled in-between.

In the circuit arrangement 400, the digital switch array control signal 105 provided by the time-to-digital converter (TDC) 304 is configured as an m bit digital output word (m being a positive integer) to control the switch array 106. The number m of bits of the digital switch array control signal 105 may correspond to a number of switches of the switch array 106 to be controlled by the digital switch array control signal 105.

In the circuit arrangement 400 of FIG. 4, a voltage level at the second common power supply node 302' is denoted as VSSvir. The voltage level VSSvir at the second common power supply node 302' may illustratively represent an effective lower supply voltage (herein also referred to as virtual lower supply voltage).

Thus, in the circuit arrangement 400 of FIG. 4 the delay line 301, the TDC 304 and the circuit 311 may in each case be coupled between the virtual lower supply voltage VSSvir at the second common power supply node 302' and the upper supply voltage VDD at the first common power supply node 302, as shown.

In the circuit arrangement 400, a delay of the signal 303 by the delay line 301 is dependent on the power supply via the second common power supply node 302'. In other words, the signal propagation delay by the delay line 301 may be influenced, inter alia, by the power supply to the delay line 301 via the second common power supply node 302'. For example, the signal propagation delay 301 may be dependent on the difference between the upper supply voltage VDD and the effective lower supply voltage VSSvir, i.e. VDD−VSSvir. For example, according to one aspect of this disclosure, decreasing the voltage level VSSvir at the second common power supply node 302' (or, increasing charge drain via the second common power supply node 302') may lead to a decrease in the signal propagation delay, while increasing the voltage level VSSvir (or, decreasing the charge drain via the second common power supply node 302') may lead to an increase in the signal propagation delay. Illustratively, a signal propagating through the delay line 301 may be "faster" when the voltage difference VDD−VSSvir is increased, and "slower" when VDD−VSSvir is decreased.

Thus, in case that the signal propagation delay of the delay line 301 deviates from a predetermined or nominal value, e.g. due to PVT variations, e.g. due to a temperature change or change in the supply voltage, the voltage level VSSvir at the second common power supply node 302' (or, charge drain via the second common power supply node 302') may be controlled (i.e. increased or decreased) such that the signal propagation delay of the delay line 301 returns to the predetermined value.

For example, if the signal propagation delay of the delay line 301 increases above the predetermined or nominal value, the voltage level VSSvir at the second common power supply node 302' may be decreased (or, charge drain via the second common power supply node 302' may be increased) to decrease the signal propagation delay again. On the other hand, if the signal propagation delay of the delay line 301 decreases below the predetermined or nominal value, the voltage level VSSvir at the second common power supply node 302' may be increased (or, charge drain via the second common power supply node 302 may be decreased) to increase the signal propagation delay again.

Control of the voltage level VSSvir at the second common power supply node 302' (or, of charge drain via the second common power supply node 302') may be achieved by means of the switch array 106 coupled between the second common power supply node 302' and the second power supply 307b. The second power supply 307b may be coupled to each of a number (e.g. a plurality) of switches of the switch array 106, see e.g. FIG. 11.

The switch array 106 is configured to control the power supply via the second common power supply node 302' dependent on the digital switch array control signal 105 (m bit digital output word). To this end, the digital switch array control signal 105 may be coupled to at least one control signal input 116 of the switch array 106, as shown. The switch array 106 may include m switches (m being equal to or greater than one), wherein each of the switches may be coupled between the second common power supply node 302' and the lower supply voltage VSS provided by the second power supply 307b.

According to one aspect of this disclosure, a state (i.e. open or closed) of a first switch of the m switches of the switch array 106 may be controlled by a first bit of the m bit digital output word 105, a state of a second switch of the m switches may be controlled by a second bit of the m bit digital output word 105, etc., . . . , and a state of an m-th switch of the m switches may be controlled by an m-th bit of the m bit digital output word 105.

Thus, the switch array 106 may connect the lower supply voltage VSS up to m times to the second common power supply node 302', depending on the switch states (i.e. open or closed) of the individual switches of the switch array 106.

Illustratively, the TDC 304 detecting the signal 303 provided by the delay line 301 and providing the digital switch array control signal 105 dependent on the delay of the signal 303, and the switch array 106 controlling power supply to the delay line 301 via the second common power supply node 302' dependent on the digital switch array control signal 105, may be regarded as a feedback loop or feedback control.

Illustratively, in the circuit arrangement 400 the level of the virtual lower supply voltage VSSvir at the second common power supply node 302' may be controlled by the switch array 106, and thus the signal propagation delay of the delay line 301 may be controlled.

The circuit 311 in the circuit arrangement 400 may reside in the same voltage domain as the delay line 301. That is, the circuit 311, or elements or structures of the circuit 311, may be fed with the same supply voltages as the delay line 301, i.e. with the upper supply voltage VDD via the first common power supply node 302 and the virtual lower supply voltage VSSvir via the second common power supply node 302', as shown in FIG. 4.

According to one aspect of this disclosure, the delay line 301 in the circuit arrangement 400 may have a structure that is similar or identical to at least one circuit structure of the circuit 311, for example a critical path or replica of a critical path of the circuit 311 (if present in the circuit 311), or an I/O path or replica of an I/O path of the circuit 311 (if present in the circuit 311), or a memory path or replica of a memory path of the circuit 311 (if present in the circuit 311), or others. Thus, the delay line 301's (nominal) signal propagation delay and/or the sensitivity of the delay line 301's signal propagation delay to process and environmental variations (PVT) may be similar or the same as for the corresponding circuit structure of the circuit 311. In other words, the delay line 301 may react in a similar or identical manner to PVT variations as the corresponding circuit structure of the circuit 311, and controlling the voltage level of the virtual lower supply voltage VSSvir by means of the feedback loop may have the same influence on the signal delay of the circuit 311's circuit structure as on the signal delay of the delay line 301.

In the circuit arrangement 400 shown in FIG. 4, the first power supply input 304d of the TDC 304 is coupled to the first common power supply node 302 and thus to the upper supply voltage VDD, and the second power supply input 304e of the TDC 304 is coupled to the second common power supply node 302' and thus to the virtual lower supply voltage VSSvir. Thus, the TDC 304 illustratively resides in the same voltage domain as the delay line 301 and the circuit 311, so that the switch array 106 may also control power supply to TDC 304 via the second common power supply node 302'. Alternatively, the second power supply input 304e of the TDC 304 may be coupled to the lower supply voltage VSS without the switch array 106 coupled in-between.

Figure 5:
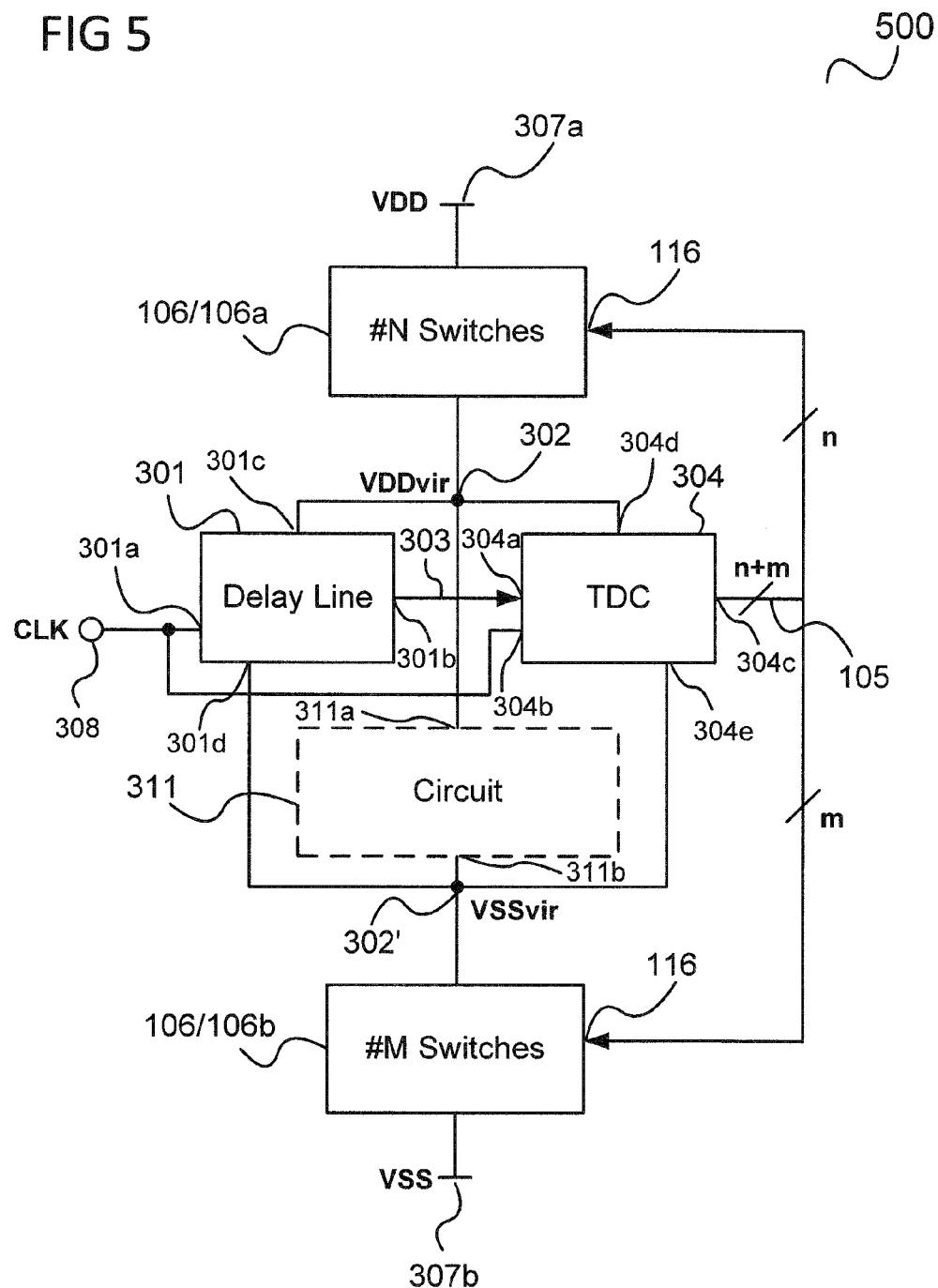
FIG. 5 shows a circuit arrangement according to another aspect of this disclosure.

FIG. 5 shows a circuit arrangement 500 according to another aspect of this disclosure.

The circuit arrangement 500 is to some degree similar to the circuit arrangements 300, 400 shown in FIGS. 3 and 4, and identical reference signs denote the same or similar elements as there and will not be described in detail again here. Reference is made to the description above.

The circuit arrangement 500 includes a switch array 106, which has a first part 106a including n switches coupled between the first common power supply node 302 and the first power supply 307a providing the upper supply voltage VDD, and a second part 106b including m switches coupled between the second common power supply node 302' and the second power supply 307b providing the lower supply voltage VSS. The first part 106a of the switch array 106 of the circuit arrangement 500 may be configured in the same or a similar manner as the switch array 106 of the circuit arrangement 300 shown in FIG. 3, and the second part 106b of the switch array 106 of the circuit arrangement 500 may be configured in the same or a similar manner as the switch array 106 of the circuit arrangement 400 shown in FIG. 4.

In the circuit arrangement 500, the time-to-digital converter (TDC) 304 is configured to provide a digital output word containing n+m bits (n being equal to or greater than one, and m being equal to or greater than one) as digital switch array control signal 105 to control the first and second parts 106a, 106b of the switch array 106. The number n may correspond to the number of switches of the first part 106a of the switch array 106 to be controlled by the digital switch array control signal 105, and the number m may correspond to the number of switches of the second part 106b of the switch array 106 to be controlled by the digital switch array control signal 105. Illustratively, n bits of the n+m bit digital output word 105 may serve to control n switches of the first part 106a of the switch array 106, and m bits of the n+m bit digital output word 105 may serve to control m switches of the second part 106b of the switch array 106, as shown in FIG. 5.

Illustratively, in the circuit arrangement 500 the level of the virtual upper supply voltage VDDvir at the first common power supply node 302 may be controlled by the first part 106a of the switch array 106 and the level of the virtual lower supply voltage VSSvir at the second common power supply node 302' may be controlled by the second part 106b of the switch array 106, and thus the signal propagation delay of the delay line 301 may be controlled, as described above.

Illustratively, the TDC 304 detecting the signal 303 provided by the delay line 301 and providing the digital switch array control signal 105 dependent on the delay of the signal 303, and the switch array 106 controlling power supply to the delay line 301 via the first and second common power supply node 302, 302' dependent on the digital switch array control signal 105, may be regarded as a feedback loop or feedback control.

The circuit 311 in the circuit arrangement 500 may reside in the same voltage domain as the delay line 301. That is, the circuit 311, or elements or structures of the circuit 311, may be fed with the same supply voltages as the delay line 301, i.e. with the virtual upper supply voltage VDDvir via the first common power supply node 302 and the virtual lower supply voltage VSSvir via the second common power supply node 302', as shown in FIG. 5.

In the circuit arrangement 500 as shown in FIG. 5, the first power supply input 304d of the TDC 304 is coupled to the virtual upper supply voltage VDDvir at the first common power supply node 302 and the second power supply input 304e of the TDC 304 is coupled to the virtual lower supply voltage VSSvir at the second common power supply node 302'. Thus, the TDC 304 illustratively resides in the same voltage domain as the delay line 301 and the circuit 311, so that the switch array 106 may also control power supply to the TDC 304 via the first common power supply node 302 and the second common power supply node 302'. Alternatively, the first power supply input 304d of the TDC 304 may be coupled to the upper supply voltage VDD and/or the second power supply input 304e of the TDC 304 may be coupled to the lower supply voltage VSS without the switch array 106 coupled in-between.

In the circuit arrangement 300 of FIG. 3, it was assumed that all switches of the switch array 106 are coupled between VDD and VDDvir. However, according to another aspect of this disclosure, it is also possible that one or more switches of the switch array 106 are coupled between VDDvir and VSS (see e.g. FIG. 11 and FIG. 18).

Similarly, in the circuit arrangement 400 of FIG. 4, it was assumed that all switches of the switch array 106 are coupled between VSSvir and VSS. However, according to another aspect of this disclosure, it is also possible that one or more switches of the switch array 106 are coupled between VDD and VSSvir (see e.g. FIG. 20).

Similarly, in the circuit arrangement 500 of FIG. 5, it was assumed that all switches of the first part 106a of the switch array 106 are coupled between VDD and VDDvir and all switches of the second part 106b of the switch array 106 are coupled between VSSvir and VSS. However, according to another aspect of this disclosure, it is also possible that one or more switches of the first part 106a of the switch array 106 are coupled between VDDvir and VSS, and/or that one or more switches of the second part 106b of the switch array 106 are coupled between VDD and VSSvir (see e.g. FIG. 20).

Figure 6:
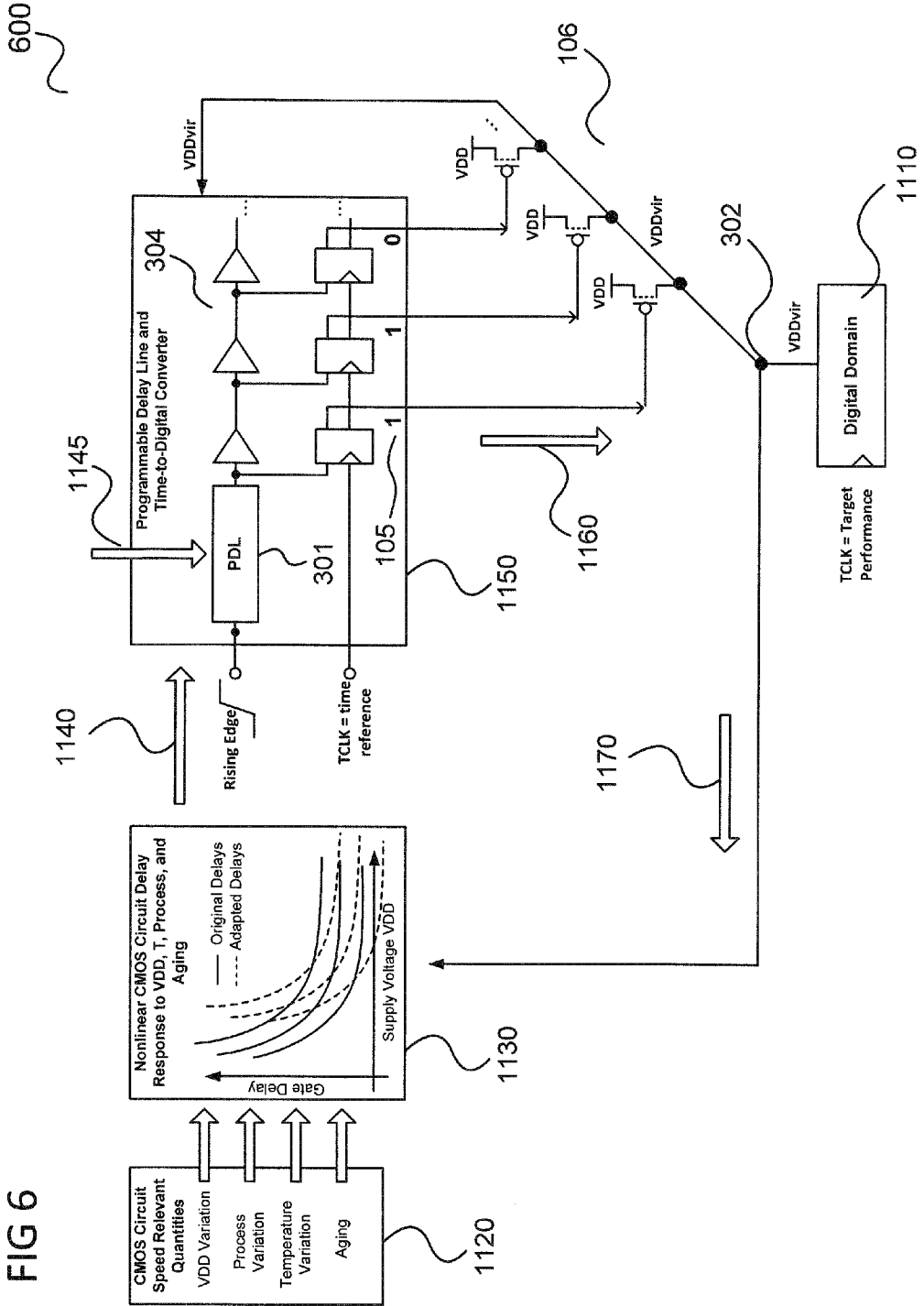
FIG. 6 shows a diagram illustrating a functional principle of circuit arrangements according to various aspects of this disclosure.

FIG. 6 shows a diagram 600 schematically illustrating a functional principle of various circuit arrangements described herein according to an aspect of this disclosure.

As shown in 1120, the speed of a CMOS circuit may be affected by one or more of the following effects: variation in the supply voltage VDD (the upper supply voltage VDD is shown as an example in FIG. 6, however variation in VSS may have a similar effect), process variation, temperature variation, circuit aging. In particular, the CMOS circuit delay may respond in a nonlinear manner to variations in one or more of the aforementioned quantities, for example to variations in the supply voltage VDD, as shown in 1130.

According to one aspect of this disclosure, the CMOS circuit sensitivity to one or more of the aforementioned quantities may be directly mapped to the time domain via a time-to-digital converter (TDC) 304, as indicated by arrow 1140. To this end, a delay line 301, e.g. a programmable delay line (PDL) as shown in FIG. 6, may be provided, and the delay of the PDL 301's output signal, which may be dependent on one or more of the aforementioned quantities, may be measured by the TDC 304 and converted into a digital output word 105 having a thermometer code (in the example, "110 . . . "), as shown in 1150. Setting or programming of the PDL 301 (indicated by arrow 1145) may, for example, allow for adaptation to specific core speed requirements and/or for calibration.

As indicated by arrow 1160, the TDC outputs may be directly mapped to inputs of a distributed switch array 106 including a plurality of (e.g. FET) switches coupled between a common power supply node 302 and a plurality of supply voltages VDD. Three switches and corresponding three supply voltages VDD are shown as an example, however the number of switches and supply voltages may be different from three; in general, the number of switches and supply voltages may be equal to or greater than one. The thermometer code of the TDC 304's digital output word 105 may contain all timing information, including variation effects on very short (e.g. nanosecond) time scale.

By means of the switch array 106 (illustratively, by controlling the number of open and closed switches), the voltage level VDDvir at the common power supply node 302 may be modified. Illustratively, the voltage VDDvir at the common power supply node 302 may represent a virtual or effective upper supply voltage used to power one or more circuits in a digital domain 1110 (e.g. a core domain), and also the PDL 301 and the TDC 304, as shown.

Thus, a fast feedback loop for conversion of time delay information to voltage modification may be directly implemented via the switching array 106 (coded in the number of open switches), as indicated by arrow 1170.

Illustratively, as shown in FIG. 6, a feedback solution may be provided that may allow for fast adaptation of a supply voltage according to a pre-defined performance/speed target. Since measurement is based on delays, a mapping of single operating conditions such as supply voltage VDD, temperature T, circuit aging, etc., to circuit performance may not be needed anymore. Hence lookup-tables may not be needed anymore, too.

It should be noted that, although adaptation of an upper supply voltage is shown in FIG. 6 as an example, it also possible to adapt a lower supply voltage (see e.g. FIG. 4), or both an upper supply voltage and a lower supply voltage (see e.g. FIG. 5), by means of a similar feedback solution as described.

Figure 7A:
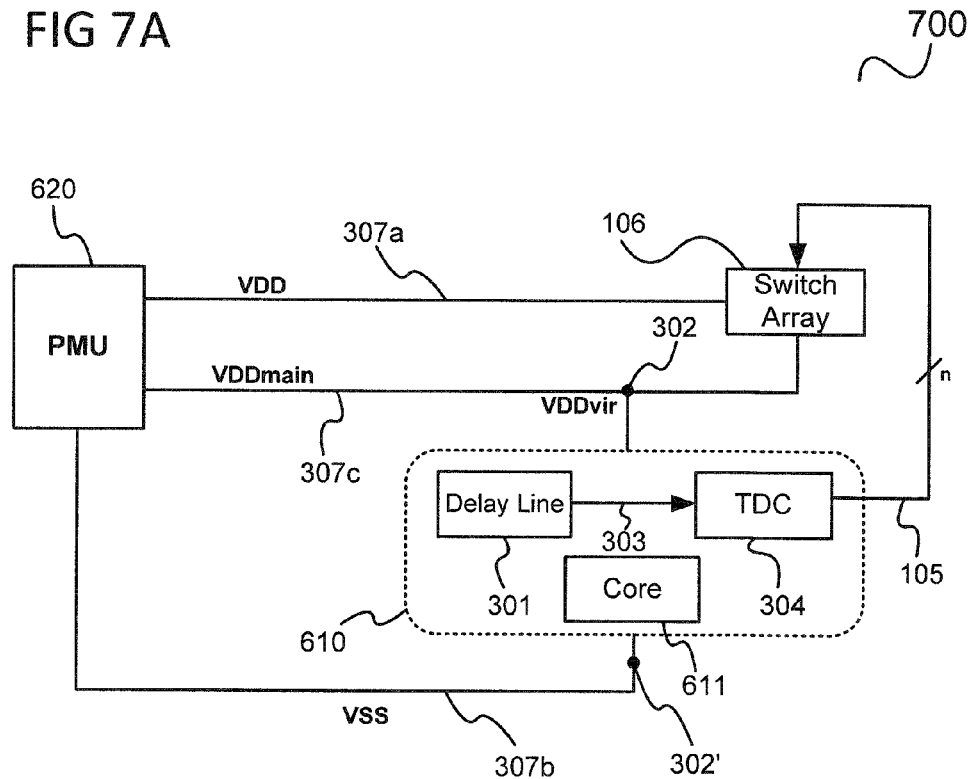
FIG. 7A shows a circuit arrangement according to another aspect of this disclosure.

FIG. 7A shows a circuit arrangement 700 according to another aspect of this disclosure.

The circuit arrangement 700 includes a delay line 301, a time-to-digital converter (TDC) 304, and a core circuit 611 to be operated at constant performance. The delay line 301, the TDC 304 and the core circuit 611 all reside in the same voltage domain 610 (herein also referred to as core voltage domain) defined by a virtual upper supply voltage VDDvir at a first common power supply node 302 and a lower supply voltage VSS at a second common power supply node 302'. In other words, the delay line 301, the TDC 304 and the core circuit 611 are all fed with the same supply voltages, i.e. VDDvir via the first common power supply node 302 and VSS via the second common power supply node 302' in the example shown in FIG. 7A.

The delay line 301 may be configured according to one or more aspects described herein, e.g. in a similar manner as the delay line 301 of one or more circuit arrangements described above, and may provide a signal 303, wherein a delay of the signal 303 is dependent on power supply via the first common power supply node 302.

The TDC 304 may be configured according to one or more aspects described herein, e.g. in a similar manner as the TDC 304 of one or more circuit arrangements described above, and may detect the signal 303 provided by the delay line 301 and provide a digital switch array control signal 105 (n bit digital output word) dependent on the delay of the signal 303.

The circuit arrangement 700 further includes a power management unit (PMU) 620 that provides a first power supply 307a, e.g. a first upper supply voltage VDD as shown, a second power supply 307b, e.g. a lower supply voltage VSS as shown, and a third power supply 307c (herein also referred to as third power supply source), e.g. a second upper supply voltage "VDDmain" as shown.

As shown, the third power supply 307c of the PMU 620 is coupled to the first common power supply node 302 and provides the second upper supply voltage "VDDmain" to the first common power supply node 302.

Furthermore, the second power supply 307b of the PMU 620 is coupled to the second common power supply node 302' and provides the lower supply voltage VSS to the second common power supply node 302'.

The circuit arrangement 700 further includes a switch array 106 that is coupled between the first common power supply node 302 and the first power supply 307a. In other words, the first power supply 307a of the PMU 620 is coupled to the switch array 106 and provides the first upper supply voltage VDD to the switch array 106.

The switch array 106 may be configured according to one or more aspects described herein, e.g. in a similar manner as the switch array 106 of one or more circuit arrangements described above, and may be configured to control the power supply to elements residing in the core voltage domain 610 (e.g. the delay line 301, the TDC 304 and the core circuit 611) via the first common power supply node 302. To this end, the switch array 106 may include n switches coupled in parallel between the first common power supply node 302 and the first power supply 307a (e.g. first upper supply voltage VDD in the example shown), and controlled by the digital switch array control signal (n bit digital output word) 105.

Figure 7B:
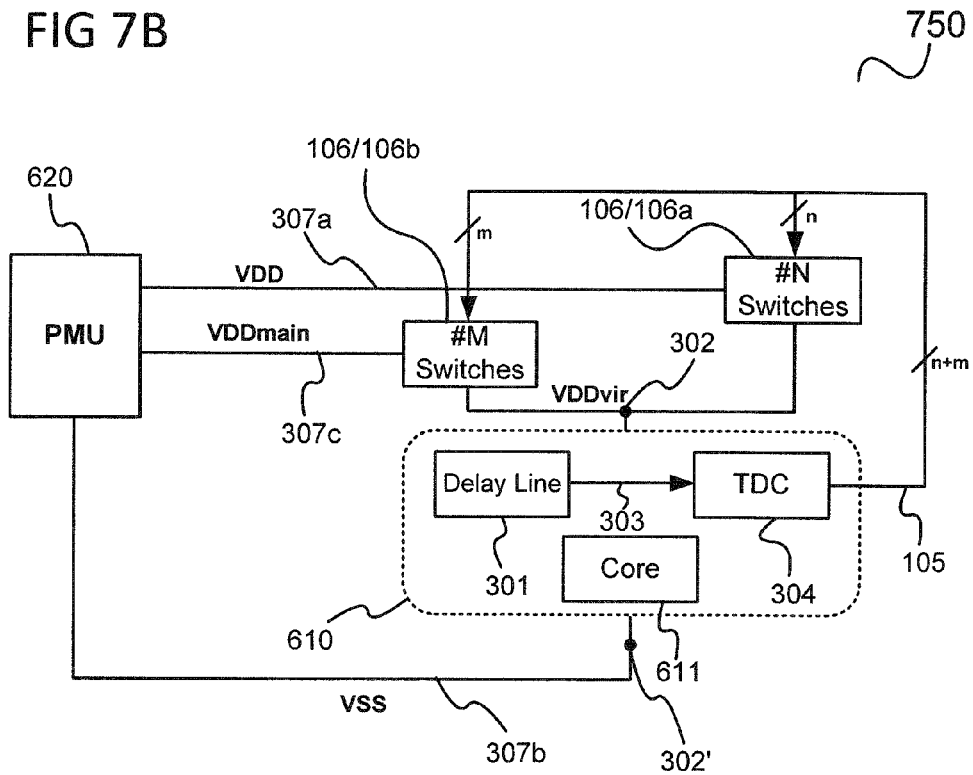
FIG. 7B shows a circuit arrangement according to another aspect of this disclosure.

FIG. 7B shows a circuit arrangement 750 according to another aspect of this disclosure.

The circuit arrangement 750 is to some degree similar to the circuit arrangement 700 shown in FIG. 7A, and identical reference signs denote the same or similar elements as there and will not be described in detail again here. Reference is made to the description above.

The circuit arrangement 750 differs from the circuit arrangement 700 in that the circuit arrangement 750 includes a switch array 106, wherein a first part 106a of the switch array 106 is coupled between the first common power supply node 302 and the first power supply 307a (e.g. first upper supply voltage VDD in the example shown), and a second part 106b of the switch array 106 is coupled between the first common power supply node 302 and the third power supply 307c (e.g. second upper supply voltage VDDmain in the example shown), and that the TDC 304 is configured to provide an n+m bit digital output word as digital switch array control signal 105 to control the first and second parts 106a, 106b of the switch array 106.

The first part 106a of the switch array 106 may be configured in a similar manner as the switch array 106 of the circuit arrangement 700 of FIG. 7A and may be configured to control the power supply to elements residing in the core voltage domain 610 via the first common power supply node 302. To this end, the first part 106a of the switch array 106 may include n switches coupled in parallel between the first common power supply node 302 and the first power supply 307a (e.g. first upper supply voltage VDD in the example shown), and controlled by n bits of the digital switch array control signal (n+m bit digital output word) 105, as shown.

The second part 106b of the switch array 106 may be configured in a similar manner as the first part 106a of the switch array 106, and may be configured to control the power supply to elements residing in the core voltage domain 610 via the first common power supply node 302. To this end, the second part of the 106b of the switch array 106 may include m switches coupled in parallel between the first common power supply node 302 and the third power supply 307c (e.g.

second upper supply voltage VDDmain in the example shown), and controlled by m bits of the digital switch array control signal (n+m bit digital output word) 105, as shown.

In the circuit arrangements 700 and 750, the third power supply 307c (i.e. second upper supply voltage VDDmain) may serve as a main power supply and the first power supply 307a (e.g. first upper supply voltage VDD) may serve as an additional power supply for the elements residing in the core voltage domain 610 (e.g. the delay line 301, the TDC 304 and the core circuit 611). Illustratively, the circuit arrangements 700 and 750 show examples for circuit arrangemens where the main current for the core voltage domain 610 may be drawn from the third power supply 307c (main power supply), while additional current may be drawn from the first power supply 307a (additional power supply) if needed, for example in an "emergency case", e.g. if there is a significant drop in the level of the virtual upper supply voltage VDDvir at the first common power supply node 302. The first upper supply voltage VDD may, for example, be higher than the second upper supply voltage VDDmain.

Figure 8:
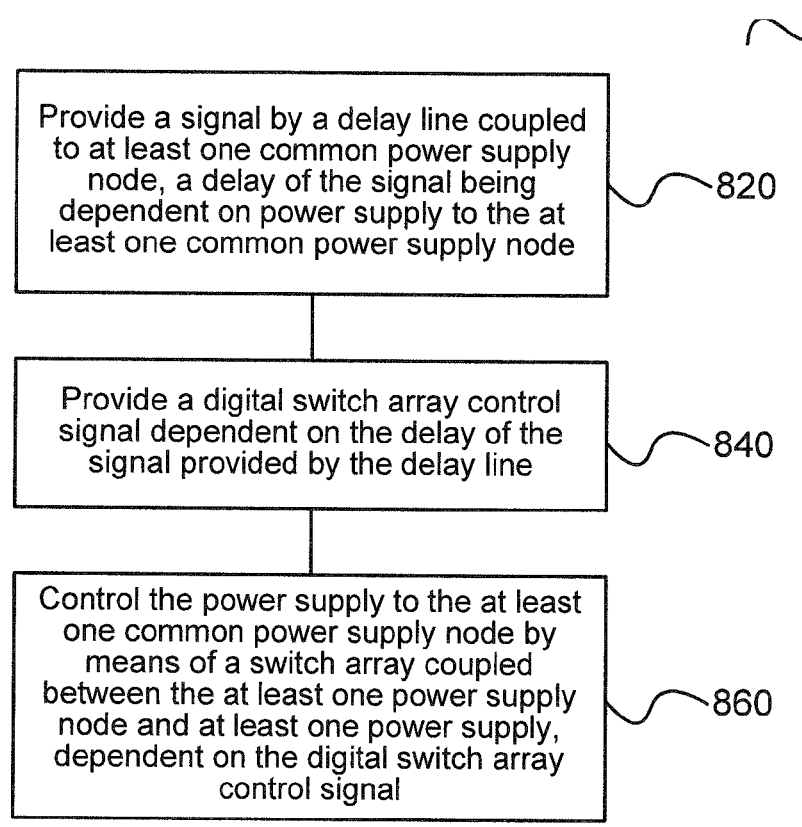
FIG. 8 shows a method for operating a circuit arrangement according to another aspect of this disclosure.

FIG. 8 shows a method 800 for operating a circuit arrangement (such as, for example, one or more of the circuit arrangements described herein) according to another aspect of this disclosure.

In 820, a delay line coupled to at least one common power supply node provides a signal, wherein a delay of the signal is dependent on power supply via the least one common power supply node. The delay line and/or the signal may, for example, be configured according to one or more aspects of this disclosure.

In 840, a detecting circuit coupled to the delay line, for example, provides a digital switch array control signal dependent on the delay of the signal provided by the delay line. The digital switch array control signal and/or the detecting circuit may, for example, be configured according to one or more aspects of this disclosure.

In 860, a switch array coupled between the at least one common power supply node and at least one power supply (or power supply source), for example, controls the power supply via the at least one common power supply node dependent on the digital switch array control signal. The switch array may, for example, be configured according to one or more aspects of this disclosure.

In the following, various aspects of this disclosure are described with reference to the circuit arrangement 300 shown in FIG. 3 as an example (similar considerations may hold true for other circuit arrangements described herein).

According to one aspect of this disclosure, a delay of a signal 303 may be measured and translated into a digital output word 105. The digital output word may be used as input word of a switch array 106 containing n switches (n≥1), which may be opened and closed according to the input word, i.e. according to the measured delay. Thus, time information may be translated into a voltage, e.g. the supply voltage of a monitored circuit 311 (for example, a circuit that shall be operated at constant performance, e.g. a core circuit).

Due to the increase of delay sensitivity to process and environmental (PVT) variations with further technology shrink, a delay-based measurement may be very attractive for sensing PVT.

According to another aspect of this disclosure, delay measurement and power supply control may be implemented using a delay line 301, a time-to-digital converter (TDC) 304 and an array 106 of n switches (switch array).

The delay line 301, the TDC 304 and the circuit 311 to be operated at constant performance (e.g. core circuit) may be located in the same voltage domain (core voltage domain). A power supply 307a (e.g. VDD), provided for example by a power management unit (PMU), is connected to the switch array 106. The number of opened and closed switches, which connect the power supply 307a (e.g. VDD) to the core voltage domain depends on the output of the TDC 304 and determines the effective supply voltage (VDDvir) for the core voltage domain. Hence a feedback loop may be implemented from the TDC 304's output to the TDC 304's power supply.

Every clock cycle the delay of the delay line 301 may be measured and may be represented by a digital thermometer code at a signal output 304c of the TDC 304. The output word 105 of the TDC 304 acts as input word for the switch array 106. If the propagation delay of the delay line 301 increases for example, e.g. due to a voltage drop event, the thermometer code of the TDC 304 will change. In this case the control of the switch array 106 may be implemented in a way that the number of switches which connect VDD and VDDvir is increased resulting in an increased charge injection and hence accelerating the signal propagation along the delay line 301.

If the propagation delay decreases, the number of switches which connect VDD to VDDvir is decreased resulting in a limitation of the injected charge. Hence delay increases again.

Thus performance changes due to PVT variations may be suppressed by regulation of charge injection and hence the circuit's effective supply voltage VDDvir.

Aspects of the new regulation concept include, for example:

a. The regulator input according to the new concept is based on a delay measurement.

b. The new concept is fully digital. Hence the circuit may be implemented in a very small footprint and may easily be scaled to future technology nodes. The circuit may be easily embedded in all heterogenous and homogenous digital SoC (System-on-Chip) products.

c. Due to the capability of a fully digital implementation, a fully digital test concept, e.g. BIST (Built-in Self Test), may be easily realized.

d. The total feedback-loop may be implemented in hardware. Therefore the use of a controller and/or additional effort for software development may be avoided. The only input given to the circuit may be the setting of a programmable delay line (PDL).

In the following, various aspects of the delay line (DL), the time-to-digital converter (TDC) and the switch array (SA) used in circuit arrangements according to various aspects of this disclosure are described.

Delay Line (DL):

The delay line may act as part of a delay sensor. Its delay sensitivity may match the core's sensitivity to ensure the core's operation at constant performance in the case of dynamic variations. To this end, the delay line may include different circuit structures such as one or more critical paths, replicas of critical paths, memory paths, replicas of memory paths, I/O paths, replicas of I/O paths, etc.

The delay line may, for example, be implemented as a programmable delay line (PDL). In this case, the target performance for the core may be adapted by changing the propagation delay of the PDL. For example, for systems working with dynamic voltage and frequency scaling (DVFS) the delay line may be implemented as a PDL to ensure a correct performance regulation for any use case.

Figure 9A:
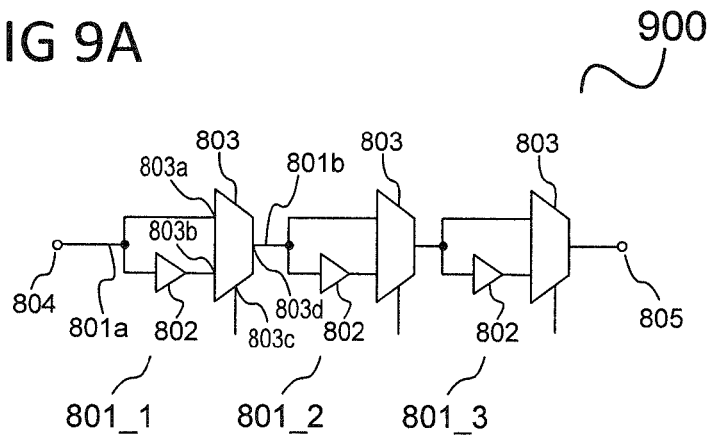
FIGS. 9A to 9C show exemplary implementations of a programmable delay line for use in circuit arrangements according to various aspects of this disclosure.
Figure 9B:
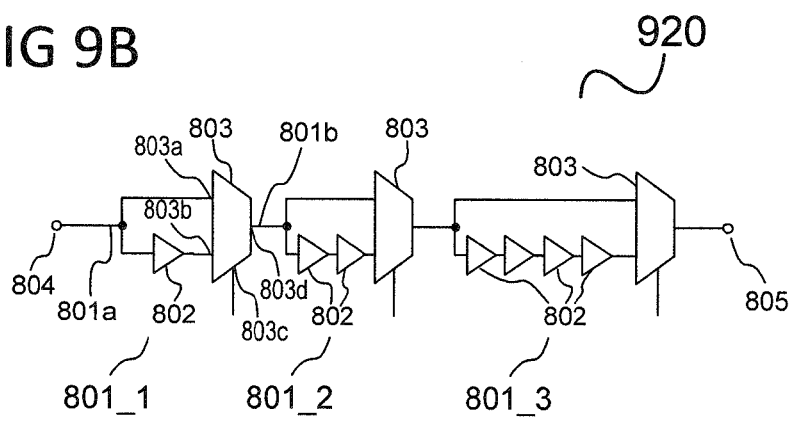
Figure 9C:
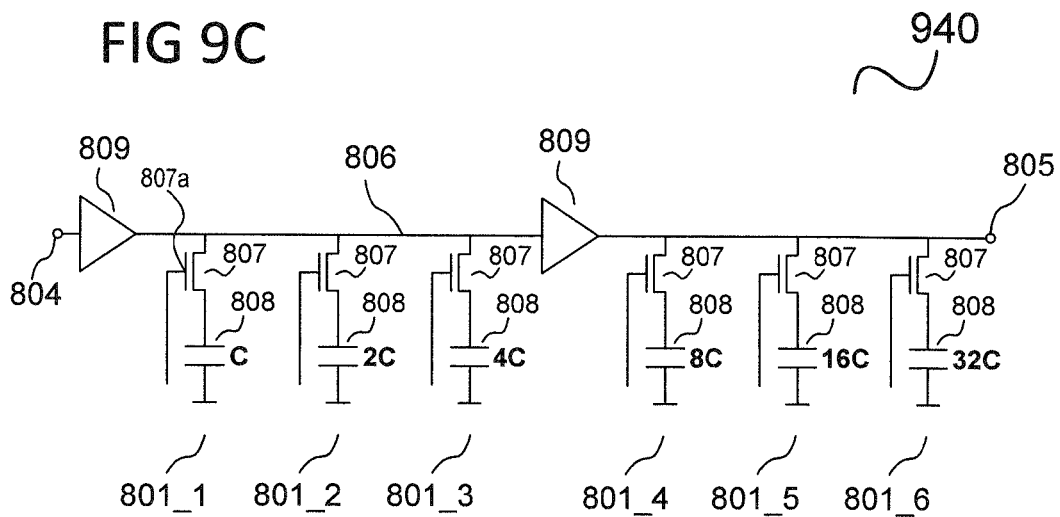

FIGS. 9A to 9C show exemplary implementations of a programmable delay line for use in circuit arrangements according to various aspects of this disclosure.

A programmable delay line (PDL) 900 according to a first example shown in FIG. 9A includes first to n-th programmable delay elements $801\_1, 801\_2, \ldots, 801\_n$ (three delay elements 801_1, 801_2, 801_3 are shown as an example (i.e. n=3), however the number n may be different from three; in general, n may be equal to or greater than one, i.e n≥1) coupled in series between a signal input 804 and a signal output 805 of the delay line 900.

Each delay element 801_*i* (i=1, 2, ..., n) includes a buffer gate 802 coupled to a signal input 801*a* of the delay element 801_*i*, and a programmable multiplexer 803 having a first signal input 803*a* coupled to the signal input 801*a* of the delay element 801_*i*, a second signal input 803*b* coupled to the buffer gate 802, a programming input 803*c*, and a signal output 803*d* coupled to a signal output 801*b* of the delay element 801_*i*. Depending on a programmed state of the multiplexer 803 of the delay element 801_*i*, a signal entering the delay element 801_*i* at the signal input 801*a* of the delay element 801_*i* will exit the delay element 801_*i* at the signal output 801*b* of the delay element 801_*i* with or without a predetermined unit time delay.

The state of the multiplexer 803 of each delay element 801_*i* (i=1, 2, ..., n), and thus the state of the delay element 801_*i*, may be programmed by providing a delay control word to the programming inputs 803*c* of the multiplexers 803. By programming the state of the individual delay elements 801_1, 801_2, ..., 801_*n* of the PDL 900, the overall time delay of the PDL 900 may be set. The overall time delay may correspond to the sum of the unit time delays induced by the individual delay elements 801_1, 801_2, ..., 801_*n*.

A programmable delay line 920 according to a second example shown in FIG. 9B includes first to n-th programmable delay elements 801_1, 801_2, ..., 801_*n* (three delay elements 801_1, 801_2, 801_3 are shown as an example (i.e. n=3); however the number n of delay elements may be different from three; in general, n may be equal to or greater than one, i.e. n≥1) coupled in series between a signal input 804 and a signal output 805 of the delay line 920.

The delay line 920 differs from the delay line 900 in that the i-th delay element 801_*i* (i=1, 2, ..., n) of the delay line 920 includes $2^{i-1}$ buffer gates 802 coupled in series between the signal input 801*a* of the delay element 801_*i* and the second signal input 803*b* of the multiplexer 803 of the delay element 801_*i*. That is, the first delay element 801_1 includes $2^0=1$ buffer gate 802, the second delay element 801_2 includes $2^1=2$ buffer gates 802, and the third delay element 801_3 includes $2^2=4$ buffer gates 802 in the example shown.

As in the delay line 900, the state of the multiplexer 803 of each delay element 801_*i* (i=1, 2, ..., n) of the delay line 920, and thus the state of the delay element 801_*i*, may be programmed by providing a delay control word to the programming inputs 803*c* of the multiplexers 803. By programming the state of the individual delay elements 801_1, 801_2, ..., 801_*n* of the PDL 920, the overall time delay of the PDL 920 may be set. Illustratively, the PDL 920 allows for a binary coding of the overall time delay.

A programmable delay line 940 according to a third example shown in FIG. 9C includes first to n-th programmable delay elements 801_1, 801_2, ..., 801_*n* (six delay elements 801_1, 801_2, 801_3, 801_4, 801_5, 801_6 are shown as an example (i.e. n=6); however the number n of delay elements may be different from six; in general, n may be greater than or equal to one, i.e. n≥1) coupled to a signal propagation path 806 between a signal input 804 and a signal output 805 of the delay line 940.

Each delay element 801_*i* (i=1, 2, ..., n) includes a switch 807 (e.g. a transistor as shown) and a capacitive element 808 (e.g. a capacitor) coupled in series between the signal propagation path 806 and a power supply (e.g. lower supply voltage VSS), wherein the capacitive element 808 of the i-th delay element 801_*i* has a capacitance $2^{i-1}*C$ (with C being a constant). That is, the capacitive element 808 of the first delay element 801_1 has a capacitance $2^0*C=C$, the capacitive element 808 of the second delay element 801_2 has a capacitance $2^1*C=2C$, the capacitive element 808 of the third delay element 801_3 has a capacitance $2^2*C=4C$, the capacitive element 808 of the fourth delay element 801_4 has a capacitance $2^3*C=8C$, the capacitive element 808 of the fifth delay element 801_5 has a capacitance $2^4*C=16C$, the capacitive element 808 of the sixth delay element 801_6 has a capacitance $2^5*C=32C$ in the example shown.

One or more buffer gates 809 may optionally be arranged in the signal propagation path 806, for example at regular intervals, as shown.

The state of the switch 807 of each delay element 801_*i* (i=1, 2, ..., n) of the delay line 940, and thus the state of the delay element 801_*i*, may be programmed by providing a delay control word to programming inputs 807*a* of the switches 807 (e.g. gate terminals of transistor switches, as shown). By programming the switch state (i.e. open or closed) of the switches 807 of the individual delay elements 801_1, 801_2, ..., 801_*n* of the PDL 940, the overall time delay of the PDL 940 may be set. Illustratively, the PDL 940 allows for a binary coding of the overall time delay.

As will be readily understood by a person of ordinary skill in the art, the PDL implementations shown in FIGS. 9A to 9C serve only as examples and many other implementations of a programmable delay line may be used in the circuit arrangements described herein. Furthermore, it is to be understood that a PDL does not need to consist entirely of programmable delay elements, but may also include a portion providing a fixed delay. In other words, the overall time delay of a PDL may be composed of a fixed-delay portion and a programmable-delay portion. For example, a PDL may be configured such that about 80% of the overall time delay of the PDL are induced by a fixed-delay portion while only about 20% of the overall time delay of the PDL are caused by a programmable-delay portion, the aforementioned percentages of course being only exemplary values and other ratios between fixed and programmable delay being possible as well.

The fixed-delay portion of a PDL may, for example, include or consist of one or more generic path structures such as, for example, one or more inverter chains, buffer chains, NAND/NOR chains, etc., configurable so-called canary circuits (replica of critical paths), or critical paths or parts of critical paths.

Figure 10:
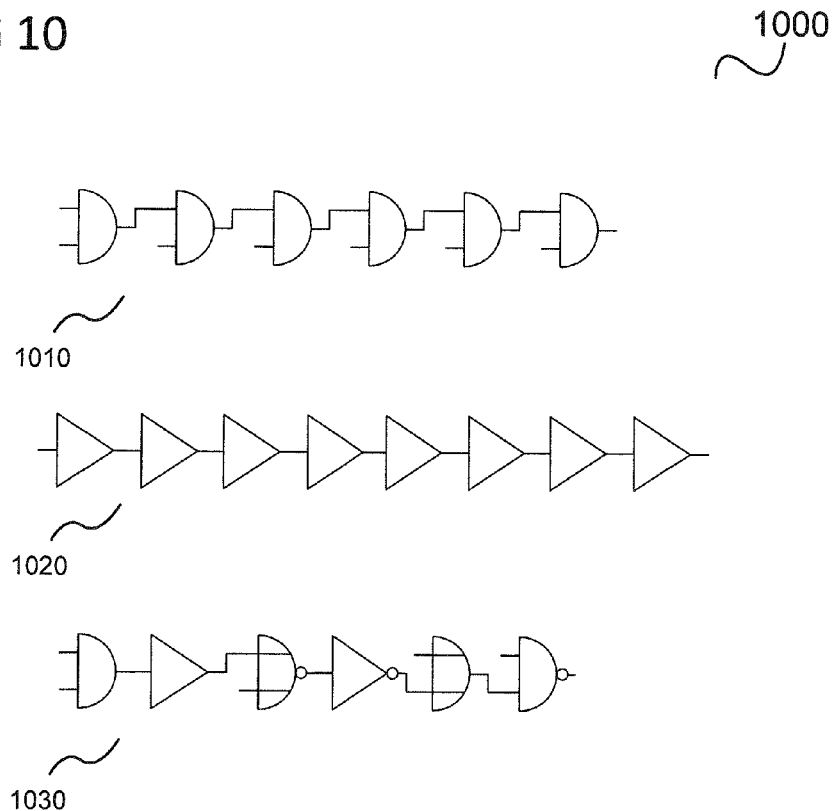
FIG. 10 shows exemplary implementations of fixed-delay portions for use in a delay line.

FIG. 10 is a diagram 1000 illustrating exemplary implementations of such fixed-delay portions, wherein 1010 shows an example of a generic path implemented by a plurality of AND logic gates coupled in series, 1020 shows another example of a generic path implemented by a plurality of buffer gates coupled in series, and 1030 shows an example of a critical path or replica of a critical path implemented by a plurality of different logic gates coupled in series (i.e. AND, buffer, NOR, NOT, OR, and NAND gate according to the example shown). Again, as will be readily understood by a person of ordinary skill in the art, the implementations shown in FIG. 10 serve only as examples and many other implementations of a fixed-delay portion may be used in a PDL.

Time-to-Digital Converter (TDC):

The accuracy of performance regulation may be directly proportional to the resolution of the TDC. The higher the resolution of the TDC, the more accurate the performance regulation may be.

The delay between two delay measurements may be in the same time scale as the clock cycle time so that fast cycle-to-cycle delay variations may be compensated.

Figure 11:
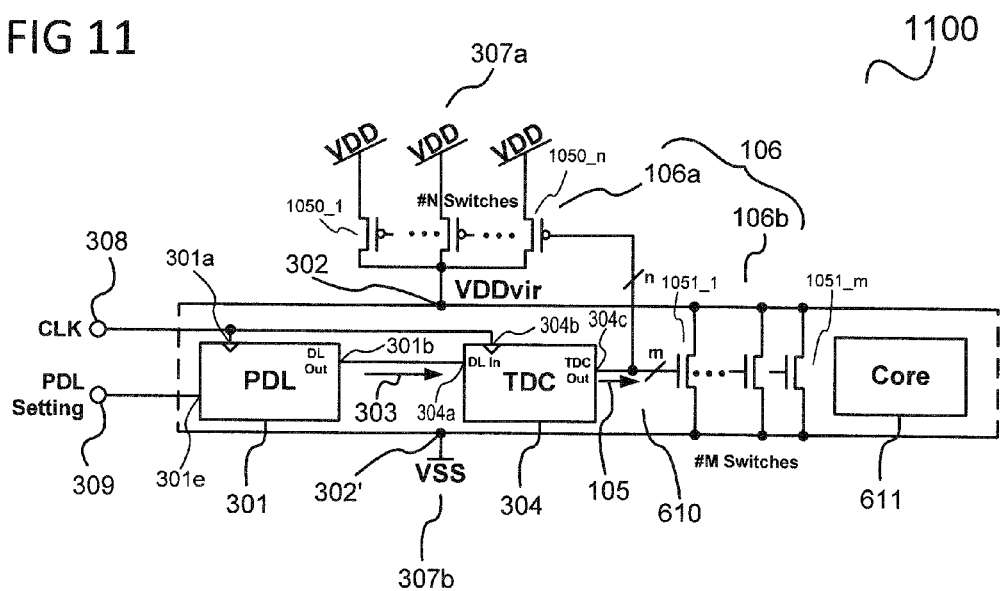
FIG. 11 shows a circuit arrangement according to another aspect of this disclosure.

Switch Array (SA):

The switch array may include one or more switches which may be connected in various ways, e.g. switches connecting VDD and VDDvir, and/or switches connecting VSS and VSSvir, and/or switches forming a switched shortcut between VDD and VSSvir, and/or switches forming a switched shortcut between VDDvir and VSS, an example with switches between VDD and VDDvir and switches between VDDvir and VSS being shown in FIG. 11.

FIG. 11 shows a circuit arrangement 1100 according to another aspect of this disclosure.

The circuit arrangement 1100 includes a programmable delay line (PDL) 301, a time-to-digital converter (TDC) 304, and a core circuit (core) 611 to be kept at constant performance, the PDL 301, TDC 304 and the core circuit 611 all residing in the same voltage domain 610 (core voltage domain) determined by the virtual upper supply voltage VDDvir at the first common power supply node 302 and the lower supply voltage VSS at the second common power supply node 302'. In other words, all circuits within the voltage domain 610 may be connected to the same supply voltages, i.e. VDDvir and VSS in the example shown.

A clock signal CLK may be supplied to a clock signal input 308 of the circuit arrangement 1100. The clock signal input 308 may be coupled to a clock signal input 301a of the PDL 301 and to a clock signal input 304b of the TDC 304, as shown. According to another aspect of the disclosure, a register may be coupled between the clock signal input 308 of the circuit arrangement 1100 and the clock signal input 301a of the PDL 301. In this case, the clock signal CLK may be coupled to a first signal input of the register, a data signal may be coupled to a second signal input of the register, and a signal output of the register may be coupled to the clock signal input 301a of the PDL 301 (not shown, see e.g. FIG. 13).

The clock signal CLK (or an output signal supplied by the register coupled between the clock signal input 308 of the circuit arrangement 1100 and the clock signal input 301a of the PDL 301) may propagate through the PDL 301 and may exit the PDL 301 at the signal output 301b ("DL out") with a certain time delay as the signal 303 shown in FIG. 11.

A nominal signal propagation delay of the PDL 301 may be set via a signal "PDL setting" provided at a signal input 309 (herein also referred to as PDL setting input) of the circuit arrangement 1100. A signal input 301e of the PDL 301 may be coupled to the PDL setting input 309 of the circuit arrangement 1100 to receive the signal "PDL setting", as shown. The nominal signal propagation delay set by the signal "PDL setting" may, for example, correspond to a signal delay in some signal propagation path of the core circuit 611. In other words, the PDL 301 may be programmed or set to resemble a signal propagation path in the core circuit 611, such that the signal delay behavior of the PDL 301 resembles the signal delay behavior of the signal propagation path of the core circuit 611. In particular, PVT variations such as e.g. temperature variations or variations in the supply voltage for the core voltage domain 610 may have the same or approximately the same influence on the signal delay of the PDL 301 as on the signal delay of the signal propagation path of the core circuit 611.

The circuit arrangement 1100 further includes a switch array 106. A first part 106a of the switch array 106 includes n switches 1050_1, 1050_2, . . . , 1050_n (n being an integer equal to or greater than one, i.e. n≥1) coupled between the first common power supply node 302 and a first power supply 307a providing n upper supply voltages VDD, wherein each of the switches 1050_1, 1050_2, . . . , 1050_n is coupled between the first common power supply node 302 and a respective one of the n upper supply voltages VDD. The upper supply voltages VDD may all have the same value or be the same voltage (as shown), or they may be different. The n switches 1050_1, 1050_2, . . . , 1050_n of the first part 106a of the switch array 106 are configured as PMOS transistors, as shown. However, alternatively one or more of the switches 1050_1, 1050_2, . . . , 1050_n may be configured differently, for example as NMOS transistor, switched current source, or switched current mirror, alternatively using another suitable implementation for a switch.

A second part 106b of the switch array 106 includes m switches 1051_1, 1051_2, . . . , 1051_m (m being an integer equal to or greater than one, i.e. m≥1) coupled between the first common power supply node 302 and the second common power supply node 302'. Illustratively, the m switches 1051_1, 1051_2, . . . , 1051_m of the second part 106b of the switch array 106 are coupled between the virtual upper supply voltage VDDvir at the first common power supply node 302 and the lower supply voltage VSS at the second common power supply node 302'. The m switches 1051_1, 1051_2, . . . , 1051_m of the second part 106b of the switch array 106 are configured as NMOS transistors, as shown. However, alternatively one or more of the switches 1051_1, 1051_2, . . . , 1051_m may be configured differently, for example as PMOS transistor, switched current source, or switched current mirror, alternatively using another suitable implementation for a switch.

The TDC 304 provides a digital switch array control signal 105 (i.e. an n+m bit digital ouput word in this example), wherein n bits of the digital switch array control signal 105 are used to control the n switches 1050_1, 1050_2, . . . , 1050_n of the first part 106a of the switch array 106 and m bits of the digital switch array control signal 105 are used to control the m switches 1051_1, 1051_2, . . . , 1050_m of the second part 106b of the switch array 106. The digital switch array control signal (n+m bit digital output word) 105 depends on the measured time delay of the signal 303 provided at the signal output 301b ("DL out") of the PDL 301 and detected by the TDC 304 via the signal input 304a ("DL in") of the TDC 304.

Figure 12:
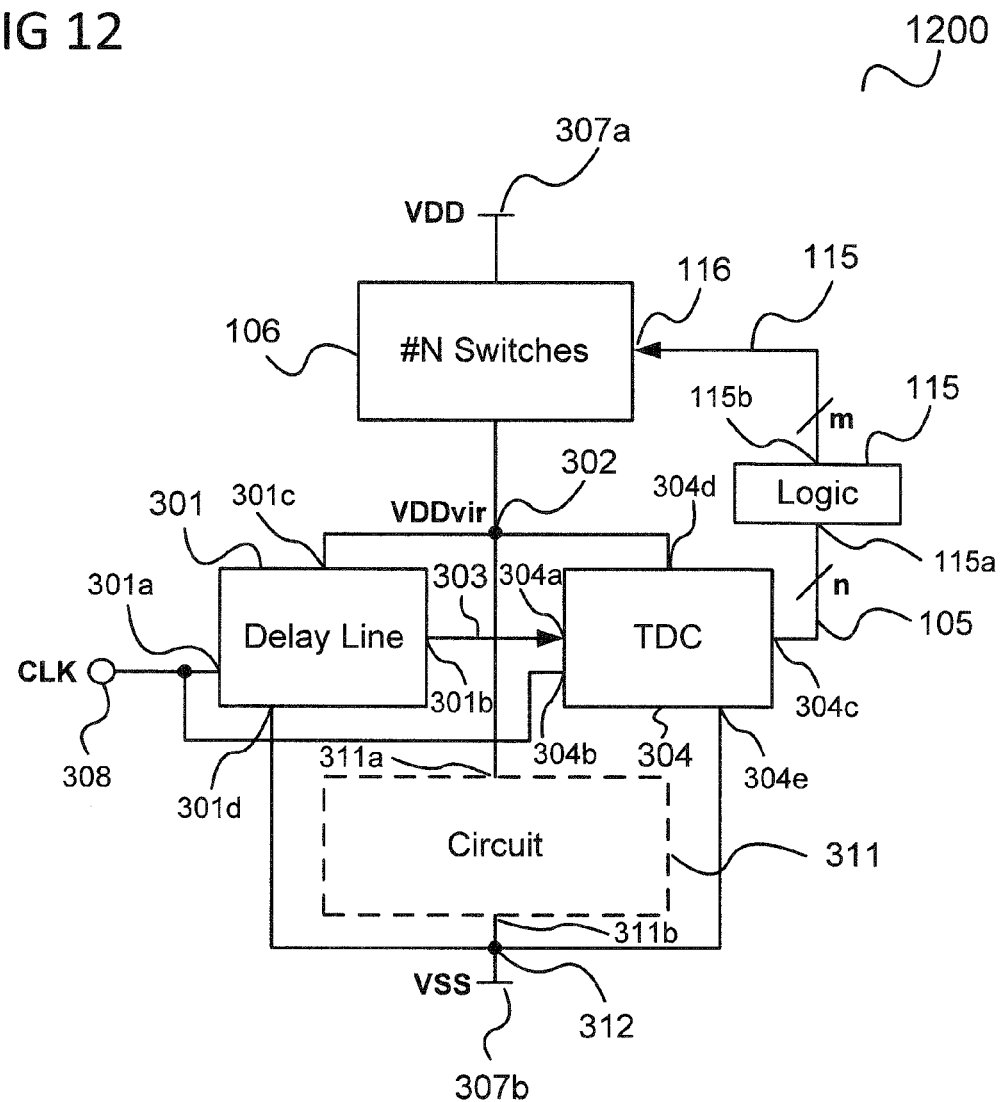
FIG. 12 shows a circuit arrangement according to another aspect of this disclosure.

FIG. 12 shows a circuit arrangement 1200 according to another aspect of this disclosure.

The circuit arrangement 1200 is to some degree similar to the circuit arrangement 300 shown in FIG. 3, and identical reference signs denote the same or similar elements as there and will not be described in detail again here. Reference is made to the description above.

The circuit arrangement 1200 differs from the circuit arrangement 300 in that a logic circuit 115 (herein also referred to as logic block or, short, logic) is coupled between the signal output 304c of the TDC 304 and the switch array 106. For example, the logic circuit 115 may include a signal input 115a coupled to the signal output 304c of the TDC, and a signal output 115b coupled to the at least one control signal input 116 of the switch array 106, as shown. The logic circuit 115 may receive the digital switch array control signal 105 (i.e. n bit digital output word according to the example shown) from the TDC 304 and may be configured to apply some operation onto the digital switch array control signal 105 and provide a control signal 1205 to the switch array 106 based on that operation. The control signal 1205 may be a digital output word containing m bits, as shown. The number m of bits of the control signal 1205 may be the same as the number n of bits of the digital switch array control signal 105 provided by the TDC 304. Alternatively, m be different from n, e.g. less than n or greater than n.

The logic circuit 115 may, for example, implement at least one of the following functionalities: a buffer functionality, a hysteresis functionality, a filter functionality, an enable-disable functionality, a bitwise re-mapping functionality, an encoding functionality, a decoding functionality, a compression functionality, a decompression functionality. Alternatively or in addition, the logic circuit 115 may implement other functionalities.

For example, the logic circuit 115 may be configured to achieve a linear mapping, e.g. mapping n bits of the digital switch array control signal 105 to m bits of the control signal 1205.

As another example, the logic circuit 115 may be configured as a digital filter (for example, but not necessarily, coupled to the clock signal CLK). The filter may, for example, be tuned to obtain an improved stability of the feedback control. For example, the filter may be configured to filter high frequency parts of the digital switch array control signal 105.

According to one aspect of this disclosure, a fully digital feedback loop of a circuit arrangement may include a delay line (e.g. a PDL), a time-to-digital converter (TDC) and an array of one or more switches (switch array). The feedback may be implemented by adapting a virtual supply voltage (e.g. virtual upper supply voltage VDDvir) by changing the number of switches connecting the virtual supply voltage (e.g. VDDvir) and at least one supply voltage (e.g. upper supply voltage VDD) provided e.g. by the system PMU, according to the time-to-digital based measurement of a supply voltage dependent propagation delay of the delay line. Thus, a pure digital circuit may be implemented, which may translate a delay variation to voltage within a very short (e.g. nanosecond) time scale. Thus, a circuit operation at constant performance may be achieved.

FIG. 13 shows a circuit arrangement 1300 according to another aspect of this disclosure.

The circuit arrangement 1300 includes a programmable delay line (PDL) 301, a time-to-digital converter (TDC) 304 coupled to the PDL 301, and a core circuit (core) 611 to be kept at constant performance. The PDL 301, TDC 304 and core circuit 611 (and possibly other elements, circuits or circuit structures not shown in FIG. 13) reside in a common voltage domain 610 defined by a virtual upper supply voltage VDDvir at a common power supply node 302 and a lower supply voltage VSS. Illustratively, all circuits or circuit elements (including PDL 301, TDC 304 and core circuit 611) within the voltage domain 610 may be connected to VDDvir and VSS.

The circuit arrangement 1300 further includes a switch array 106 coupled between the common power supply node 302 and a first power supply 307*a*.

The first power supply 307*a* may provide a plurality of first upper supply voltages VDD as shown. The lower supply voltage VSS may be provided by a second power supply 307*b*, as shown. The first power supply 307*a* and/or second power supply 307*b* may, for example, be provided by a power management unit (PMU) (not shown, see e.g. FIG. 7A).

The signal input 301*a* of the PDL 301 may be coupled to a signal output 1320*c* of a register 1320. A clock signal CLK may be coupled to a first input 1320*a* (herein also referred to as clock signal input 1320*a*) of the register 1320, and a data signal "D" may be coupled to a second input 1320*b* (herein also referred to as data signal input 1320*b*) of the register 1320, as shown.

A delay of the programmable delay line (PDL) 301 is measured by the time-to-digital converter (TDC) 304.

The TDC 304 includes a plurality of stages 1340_1, 1340_2, . . . , 1340_*n* coupled in series, wherein each of the stages 1340_1, 1340_2, . . . , 1340_*n* includes a sampling register 1341 and a buffer gate 1342. Seven stages 1340_1, 1340_2, . . . , 1340_7 (i.e. n=7) are shown as an example. However, the number n of stages may be different from seven. In general, n may be equal to or greater than one, i.e. n≥1. A first signal input 1341*a* (also referred to as clock signal input) of the sampling register 1341 of each stage 1340_*k* (k=1, 2, . . . , n) may be coupled to the clock signal CLK, as shown. A second signal input 1341*b* (also referred to as data signal input) of the sampling register 1341 and a signal input 1342*a* of the buffer gate 1342 of each stage 1340_*k* (k=1, 2, . . . , n) may be coupled to a signal output 1342*b* of the buffer gate 1342 of the previous stage 1340_*k*−1, or to the signal output 301*b* of the PDL 301 in case of the first stage 1340_1, as shown.

The sampling registers 1341 of the stages 1340_1, 1340_2, . . . , 1340_*n* of the TDC 304 are coupled (e.g. directly coupled) to a switch array 106 including a plurality of switches 1350_1, 1350_2, . . . , 1350_*n*. In particular, a signal output 1341*c* of a sampling register 1341 of each stage 1340_*k* (k=1, 2, . . . , n) may be connected to a control terminal of a respective switch 1350_*k* (k=1, 2, . . . , n) of the plurality of switches 1350_1, 1350_2, . . . , 1350_*n*. For example, an output 1341*c* of the register 1341 of the first stage 1340_1 of the TDC 304 may be coupled to a control terminal of a first switch 1350_1 of the switch array 106, an output 1341*c* of the register 1341 of the second stage 1340_2 of the TDC 304 may be coupled to a control terminal of a second switch 1350_2 of the switch array 106, etc, . . . , and an output 1341*c* of the register 1341 of the n-th stage 1340_*n* of the TDC 304 may be coupled to a control terminal of an n-th switch 1350_*n* of the switch array 106, . . . , etc., as shown.

The switches 1350_1, 1350_2, . . . , 1350_*n* may, for example, be implemented as transistors, e.g. as PMOS transistors (see e.g. FIG. 14). However, alternatively, one or more of the switches 1350_1, 1350_2, . . . , 1350_*n* may be implemented differently.

In every clock cycle of the clock signal CLK, the TDC 304 may provide a digital switch array control signal 105 (digital output word) having a thermometer code (a number of digital "1"s followed by a number of digital "0"s). The number of ones and the number of zeroes in the digital output word 105 depends on the signal delay of the PDL 301 and may change from clock cycle to clock cycle. The number of open and closed switches in the switch array 106 corresponds to the number of ones and zeroes in the digital output word 105. For example, in the example shown in FIG. 13 the TDC 304 provides as digital output word 105 the sequence "1110000 . . . " (i.e. the first to third bits of the output word 105 are "1" while the remaining bits are "0") to the switch array 106, and accordingly, the first to third switches 1350_1, 1350_2, 1350_3 of the switch array 106 may be opened while the remaining switches 1350_4, . . . , 1350_*n* of the switch array 106 may be closed by the digital output word 105.

If the delay of the PDL 301 increases, the number of zeroes in the TDC 304's sampling registers 1341 increases, leading to a higher number of switches which connect VDD with VDDvir. Illustratively, the "1" to "0" transition in the digital output word "1110000 . . . " in FIG. 13 will shift to the left and the number of closed switches in the switch array 106 will increase accordingly. Hence, the amount of injected charge from VDD to VDDvir may be increased, allowing a higher current flowing from VDD to VDDvir. Thus, VDDvir may slightly increase leading to a decrease of propagation delay of the PDL 301. Thus, the circuit may suppress PVT induced delay variations.

If the delay of the PDL 301 decreases, the number of zeroes in the TDC 304's sampling registers 1341 decreases, leading to a smaller number of switches which connect VDD with VDDvir. Illustratively, the "1" to "0" transition the digital output word "1110000 . . . " in FIG. 13 will shift to the right and the number of open switches in the switch array 106 will increase accordingly. Hence, the amount of injected charge from VDD to VDDvir may be decreased, reducing the current flowing from VDD to VDDvir. Thus, VDDvir may slightly decrease leading to an increase of propagation delay of the PDL 301.

To set the target performance of the core circuit 611, the PDL 301 may be adapted to shift the "1" to "0" transition within the TDC 304. In other words, the PDL 301 may be programmed to set a nominal delay of the PDL 301's output signal, and correspondingly, a nominal digital output word of the TDC 304 and nominal number of open and closed switches 106, corresponding, in turn, to a nominal amount of charge injected from VDD to VDDvir and thus a nominal power supply to the core circuit 611 residing in the voltage domain 610.

In an exemplary implementation, the switch array 106 may include at least one additional switch 1355 coupled between the common power supply node 302 and a third power supply 307c. The third power supply 307c may provide a second upper supply voltage VDDmain, as shown. The at least one additional switch 1355 may, for example, be configured to set or control an offset power supply to the common power supply node 302. To this end, a control signal "Offset_EN" may be applied to a control terminal of the at least one additional switch 1355, as shown.

The second upper supply voltage VDDmain may be the same voltage as the first upper supply voltage VDD, or may be a different voltage. For example, the first upper supply voltage VDD may be equal to or greater than the second upper supply voltage VDDmain.

Illustratively, FIG. 13 shows one example for the use of switched parallel switches for performance regulation by switched charge injection. In the following, further examples of implementing a delay-measurement based adaptation of performance using the principle of switched charge injection will be described.

FIG. 14 shows a circuit arrangement 1400 according to another aspect of this disclosure.

The circuit arrangement 1400 is to some degree similar to the circuit arrangement 1300 shown in FIG. 13, and identical reference signs denote the same or similar elements as there and will not be described in detail again here. Reference is made to the description above.

In the circuit arrangement 1400, the switch array 106 includes a plurality of PMOS switches 1450_1, 1450_2, . . . , 1450_n coupled between the common power supply node 302 and the first power supply 307a. In other words, in the circuit arrangement 1400, a plurality of PMOS switches 1450_1, 1450_2, . . . , 1450_n may be used for switched charge injection via the common power supply node 302. Seven PMOS switches 1450_1, 1450_2, . . . , 1450_n (i.e. n=7) are shown as an example in FIG. 14. However, the number n of switches may be different from seven. In general, n may be greater than or equal to one, i.e. n≥1.

The digital switch array control signal 105 (digital output word) provided by the registers 1341 of the TDC 304 may be coupled to gate terminals of the PMOS switches 1450_1, 1450_2, . . . , 1450_n, as shown. For example, each bit of the digital switch array control signal 105 may be used to control a respective one of the PMOS switches 1450_1, 1450_2, . . . , 1450_n, as shown.

Each PMOS switch 1450_k (k=1, 2, 3, . . . , n) may have a predetermined length $L_k$ and width $W_k$, as shown. The lengths $L_k$ and/or widths $W_k$ of the PMOS switches 1450_1, 1450_2, . . . , 1450_n may be the same for all switches.

Alternatively, at least one of the PMOS switches 1450_1, 1450_2, . . . , 1450_n may have a different length and/or width. For example, the PMOS switches 1450_1, 1450_2, . . . , 1450_n, or the length and/or width of the PMOS switches 1450_1, 1450_2, . . . , 1450_n, may be configured such that the amount of charge injected by an opened switch decreases monotonically, or strictly monotonically, from switch to switch. For example, if the amount of charge injected by each switch 1450_k (k=1, 2, 3, . . . , n) is denoted as $I_k$, then the following may hold true: $I_1 \geq I_2 \geq I_3 \geq \ldots \geq I_{n-1} \geq I_n$ (monotonic decrease), or $I_1 > I_2 > I_3 > \ldots > I_{n-1} > I_n$ (strictly monotonic decrease), or $I_1 \geq I_2 \geq \ldots \geq I_j = I_{j+1} = \ldots = I_{n-1} = I_n$ (2≤j≤n), or $I_1 > I_2 > \ldots > I_j = I_{j+1} = \ldots = I_{n-1} = I_n$ (2≤j≤n). Illustratively, switches corresponding to TDC stages located closer to the PDL 301's signal output 301b may inject more charge than switches corresponding to TDC stages located farther from the PDL 301's signal output 301b. This may, for example, have the effect that an increase in the signal delay of the PDL 301 (which leads to a left shift of the "1" to "0" transition in the TDC 304's digital output word 105 and thus to a left shift of the "open" to "closed" transition in the switch array 106) may be compensated faster.

As shown in FIG. 14, the at least one additional switch 1455 used for offset power supply control may also be implemented as a PMOS switch having, for example, a length $L_O$ and width $W_O$.

In another implementation (not shown), one or more (e.g. all) of the PMOS switches 1450_1, 1450_2, . . . , 1450_n of the circuit arrangement 1400 may be replaced by NMOS switches. In this case, the bit(s) of the digital output word 105 provided by the corresponding register(s) 1341 of the TDC 304 may be inverted, e.g. by coupling an inverter element between the output of the register(s) 1341 and the gate terminal of the corresponding NMOS switch(es). Also, the PMOS switch 1355 may be replaced by an NMOS switch in another implementation.

Illustratively, FIG. 14 shows an example of a circuit arrangement where charge injection to the common power supply node 302 may be controlled by means of PMOS switches. In another implementation, charge injection may be controlled by means of switched current mirrors, as shown in FIG. 15.

FIG. 15 shows a circuit arrangement 1500 according to another aspect of this disclosure.

The circuit arrangement 1500 is to some degree similar to the circuit arrangement 1400 shown in FIG. 14, and identical reference signs denote the same or similar elements as there and will not be described in detail again here. Reference is made to the description above.

The circuit arrangement 1500 differs from the circuit arrangement 1400 in that the PMOS switches 1450_1, 1450_2, . . . , 1450_n of the circuit arrangement 1400 are replaced by switched current sources 1550_1, 1550_2, . . . , 1550_n in the circuit arrangement 1500. Each switched current source 1550_k (k=1, 2, . . . , n) may include a series connection of a PMOS switch (similar to the PMOS switch 1450_k in FIG. 14) and a current source, and provides a current $I_k$, as shown.

Illustratively, in the circuit arrangement 1500, a plurality of switched current sources 1550_1, 1550_2, . . . , 1550_n may be used for switched charge injection via the common power supply node 302. Seven switched current sources 1550_1, 1550_2, ..., 1550_n (i.e. n=7) are shown as an example in FIG. 15. However, the number n of switched current sources may be different from seven. In general, n may be greater than or equal to one, i.e. n≥1.

Similarly to FIG. 14, the digital switch array control signal 105 (digital output word) provided by the registers 1341 of the TDC 304 may be coupled to gate terminals of the PMOS switches of the switched current sources 1550_1, 1550_2, ..., 1550_n, as shown.

The currents $I_k$ provided by the switched current sources 1550_1, 1550_2, ..., 1550_n may be the same for all switched current sources 1550_1, 1550_2, ..., 1550_n (i.e. $I_1=I_2=I_3=\ldots=I_n$). In other words, the amount of charge injected by the individual switched current sources 1550_1, 1550_2, ..., 1550_n may be the same for all current sources.

Alternatively, at least one of the switched current sources 1550_1, 1550_2, ..., 1550_n may provide a current having a different magnitude. For example, similarly as described above in connection with the PMOS switches 1450_1, 1450_2, ..., 1450_n in the circuit arrangement 1400 of FIG. 14, the switched current sources 1550_1, 1550_2, ..., 1550_n of the circuit arrangement 1500 of FIG. 15 may be configured such that the amount of charge (i.e. current $I_k$) injected by the current sources 1550_1, 1550_2, ..., 1550_n decreases monotonically, or strictly monotonically, from current source to current source. For example, the following may hold true: $I_1 \geq I_2 \geq I_3 \geq \ldots \geq I_{n-1} \geq I_n$ (monotonic decrease), or $I_1 > I_2 > I_3 > \ldots > I_{n-1} > I_n$ (strictly monotonic decrease), or $I_1 \geq I_2 \geq \ldots \geq I_j = I_{j+1} = \ldots = I_{n-1} = I_n$ (2≤j≤n), or $I_1 > I_2 > \ldots > I_j = I_{j+1} = \ldots = I_{n-1} = I_n$ (2≤j≤n).

As shown in FIG. 15, the additional PMOS switch 1455 of the circuit arrangement 1400 used for offset power control may also be replaced by a switched current source 1555 implemented by a series connection of a PMOS switch (which may be similar to PMOS switch 1455 in FIG. 14) coupled to the offset control signal "Offset_EN", and a current source, the switched current source 1555 providing a current $I_0$.

In another implementation (not shown), one or more (e.g. all) of the PMOS switches of the switched current sources 1550_1, 1550_2, ..., 1550_n in the circuit arrangement 1500 may be replaced by NMOS switches. In this case, the bit(s) of the digital output word 105 provided by the corresponding register(s) 1341 of the TDC 304 may be inverted, e.g. by coupling an inverter element between the output of the register(s) 1341 and the gate terminal of the corresponding NMOS switch(es). Also, the PMOS switch of the switched current source 1555 may be replaced by an NMOS switch in another implementation.

Illustratively, FIG. 15 shows an example of a circuit arrangement where charge injection to the common power supply node 302 may be controlled by means of switched current sources. In another implementation, charge injection may be controlled by means of switched current mirrors, as shown in FIG. 16.

FIG. 16 shows a circuit arrangement 1600 in accordance with another aspect of this disclosure.

The circuit arrangement 1600 is to to some degree similar to the circuit arrangement 1400 shown in FIG. 14, and identical reference signs denote the same or similar elements as there and will not be described in detail again here. Reference is made to the description above.

The circuit arrangement 1600 differs from the circuit arrangement 1400 in that the PMOS switches 1450_1, 1450_2, ..., 1450_n of the circuit arrangement 1400 are replaced by switched current mirrors 1650_1, 1650_2, ..., 1650_n in the circuit arrangement 1600. Each switched current mirror 1650_k (k=1, 2, ..., n) may include a series connection of a PMOS switch (similar to the PMOS switch 1450_k in FIG. 14) and a first PMOS current mirror transistor having a length $L_k$ and a width $W_k$, as shown. A common second PMOS current mirror transistor 1660 may be coupled between the first upper supply voltage VDD and a bias voltage $V_{Bias}$, and a gate terminal of the second PMOS current mirror transistor 1660 may be coupled to the bias voltage $V_{Bias}$ and further to the gate terminals of the first PMOS current mirror transistors of all switched current mirrors 1650_1, 1650_2, ..., 1650_n, as shown.

Illustratively, in the circuit arrangement 1600, a plurality of switched current mirrors 1650_1, 1650_2, ..., 1650_n may be used for switched charge injection via the common power supply node 302. Seven switched current mirrors 1650_1, 1650_2, ..., 1650_n (i.e. n=7) are shown as an example in FIG. 16. However, the number n of switched current mirrors may be different from seven. In general, n may be greater than or equal to one, i.e. n≥1.

Similarly to FIGS. 14 and 15, the digital switch array control signal 105 (digital output word) provided by the registers 1341 of the TDC 304 may be coupled to gate terminals of the PMOS switches of the switched current mirrors 1650_1, 1650_2, ..., 1650_n, as shown.

The current $I_k$ provided by an individual switched current mirror 1650_k may be determined by the length $L_k$ and/or width $W_k$ of the respective first current mirror transistor.

The currents provided by the switched current mirrors 1650_1, 1650_2, ..., 1605_n may be the same for all switched current mirrors 1650_1, 1650_2, ..., 1650_n. In other words, the amount of charge injected by the individual switched current mirrors 1650_1, 1650_2, ..., 1650_n may be the same for all current mirrors.

Alternatively, at least one of the switched current mirrors 1650_1, 1650_2, ..., 1650_n may provide a current having a different magnitude. For example, similarly as described above in connection with the PMOS switches 1450_1, 1450_2, ..., 1450_n in the circuit arrangement 1400 of FIG. 14, the lengths $L_k$ and/or widths $W_k$ of the first current mirror transistors of the switched current mirrors 1650_1, 1650_2, ..., 1650_n in the circuit arrangement 1600 of FIG. 16 may be configured such that the amount of charge (i.e. current $I_k$) injected by the current mirrors 1650_1, 1650_2, ..., 1650_n decreases monotonically, or strictly monotonically, from current mirror to current mirror. For example, the following may hold true: $I_1 \geq I_2 \geq I_3 \geq \ldots \geq I_{n-1} \geq I_n$ (monotonic decrease), or $I_1 > I_2 > I_3 > \ldots > I_{n-1} > I_n$ (strictly monotonic decrease), or $I_1 \geq I_2 \geq \ldots \geq I_j = I_{j+1} = \ldots = I_{n-1} = I_n$ (2≤j≤n), or $I_1 > I_2 > \ldots > T_j = I_{j+1} = \ldots = I_{n-1} = I_n$ (2≤j≤n).

As shown in FIG. 16, the PMOS switch 1455 of the circuit arrangement 1400 used for offset power control may also be replaced by a current mirror 1655 implemented by a series connection of a PMOS switch (which may be similar to PMOS switch 1455 in FIG. 14) coupled to the offset control signal "Offset_EN", and a first current mirror transistor having, for example, a length $L_0$ and width $W_0$, as shown.

In another implementation (not shown), one or more (e.g. all) of the switched PMOS current mirrors 1650_1, 1650_2, ..., 1650_n in the circuit arrangement 1600 may be replaced by switched NMOS current mirrors. In this case, the bit(s) of the digital output word 105 provided by the corresponding register(s) 1341 of the TDC 304 may be inverted, e.g. by coupling an inverter element between the output of the register(s) 1341 and the gate terminal of the corresponding NMOS switch(es). Also, the PMOS current mirror 1655 may be replaced by an NMOS current mirror in another implementation.

Illustratively, FIG. 16 shows an example of a circuit arrangement where charge injection to the common power supply node 302 may be controlled by means of switched current mirrors.

Figure 17:
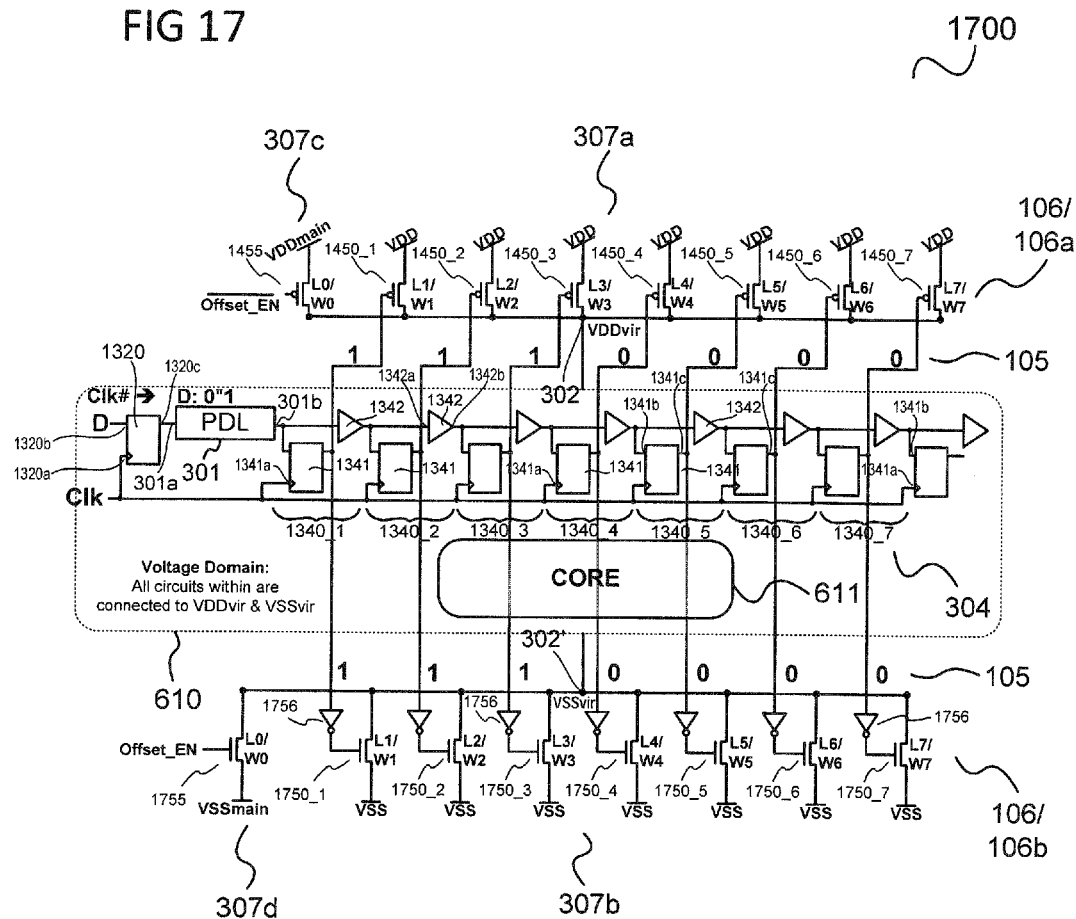
FIG. 17 shows a circuit arrangement according to another aspect of this disclosure.

FIG. 17 shows a circuit arrangement 1700 according to another aspect of this disclosure.

The circuit arrangement 1700 is to to some degree similar to the circuit arrangement 1400 shown in FIG. 14, and identical reference signs denote the same or similar elements as there and will not be described in detail again here. Reference is made to the description above.

The circuit arrangement 1700 differs from the circuit arrangement 1400 in that the switch array 106 in the circuit arrangement 1700 has a first part 106*a* including n PMOS switches 1450_1, 1450_2, . . . , 1450_*n* (n=7 in the example shown, however n may be different from seven; in general, n may be greater than or equal to one, i.e. n≥1) coupled between the first common power supply node 302 and the first power supply 307*a*, and a second part 106*b* including m NMOS switches 1750_1, 1750_2, . . . , 1750_*m* (m=7 in the example shown, however m may be different from seven; in general, m may be greater than or equal to one, i.e. m≥1; although the same number of PMOS and NMOS switches are shown as an example (i.e. n=m), in general, the number of NMOS switches does not need to be equal to the number of PMOS switches) coupled between a second common power supply node 302' and the second power supply 307*b*. A voltage level at the second common power supply node 302' may be denoted as VSSvir and may correspond to a virtual or effective lower supply voltage, as described herein above. Illustratively, the elements or circuits residing in the core voltage domain 610 may be coupled between the virtual upper supply voltage VDDvir at the (first) common power supply node 302 and the virtual lower supply voltage VSSvir at the second common power supply node 302'. In other words, all circuits within the voltage domain 610 may be connected VDDvir and VSSvir, as shown.

The first part 106*a* of the switch array 106 may be configured in the same or a similar manner as the switch array 106 in the circuit arrangement 1400 shown in FIG. 14.

The second power supply 307*b* may provide a plurality of lower supply voltages VSS, and each NMOS switch 1750_*k* (k=1, 2, . . . , m) may be coupled between the second common power supply node 302' and a respective one of the plurality of lower supply voltages VSS, as shown.

Both the PMOS switches 1450_1, 1450_2, . . . , 1450_*n* of the first part 106*a* of the switch array 106 and the NMOS switches 1750_1, 1750_2, . . . , 1750_*m* of the second part 106*b* of the switch array 106 may be controlled by the digital switch array control signal 105 provided by the TDC 304, as shown. In particular, the output of the sampling register 1341 of the k-th stage 1340_*k* (k=1, 2, 3, . . . ) of the TDC 304 may be coupled to the control terminal (gate terminal) of the k-th PMOS switch 1450_*k* and (via a respective inverter element 1756) to the control terminal (gate terminal) of the k-th NMOS switch 1750_*k*, as shown. Thus, the k-th PMOS switch 1450_*k* of the first part 106*a* of the switch array 106 and the k-th NMOS switch 1750_*k* of the second part 106*b* of the switch array 106 may be opened or closed at the same time.

In an exemplary implementation, the switch array 106, or the second part 106*b* of the switch array 106, may further include at least one additional switch 1755 (e.g. an NMOS switch having e.g. length $L_0$ and width $W_0$ as shown) coupled between the second common power supply node 302' and a fourth power supply 307*d*. The fourth power supply 307*d* may provide a second lower supply voltage VSSmain, as shown. The at least one additional switch 1755 may, for example, be configured to set or control an offset power supply to the second common power supply node 302'. To this end, an offset control signal "Offset_EN" may be applied to a control terminal (e.g. gate terminal) of the at least one additional switch 1755, as shown.

The second lower supply voltage VSSmain may be the same voltage as the (first) lower supply voltage VSS, or may be a different voltage. For example, the (first) lower supply voltage VSS may be equal to or lower than the second lower supply voltage VSSmain.

Illustratively, FIG. 17 shows an example of a circuit arrangement where PMOS and NMOS switches may be used for controlling power supply via first and second common power supply nodes 302, 302' by adaptation of VDDvir and VSSvir potentials via switch setting. Thus, performance regulation of e.g. the core circuit 611 may be achieved.

It should be noted that according to alternative implementations, one or more of the PMOS switches shown in FIG. 17 may be replaced by NMOS switches, and/or one or more of the NMOS switches shown in FIG. 17 may be replaced by PMOS switches. Furthermore, it may be possible to use e.g. switched current sources or switched current mirrors instead of MOS switches, for example in a similar manner as described above in connection with FIGS. 15 and 16.

Figure 18:
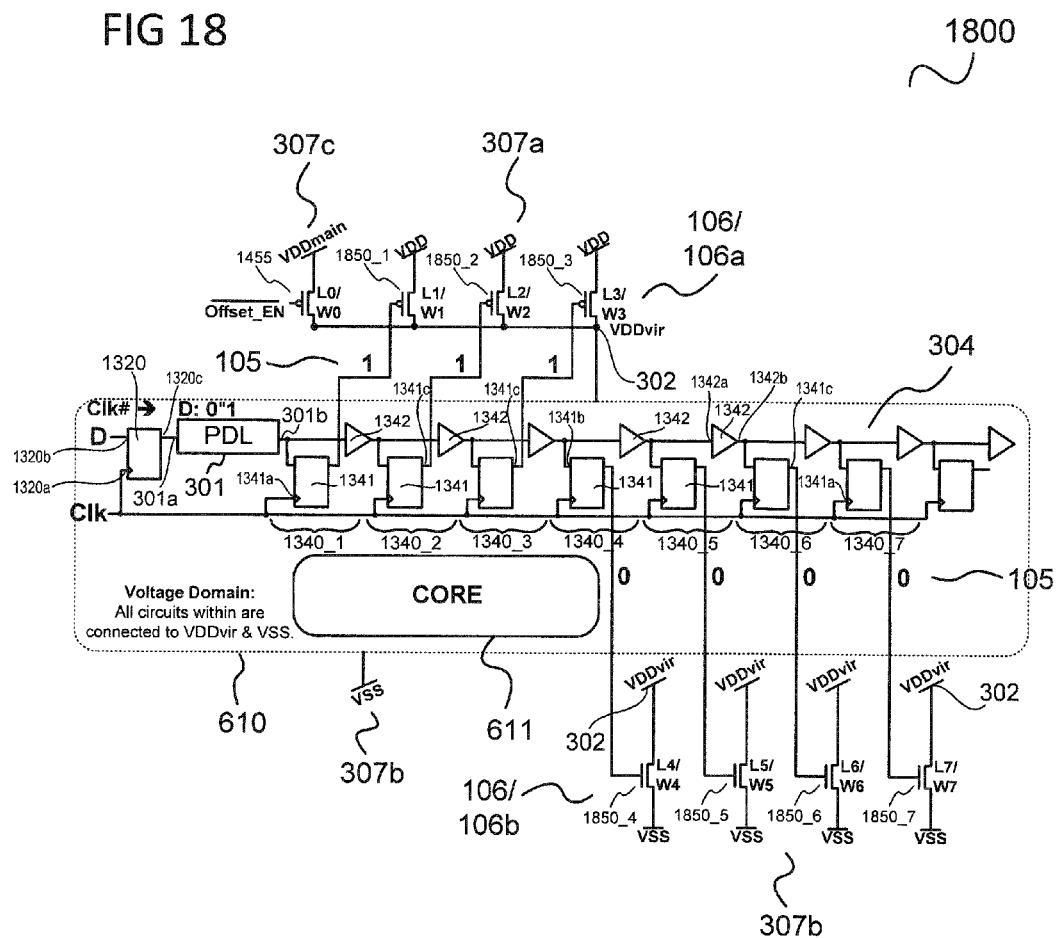
FIG. 18 shows a circuit arrangement according to another aspect of this disclosure.

FIG. 18 shows a circuit arrangement 1800 according to another aspect of this disclosure.

The circuit arrangement 1800 is to to some degree similar to the circuit arrangement 1400 shown in FIG. 14, and identical reference signs denote the same or similar elements as there and will not be described in detail again here. Reference is made to the description above.

The circuit arrangement 1800 differs from the circuit arrangement 1400 in that the switch array 106 in the circuit arrangement 1800 includes a plurality of switches, e.g. n switches, wherein first to k-th switches 1850_1, . . . , 1850_*k* of the switch array 106 (corresponding to first to k-th stages 1340_1, 1340_2, . . . , 1340_*k* of the TDC 304) are coupled between the common power supply node 302 and the first power supply 307*a* providing the upper supply voltages VDD, and (k+1)-th to n-th switches 1850_*k*+1, . . . , 1850_*n* of the switch array 106 (corresponding to (k+1)-th to n-th stages 1340_*k*+1, 1340_*k*+2, . . . , 1340_*n* of the TDC 304) are coupled between the common power supply node 302 and the second power supply 307*b* providing the lower supply voltages VSS. In other words, the first k switches of the n switches may be coupled between VDD and VDDvir, while the remaining n-k switches may be coupled between VDDvir and VSS.

The first to k-th switches of the switch array 106 may, for example, be configured as PMOS switches, and the (k+1)-th to n-th switches may, for example, be configured as NMOS switches. In the example shown in FIG. 18, first to third switches 1850_1, 1850_2, 1850_3 of the switch array 106 (corresponding to first to third stages 1340_1, 1340_2, 1340_3 of the TDC 304) are coupled between the common power supply node 302 and are configured as PMOS switches, and fourth to seventh switches 1850_4, 1850_5, 1850_6, 1850_7 of the switch array 106 (corresponding to fourth to seventh stages 1340_4, 1340_5, 1340_6, 1340_7 of the TDC 304) are coupled between the common power supply node 302 and the second power supply 307*b* and are configured as NMOS switches, as shown, i.e. n=7 and k=3 in the example. As will be readily understood, n and k may be different. For example, n may be an integer greater than one (i.e. n≥2), and k may be a positive integer less than n (i.e. 1≤k<n).

The number k of switches coupled between the common power supply node 302 and the first power supply 307a (i.e. between VDDvir and VDD) may correspond to the number of "1"s in a digital output word 305, which corresponds to the PDL 301's signal delay under nominal operating conditions, e.g. when the voltage level VDDvir at the common power supply node 302 has a nominal value "VDDvir,nom". Correspondingly, the number n−k of switches coupled between the common power supply node 302 and the second power supply 307b (i.e. between VDDvir and VSS) may correspond to the number of "0"s in the digital output word 305, which corresponds to the PDL 301's signal delay under nominal operating conditions. For example, in the example shown in FIG. 18, the digital output word 105 corresponding to the PDL 301's signal delay under nominal operating conditions (e.g. when VDDvir has a nominal value "VDDvir,nom") may be "1110000" and, correspondingly, the first to third switches 1850_1, 1850_2, 1850_3 may be coupled between VDDvir and VDD, while the fourth to seventh switches 1850_4, 1850_5, 1850_6, 1850_7 may be coupled between VDDvir and VSS.

Illustratively, in the circuit arrangement 1800, control of power supply via the common power supply node 302 and thus performance regulation of e.g. the core circuit 611 may be achieved by charge injection (using the PMOS switches 1850_1, 1850_2, 1850_3) and shunt regulation (using the NMOS switches 1850_4, 1850_5, 1850_6, 1850_7).

For example, if the delay of the PDL 301 increases, the leading "1" in the digital output word 105 will move to the left. Thus, additional charge may be injected by one or more of the PMOS switches 1850_1, 1850_2, 1850_3 connecting VDDvir to VDD. This may lead to an increase in power supply to the core voltage domain 610, and as a consequence, the PDL delay may decrease again.

For example, if the leading "1" in the digital output word "1110000" moves one position to the left (i.e., transition from "1110000"→"1100000"), then the PMOS switch 1850_3 will close and connect VDD to VDDvir, thus leading to additional charge injection. If the leading "1" in the digital output word "1110000" moves two positions to the left (i.e., transition from "1110000"→"1000000"), then the PMOS switches 1850_3 and 1850_2 will close and connect VDD to VDDvir, thus leading to still more additional charge injection, etc.

On the other hand, if the delay of the PDL 301 decreases, e.g. in case of a voltage overshoot, the leading "1" in the digital output word 105 will move to the right. Thus, charge may be dumped from VDDvir by one or more of the NMOS switches 1850_4, 1850_5, 1850_6, 1850_7 connecting VDDvir to VSS. This may lead to a decrease in power supply to the core voltage domain 610, and as a consequence, the PDL delay may increase again.

For example, if the leading "1" in the digital output word "1110000" moves one position to the right (i.e., transition from "1110000"→"1111000"), then the NMOS switch 1850_4 will close and connect VDDvir to VSS, thus leading to charge dump from VDDvir to VSS. If the leading "1" in the digital output word "1110000" moves two positions to the right (i.e., transition from "1110000"→"1111100"), then the NMOS switches 1850_4 and 1850_5 will close and connect VDDvir to VSS, thus leading to still more charge dump from VDDvir to VSS, etc.

Illustratively, the switch array 106 of the circuit arrangement 1800 may include a first part 106a containing first to k-th switches coupled between the common power supply node 302 and upper supply voltages VDD, and a second part 106b containing (k+1)-th to n-th switches coupled between the common power supply node 302 and lower supply voltages VSS. The first to k-th switches may serve to increase charge injection to the common power supply node 302, while the (k+1)-th to n-th switches may serve to dump charge from the common power supply node 302.

The first to k-th switches may, for example, be configured as PMOS switches and the (k+1)-th to n-th switches may, for example, be configured as NMOS switches. However, as will be readily understood, one or more of the PMOS switches may be configured as NMOS switch, and/or one or more of the NMOS switches may be configured as PMOS switch. In this case, an inverter may, for example, be coupled between the control terminal of the respective switch and corresponding sampling register 1341 of the TDC 304. Furthermore, it may also be possible to use switched current sources or switched current mirrors, as described herein above.

Figure 19:
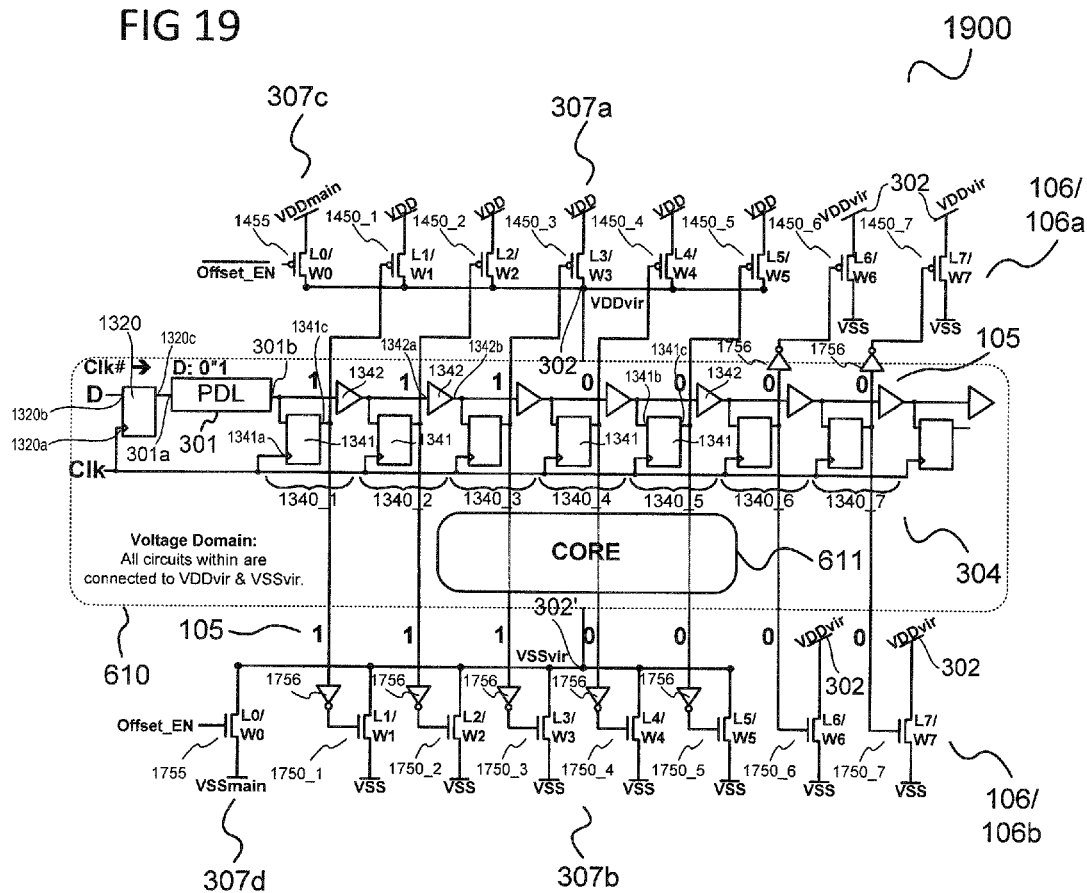
FIG. 19 shows a circuit arrangement according to another aspect of this disclosure.

FIG. 19 shows a circuit arrangement 1900 according to another aspect of this disclosure.

The circuit arrangement 1900 is to to some degree similar to the circuit arrangement 1700 shown in FIG. 17, and identical reference signs denote the same or similar elements as there and will not be described in detail again here. Reference is made to the description above.

The circuit arrangement 1900 differs from the circuit arrangement 1700 in that first to k-th PMOS switches 1450_1, 1450_2, . . . , 1450_k of n PMOS switches 1450_1, 1450_2, . . . , 1450_n (in the example shown, k=5 and n=7; however, in general n may be an integer greater than one, and k may be an integer greater than or equal to one and less than n, i.e. n>1 and 1≤k<n) of the first part 106a of the switch array 106 are coupled between the virtual upper supply voltage VDDvir at the first common power supply node 302 and the first upper supply voltage VDD (provided by the first power supply 307a), while (k+1)-th to n-th PMOS switches 1450_k+1, 1450_k+2, . . . , 1450_n of the n PMOS switches 1450_1, 1450_2, . . . , 1450_n of the first part 106a of the switch array 106 are coupled between the virtual upper supply voltage VDDvir at the first common power supply node 302 and the first lower supply voltage VSS (provided by the second power supply 302b).

The circuit arrangement 1900 differs further from the circuit arrangement 1700 in that first to i-th NMOS switches 1750_1, 1750_2, . . . , 1750_i of m NMOS switches 1750_1, 1750_2, . . . , 1750_m (in the example shown, i=5 and m=7; however, in general m may be an integer greater than one, and i may be an integer greater than or equal to one and less than m, i.e. m>1 and 1≤i<m; furthermore, m may be equal to or may be different from n, and i may be equal to or may be different from k) of the second part 106b of the switch array 106 are coupled between the virtual lower supply voltage VSSvir at the second common power supply node 302' and the first lower supply voltage VSS (provided by the second power supply 307b), while (i+1)-th to m-th NMOS switches 1750_i+1, 1750_i+2, . . . , 1750_m are coupled between the virtual upper supply voltage VDDvir at the first common power supply node 302 and the first lower supply voltage VSS (provided by the second power supply 302b).

Illustratively, FIG. 19 shows an example of a circuit arrangement where PMOS and NMOS switches may be used for performance regulation with the capability of charge injection and shunt regulation.

Figure 20:
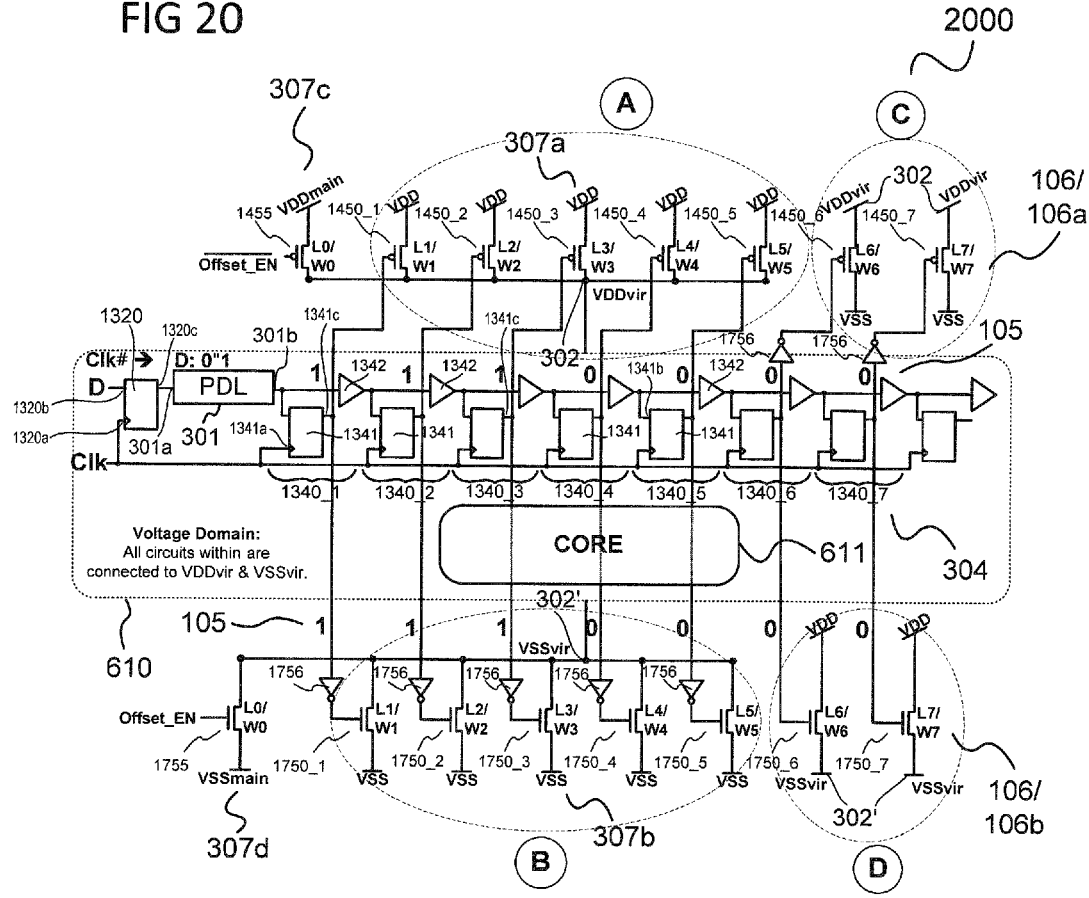
FIG. 20 shows a circuit arrangement according to another aspect of this disclosure.

FIG. 20 shows a circuit arrangement 2000 according to another aspect of this disclosure.

The circuit arrangement 2000 is to to some degree similar to the circuit arrangement 1900 shown in FIG. 19, and identical reference signs denote the same or similar elements as there and will not be described in detail again here. Reference is made to the description above.

The circuit arrangement 2000 differs from the circuit arrangement 1900 in that the (i+1)-th to m-th NMOS switches 1750_i+1, 1750_i+2, ..., 1750_m of the second part 106b of the switch array 106 (i.e. the sixth NMOS switch 1750_6 and the seventh NMOS switch 1750_7 in the example shown) are coupled between the virtual lower supply voltage VSSvir at the second common power supply node 302' and the first upper supply voltage VDD (provided by the first power supply 307a).

Illustratively, the circuit arrangement 2000 of FIG. 20 represents another example of a circuit arrangement where PMOS and NMOS switches may be used for performance regulation with the capability of charge injection and shunt regulation.

In the circuit arrangement 2000, each of the PMOS switches 1450_1, 1450_2, ..., 1450_5 of the first part 106a of the switch array 106 may connect VDD to VDDvir (indicated by region "A" in FIG. 20). Thus, charge injection from VDD to the first common power supply node 302 may be controlled and VDDvir may be increased or decreased depending on how many of the PMOS switches 1450_1, 1450_2, ..., 1450_5 are open or closed. As the PDL 301's signal delay may depend on the voltage difference $\Delta V = VDDvir - VSSvir$ (i.e. an increase in $\Delta V$ may decrease the signal delay, and a decrease in $\Delta V$ may increase the signal delay), an increase in VDDvir may decrease the PDL 301's signal delay and a decrease in VDDvir may increase the PDL 301's signal delay.

Furthermore, each of the NMOS switches 1750_1, 1750_2, ..., 1750_5 of the second part 106b of the switch array 106 may connect VSS to VSSvir (indicated by region "B" in FIG. 20). Thus, charge dump from the second common power supply node 302' to VSS may be controlled and VSSvir may be decreased or increased depending on how many of the NMOS switches 1750_1, 1750_2, ..., 1750_5 are open or closed. As the PDL 301's signal delay may depend on $\Delta V = VDDvir - VSSvir$, a decrease in VSSvir may decrease the PDL 301's signal delay and an increase in VSSvir may increase the PDL 301's signal delay.

Furthermore, each of the PMOS switches 1450_6 and 1450_7 of the first part 106a of the switch array 106 may connect VDDvir to VSS (indicated by region "C" in FIG. 20). Thus, charge dump from the first common power supply node 302 to VSS may be controlled and VDDvir may be decreased or increased depending on how many of the PMOS switches 1450_6, 1450_7 are open or closed. As the PDL 301's signal delay may depend on $\Delta V = VDDvir - VSSvir$, a decrease in VDDvir may increase the PDL 301's signal delay and an increase in VDDvir may decrease the PDL 301's signal delay.

Furthermore, each of the NMOS switches 1750_6 and 1750_7 of the second part 106b of the switch array 106 may connect VDD to VSSvir (indicated by region "D" in FIG. 20). Thus, charge injection from VDD to the second common power supply node 302' may be controlled and VSSvir may be increased or decreased depending on how many of the NMOS switches 1750_6 and 1750_7 are open or closed. As the PDL 301's signal delay may depend on $\Delta V = VDDvir - VSSvir$, an increase in VSSvir may increase the PDL 301's signal delay and a decrease in VSSvir may decrease the PDL 301's signal delay.

As will be readily understood, the number of switches in the individual regions "A", "B", "C" and "D" may be different from those shown in FIG. 20. Furthermore, PMOS switches may be replaced by NMOS switches and vice versa, as described herein above. Furthermore, it may be possible to use other types of switches than MOS switches, for example switched current sources or switched current mirrors, or others. Furthermore, it may be possible that only three of the regions "A", "B", "C" and "D" are present. Furthermore, it may be possible that only two regions of the regions "A", "B", "C" and "D" are present, for example regions "A" and "C", or regions "A" and "D", or regions "B" and "C", or regions "B" and "D".

Figure 21:
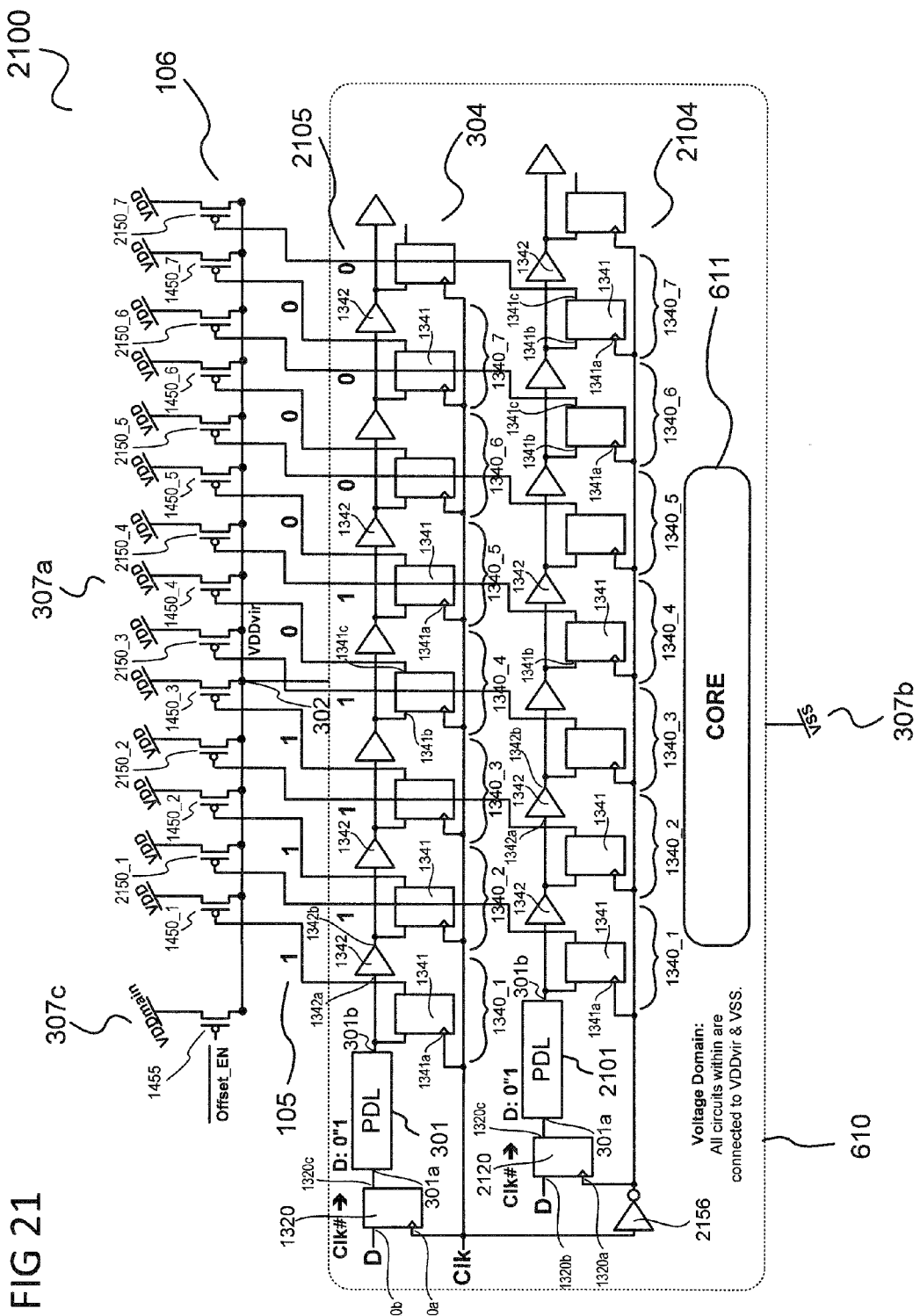
FIG. 21 shows a circuit arrangement according to another aspect of this disclosure.

FIG. 21 shows a circuit arrangement 2100 according to another aspect of this disclosure. The circuit arrangement 2100 may allow for a time-interleaved performance measurement and regulation, as will be described below.

The circuit arrangement 2100 is to some degree similar to the circuit arrangement 1400 shown in FIG. 14, and identical reference signs denote the same or similar elements as there and will not be described in detail again here. Reference is made to the description above.

The circuit arrangement 2100 differs from the circuit arrangement 1400 in that the circuit arrangement 2100 includes an additional delay line, in this example an additional programmable delay line (PDL) 2101, and an additional time-to-digital converter (TDC) 2104 coupled to the additional PDL 2101. The additional PDL 2101 and the additional TDC 2104 may reside in the common voltage domain 610 defined by the virtual upper supply voltage VDDvir at the common power supply node 302 and the lower supply voltage VSS provided by the second power supply 307b. In other words, the additional PDL 2101 and additional TDC 2104 may be connected to VDDvir and VSS.

The additional PDL 2101 may be configured similarly or identically to the PDL 301. In particular, the additional PDL 2101 may be configured such that a (nominal) signal delay of the additional PDL 2101 is identical to a (nominal) signal delay of the PDL 301. For example, a signal propagation path in the additional PDL 2101 may be configured such that its (nominal) signal delay is identical to the (nominal) signal delay of the signal propagation path in the PDL 301. For example, the additional PDL 2101's signal propagation path may be identical to the PDL 301's signal propagation path (for example, the additional PDL 2101 and PDL 301 may have the same delay elements). However, the additional PDL 2101's signal propagation path may also be different from the PDL 301's signal propagation path, while the (nominal) delay times of both PDLs are the same.

A signal input 301a of the additional PDL 2101 may be coupled to a signal output 1320c of an additional register 2120. A data signal "D" may be coupled to a second signal input 1320b (herein also referred to as data signal input) of the additional register 2120, as shown. The data signal "D" coupled to the data signal input 1320b of the additional register 2120 may, for example, be the same as the data signal "D" coupled to the data signal input 1320b of the register 1320. Furthermore, the clock signal CLK may be coupled to a first signal input 1320a (herein also referred to as clock signal input) of the additional register 2120 via an inverter element 2156, as shown. Thus, the clock signal CLK may be provided to the additional register 2120 with a phase shift of 180°.

A delay of the additional programmable delay line (PDL) 2101 may be measured by the additional time-to-digital converter (TDC) 2104 and may be converted to an additional digital switch array control signal 2105, which may be used to control a plurality of additional switches 2150_1, 2150_2, ..., 2150_m of the switch array 106, as will be described below.

The additional TDC 2104 includes a plurality of stages 1340_1, 1340_2, ..., 1340_m coupled in series, wherein each of the stages 1340_1, 1340_2, ..., 1340_m includes a sampling register 1341 and a buffer gate 1342, similar to the TDC 304. Seven stages 1340_1, 1340_2, ..., 1340_7 (i.e. m=7) are shown as an example. However, the number m of stages may be different from seven. In general, m may be equal to or greater than one, i.e. m 1. Furthermore, the number of stages in the additional TDC 2104 may be equal to or may be different from the number of stages in the TDC 304, i.e. m=n or m # n. A first signal input 1341a (also referred to as clock signal input) of the sampling register 1341 of each stage 1340_k (k=1, 2, ..., m) may be coupled to the clock signal CLK, as shown. A second signal input 1341b (also referred to as data signal input) of the sampling register 1341 and a signal input 1342a of the buffer gate 1342 of each stage 1340_k (k=1, 2, ..., m) may be coupled to an output 1342b of the buffer gate 1342 of the previous stage 1340_k–1, or to a signal output 301b of the additional PDL 2101 in case of the first stage 1340_1, as shown.

The sampling registers 1341 of the stages 1340_1, 1340_2, ..., 1340_m of the additional TDC 2104 are coupled (e.g. directly coupled) to the switch array 106 including a plurality of additional switches 2150_1, 2150_2, ..., 2150_m. In particular, a signal output 1341c of a sampling register 1341 of each stage 1340_k of the additional TDC 2104 may be connected to a control terminal of a respective additional switch 2150_k of the plurality of additional switches 2150_1, 2150_2, ..., 2150_m. For example, an output 1341c of the register 1341 of the first stage 1340_1 of the additional TDC 2104 may be coupled to a control terminal of a first additional switch 2150_1 of the switch array 106, an output 1341c of the register 1341 of the second stage 1340_2 of the additional TDC 2104 may be coupled to a control terminal of a second additional switch 2150_2 of the switch array 106, . . . , an output 1341c of the register 1341 of the m-th stage 1340_m of the additional TDC 2104 may be coupled to a control terminal of an m-th additional switch 2150_m of the switch array 106, . . . , etc., as shown.

The additional switches 2150_1, 2150_2, ..., 2150_m may be implemented as transistors, e.g. as PMOS transistors (as shown). Alternatively, one or more of the additional switches 2150_1, 2150_2, ..., 2150_m may be implemented differently.

The additional TDC 2104 may provide an additional digital switch array control signal (digital output word) 2105 having a thermometer code (e.g. a number of digital "1"s followed by a number of digital "0"s), in a similar manner as the TDC 304. The number of open and closed switches of the additional switches 2150_1, 2150_2, ..., 2150_m in the switch array 106 corresponds to the number of ones and zeroes in the additional digital output word 2105. For example, in the example shown in FIG. 21 the additional TDC 2104 provides as additional digital output word 2105 the sequence "1111000 . . . " (i.e. the first to fourth bits of the additional output word 2105 are "1" while the remaining bits are "0") to the switch array 106, and accordingly, the first to fourth additional switches 2150_1, 2150_2, 2150_3, 2150_4 of the switch array 106 may be opened while the remaining additional switches 2150_5, ..., 2150_m of the switch array 106 may be closed by means of the additional digital output word 2105.

If the delay of the additional PDL 2101 increases, the number of zeroes in the sampling registers 1341 of the additional TDC 2104 increases, leading to a higher number of additional switches in the switch array 106 which connect VDD with VDDvir. Illustratively, the "1" to "0" transition in the additional digital output word 2105 will shift to the left and the number of closed switches of the additional switches 2150_1, 2150_2, ..., 2150_m in the switch array 106 will increase accordingly. Hence, the amount of injected charge from VDD to VDDvir may be increased, allowing a higher current flowing from VDD to VDDvir. Thus, VDDvir may slightly increase.

If the delay of the additional PDL 2101 decreases, the number of zeroes in the sampling registers 1341 of the additional TDC 2104 decreases, leading to a smaller number of additional switches 2150_1, 2150_2, ..., 2150_m which connect VDD with VDDvir. Illustratively, the "1" to "0" transition in the additional digital output word 2105 will shift to the right and the number of open switches of the additional switches 2150_1, 2150_2, ..., 2150_m in the switch array 106 will increase accordingly. Hence, the amount of injected charge from VDD to VDDvir may be decreased, reducing the current flowing from VDD to VDDvir. Thus, VDDvir may slightly decrease.

Illustratively, FIG. 21 shows an example for a circuit arrangement that allows for time-interleaved performance measurement and regulation by means of adding at least one additional measurement circuit (i.e. combination of a delay line and a TDC). In the circuit arrangement 2100 of FIG. 21, only one additional measurement circuit (delay line+TDC) is added, however two or more additional measurement circuits may be added as well.

The measurement of the additional delay line 2101 and TDC 2104 starts slightly time-shifted by Δt with $0<Δt<T_{CLK}$ ($T_{CLK}$ being the clock cycle), for example $Δt=T_{CLK}/n$ (n being the number of measurement circuits) although other values may be possible as well (it may also be possible that the time shift between consecutive measurements varies from measurement to measurement, for example a time shift between a first measurement and a consecutive second measurement may be different from a time shift between the second measurement and a consecutive third measurement). Thus, for one additional measurement circuit (as in the circuit arrangement 2100 of FIG. 21), circuit performance may be regulated twice per clock cycle, for two additional measurement circuits, circuit performance may be regulated three times per clock cycle, for three additional measurement circuits, circuit performance may be regulated four times per clock cycle, etc.

The time shift Δt between the measurements of the individual measurement circuits may, for example, be implemented by using a certain phase shift of the clock cycle (e.g. 180° in case of two measurement circuits, as shown in FIG. 21, or 360°/p in case of p measurement circuits (p=3, 4, 5, 6, . . . ), although other values may be possible as well). Alternatively, the time time shift Δt may, for example, be implemented by using one or more delay elements.

Illustratively, a plurality of measurement circuits (each including a PDL and a TDC) may be provided, wherein each measurement circuit may convert a signal delay of the measurement circuit's PDL into a corresponding digital switch array control signal to control a corresponding subarray of switches of the switch array, and wherein the digital switch array control signals of the individual measurement circuits are time-shifted by a time interval Δt ($0<Δt<T_{CLK}$) so that the subarrays of switches are controlled consecutively. By means of the time-interleaved measurement using sub-clock cycle time-shifted delay measurements as described above, the temporal resolution of the performance regulation may be improved.

Figure 22:
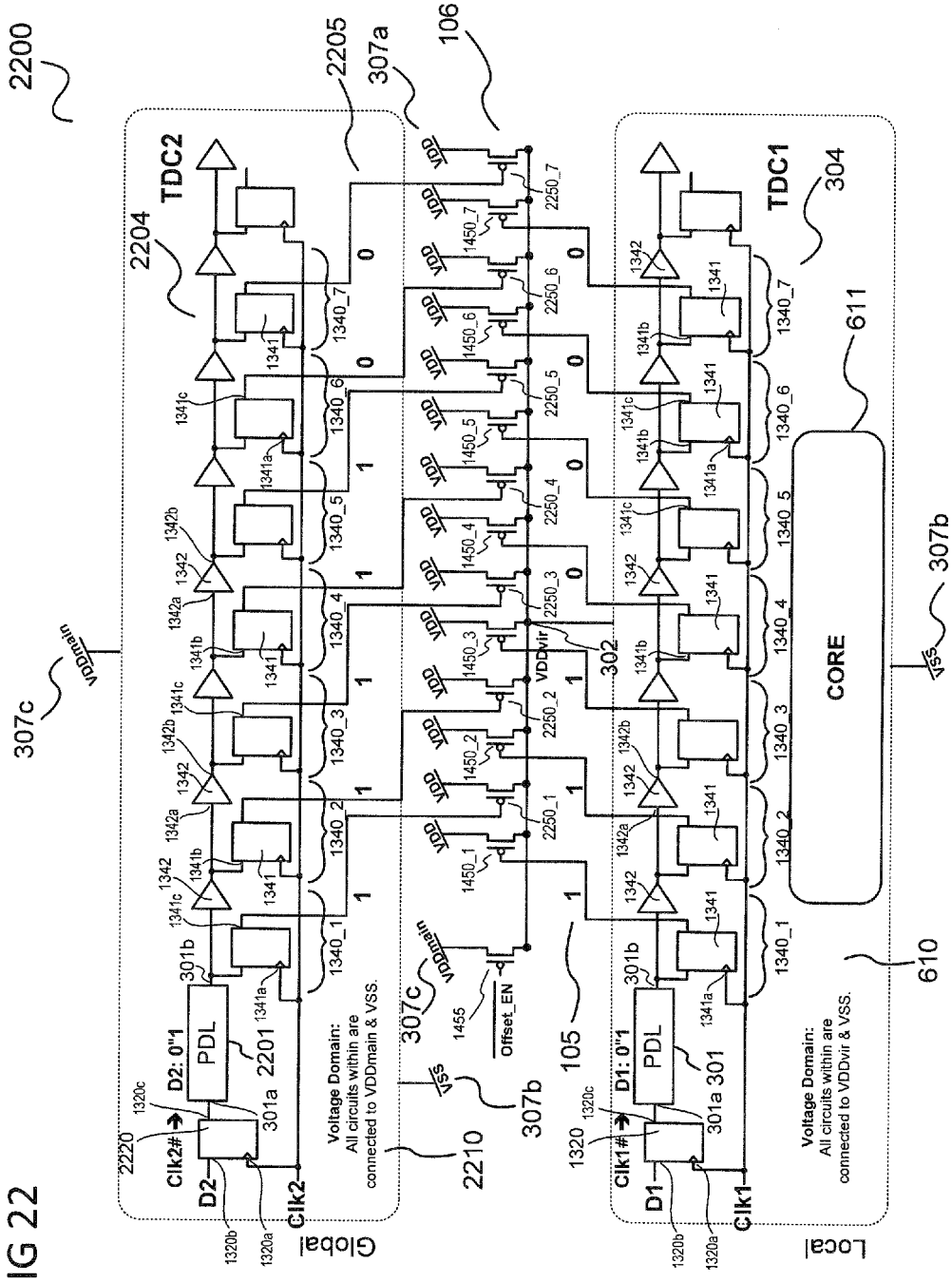
FIG. 22 shows a circuit arrangement according to another aspect of this disclosure.

FIG. 22 shows a circuit arrangement 2200 according to another aspect of this disclosure. The circuit arrangement 2200 allows for separate compensation of global and local environmental variations using a hierarchical circuit topology, as will be described below.

The circuit arrangement 2200 is to some degree similar to the circuit arrangement 1400 shown in FIG. 14, and identical reference signs denote the same or similar elements as there and will not be described in detail again here. Reference is made to the description above.

The circuit arrangement 2200 differs from the circuit arrangement 1400 in that the circuit arrangement 2200 includes an additional delay line, in this example an additional programmable delay line (PDL) 2201, and an additional time-to-digital converter (TDC) 2204 coupled to the additional PDL 2201. The additional PDL 2201 and the additional TDC 2204 may reside in a common voltage domain 2210 defined by the upper supply voltage VDDmain provided by the third power supply 307*c* and the lower supply voltage VSS provided by the second power supply 307*b*. In other words, the additional PDL 2201 and additional TDC 2204 may be connected to VDDmain and VSS. Illustratively, the circuit arrangement 2200 may have two common voltage domains, i.e. the (first) common voltage domain 610 defined by VDDvir and VSS, in which the PDL 301, the TDC 304 (labelled "TDC1" in FIG. 22) and the core circuit 610 may be located, and a (second) common voltage domain 2210 defined by VDDmain and VSS, in which the additional PDL 2201 and the additional TDC 2204 (labelled "TDC2" in FIG. 22) may be located.

The additional PDL 2201 may be configured similarly or identically to the PDL 301. In particular, the additional PDL 2201 may be configured such that a (nominal) signal delay of the additional PDL 2201 is the same or substantially the same as a (nominal) signal delay of the PDL 301. For example, a signal propagation path in the additional PDL 2201 may be configured such that its (nominal) signal delay is identical to the (nominal) signal delay of the signal propagation path in the PDL 301. For example, the additional PDL 2201's signal propagation path may be identical to the PDL 301's signal propagation path (for example, the additional PDL 2201 and PDL 301 may have the same delay elements). However, the additional PDL 2201's signal propagation path may also be different from the PDL 301's signal propagation path, while the (nominal) delay times of both PDLs are the same or substantially the same. Furthermore, it may also be possible, that the PDLs 301 and 2201 have different (nominal) delay times.

A signal input 301*a* of the additional PDL 2201 may be coupled to a signal output 1320*c* of an additional register 2220. The additional register 2220 may further include a first signal input 1320*a* (herein also referred to as clock signal input) and a second signal input 1320*b* (herein also referred to as data signal input).

In the circuit arrangement 2200, a first clock signal CLK1 may be coupled to the clock signal input 1320*a* of the register 1320 and a second clock signal CLK2 may be coupled to the clock signal input 1320*a* of the additional register 2220, and a first data signal D1 may be coupled to the data signal input 1320*b* of the register 1320 and a second data signal D2 may be coupled to the data signal input 1320*b* of the additional register 2220, as shown.

The first clock signal CLK1 and the second clock signal CLK2 may, for example, have the same frequency, or may be the same signal. Alternatively, the clock signals CLK1, CLK2 may be different signals. For example, CLK1 and CLK2 may have different frequencies.

The first data signal D1 and the second data signal D2 may be the same signal. Alternatively, the data signals D1, D2 may be different.

A delay of the additional programmable delay line (PDL) 2201 may be measured by the additional time-to-digital converter (TDC) 2204 and may be converted to an additional digital switch array control signal 2205, which may be used to control a plurality of additional switches 2250_1, 2250_2, . . . , 2250_*m* of the switch array 106, as will be described below.

The additional TDC 2204 includes a plurality of stages 1340_1, 1340_2, . . . , 1340_*m* coupled in series, wherein each of the stages 1340_1, 1340_2, . . . , 1340_*m* includes a sampling register 1341 and a buffer gate 1342, similar to the TDC 304. Seven stages 1340_1, 1340_2, . . . , 1340_7 (i.e. m=7) are shown as an example. However, the number m of stages may be different from seven. In general, m may be equal to or greater than one, i.e. m≥1. Furthermore, the number of stages in the additional TDC 2204 may be equal to or may be different from the number of stages in the TDC 304, i.e. m=n or m≠n. A first signal input 1341*a* (also referred to as clock signal input) of the sampling register 1341 of each stage may be coupled to the second clock signal CLK2, as shown. A second signal input 1341*b* (also referred to as data signal input) of the sampling register 1341 and a signal input 1342*a* of the buffer gate 1342 of each stage 1340_*k* (k=1, 2, . . . , m) may be coupled to a signal output 1342*b* of the buffer gate 1342 of the previous stage 1340_*k*−1, or to a signal output 301*b* of the additional PDL 2201 in case of the first stage 1340_1, as shown.

The sampling registers 1341 of the stages 1340_1, 1340_2, . . . , 1340_*m* of the additional TDC 2204 are coupled (e.g. directly coupled) to the switch array 106 including a plurality of additional switches 2250_1, 2250_2, . . . , 2250_*m*. In particular, a signal output 1341*c* of a sampling register 1341 of each stage 1340_*k* of the additional TDC 2204 may be connected to a control terminal of a respective additional switch 2250_*k* of the plurality of additional switches 2250_1, 2250_2, . . . , 2250_*m*. For example, a signal output 1341*c* of the register 1341 of the first stage 1340_1 of the additional TDC 2204 may be coupled to a control terminal of a first additional switch 2250_1 of the switch array 106, a signal output 1341*c* of the register 1341 of the second stage 1340_2 of the additional TDC 2204 may be coupled to a control terminal of a second additional switch 2250_2 of the switch array 106, etc., . . . , and a signal output 1341*c* of the register 1341 of the m-th stage 1340_*m* of the additional TDC 2204 may be coupled to a control terminal of an m-th additional switch 2250_*m* of the switch array 106, . . . , etc., as shown.

The additional switches 2250_1, 2250_2, . . . , 2250_*m* may be implemented as transistors, e.g. as PMOS transistors (as shown). Alternatively, one or more of the additional switches 2250_1, 2250_2, . . . , 2250_*m* may be implemented differently.

The additional TDC 2204 may provide an additional digital switch array control signal (digital output word) 2205 having a thermometer code (e.g. a number of digital "1"s followed by a number of digital "0"s), in a similar manner as the TDC 304. The number of open and closed switches of the additional switches 2250_1, 2250_2, . . . , 2250_*m* in the switch array 106 corresponds to the number of ones and zeroes in the additional digital output word 2205. For example, in the example shown in FIG. 22 the additional TDC 2204 provides as additional digital output word 2205 the sequence "1111100 . . . " (i.e. the first to fifth bits of the additional output word 2205 are "1" while the remaining bits are "0") to the switch array 106, and accordingly, the first to fifth additional switches 2250_1, 2250_2, 2250_3, 2250_4, 2250_5 of the switch array 106 may be opened while the remaining additional switches 2250_6, . . . , 2250_m of the switch array 106 may be closed by means of the additional digital output word 2205.

If the delay of the additional PDL 2201 increases, the number of zeroes in the sampling registers 1341 of the additional TDC 2204 increases, leading to a higher number of additional switches in the switch array 106 which connect VDD with VDDvir. Illustratively, the "1" to "0" transition in the additional digital output word 2205 will shift to the left and the number of closed switches of the additional switches 2250_1, 2250_2, . . . , 2250_m in the switch array 106 will increase accordingly. Hence, the amount of injected charge from VDD to VDDvir may be increased, allowing a higher current flowing from VDD to VDDvir. Thus, VDDvir may slightly increase.

If the delay of the additional PDL 2201 decreases, the number of zeroes in the sampling registers 1341 of the additional TDC 2204 decreases, leading to a smaller number of additional switches 2250_1, 2250_2, . . . , 2250_m which connect VDD with VDDvir. Illustratively, the "1" to "0" transition in the additional digital output word 2205 will shift to the right and the number of open switches of the additional switches 2250_1, 2250_2, . . . , 2250_m in the switch array 106 will increase accordingly. Hence, the amount of injected charge from VDD to VDDvir may be decreased, reducing the current flowing from VDD to VDDvir. Thus, VDDvir may slightly decrease.

Illustratively, FIG. 22 shows an example for a circuit arrangement where performance regulation is split into independent compensation of locally and globally induced delay variations.

Since dynamic delay variations may be caused by global environmental variations (e.g. voltage regulator) or local environmental variations (e.g. voltage drop due to local electrical load variation), a hierarchical topology can split compensation of local and global variations sources by split measurement. To this end, at least two measurement circuits (indicated by "Global" and "Local" in FIG. 22), each including a delay line (e.g. PDL) and a TDC, may be implemented. The one ("Global") compensating global variations is connected to VDDmain and VSS, the other one ("Local") is connected to VDDvir and VSS. For instance, local voltage drops within the protected voltage domain (i.e. voltage domain 610 defined by VDDvir and VSS) are now compensated by the switches 1450_k (k=1, 2, . . . , n) opened and closed by TDC 304, only, while the switches 2250_k (k=1, 2, . . . , m) connected to outputs of the additional TDC 2204 are opened and closed in case of global delay variations, only.

Since time-scale of global and local variations may differ (for example, global variations may have a lower frequency than local variations), the requirements concerning regulation and measurement resolution may also differ, e.g. the measurement circuits may be operated at different clock frequencies (i.e. the clock signals CLK1 and CLK2 may have different frequencies, as described above).

Figure 23:
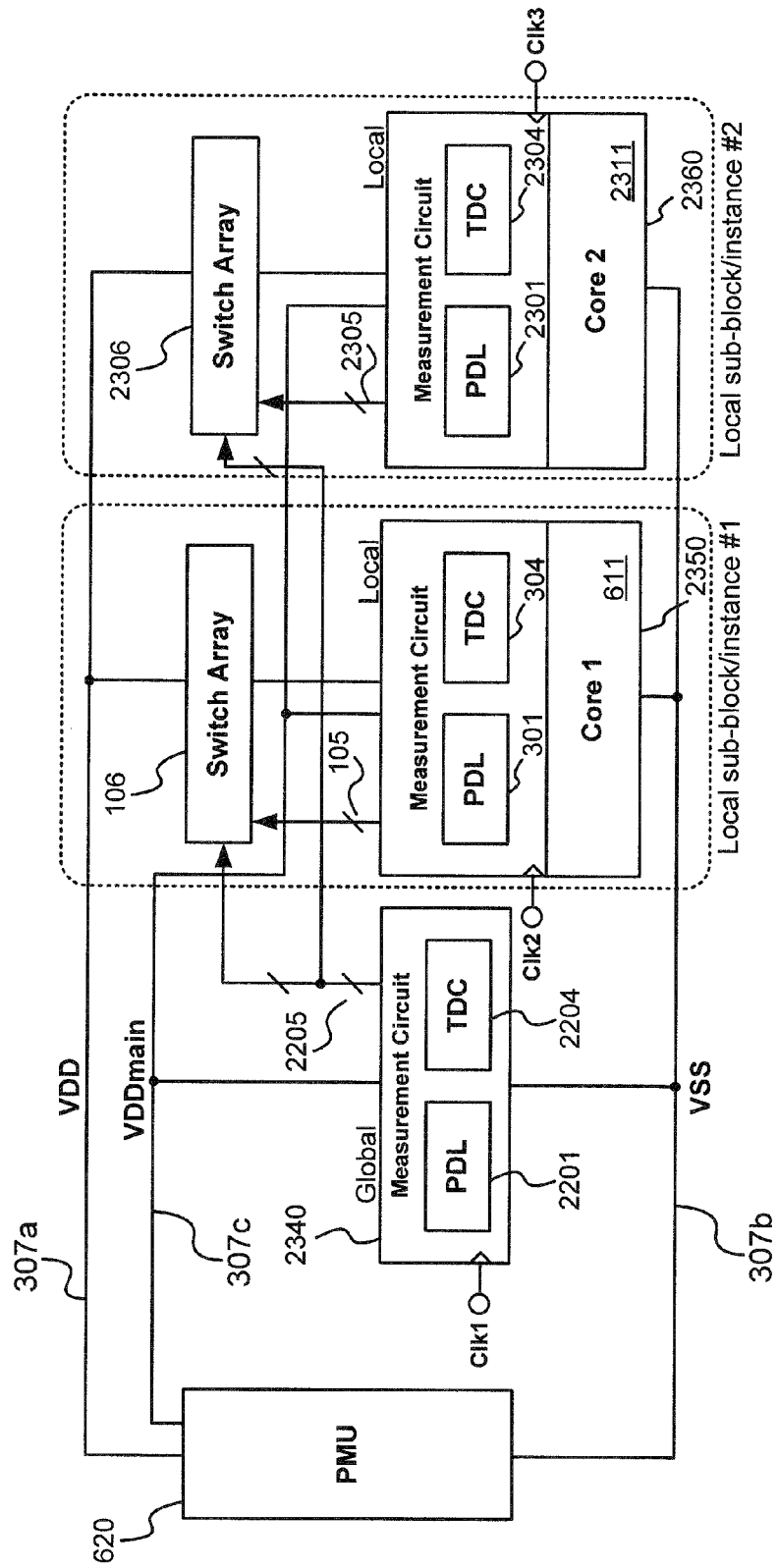
FIG. 23 shows a circuit arrangement according to another aspect of this disclosure.

FIG. 23 shows a circuit arrangement 2300 according to another aspect of this disclosure. The circuit arrangement 2300 is to some degree similar to the circuit arrangement 2200 shown in FIG. 22, and identical reference signs denote the same or similar elements as there and will not be described in detail again here. Reference is made to the description above.

Illustratively, FIG. 23 shows an exemplary illustration of a hierarchical regulation concept implementation.

Block 2340 (labelled "Global") contains a measurement circuit (including PDL 2201 and TDC 2204) connected to VDDmain and VSS and monitoring global dynamic delay variations caused by varying operating temperatures as well as variations on global power supply distributed from the PMU 620.

Blocks 2350 and 2360 (each labelled "Local") contain measurement circuits (including PDL 301 and TDC 304 (block 2350), and PDL 2301 and TDC 2304 (block 2360), respectively) monitoring the local power supply of respective sub-circuits 611 and 2311, e.g. microprocessor-cores on multi- and many-core designs. Any locally occurring delay variation may be sensed by the local measurement circuits.

Local as well as global measurement circuits are connected to the switch arrays 106, 2306 and provide digital switch array control signals (digital output words) 105, 2205 and 2305 to enable the compensation of delay variations adapting effective supply voltage VDDvir seen by the devices of blocks 2350 and 2360.

The clock frequencies of the measurement circuits (i.e. frequencies of clock signals CLK1, CLK2, CLK3 shown in FIG. 23) may be the same or may be different.

Figure 24:
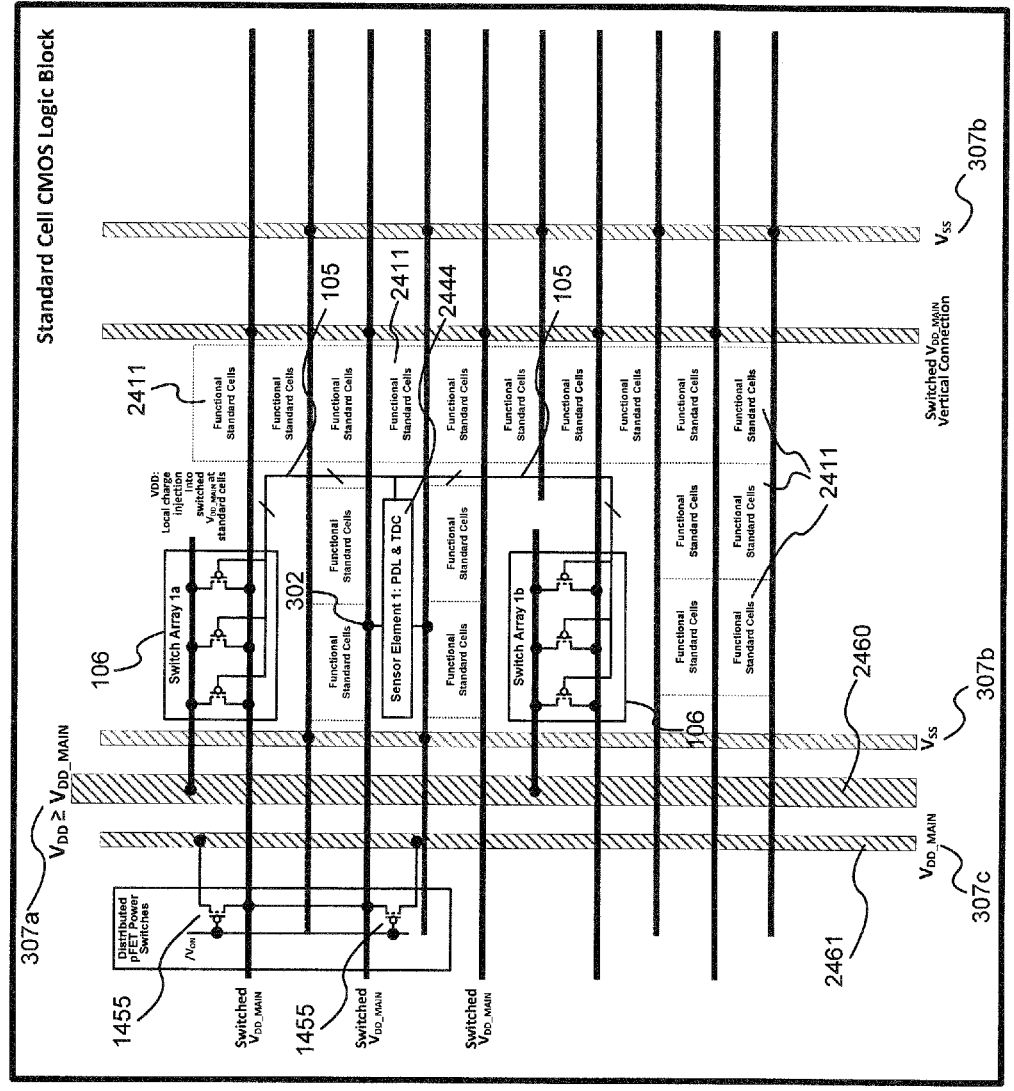
FIG. 24 shows a circuit arrangement according to another aspect of this disclosure.

FIG. 24 shows a circuit arrangement 2400 according to another aspect of this disclosure.

Illustratively, FIG. 24 shows a layout view of a possible implementation of the regulation concept described herein into a standard cell CMOS logic block. In addition to a common power switch concept (implemented by distributed PFET power switches 1455), the circuit arrangement 2400 includes locally distributed switch arrays 106, which may be controlled by different or, as shown in FIG. 24, by the same measurement circuit (sensor element) 2444. The measurement circuit(s) 2444 may include a PDL and a TDC coupled to the PDL, and may provide a digital switch array control signal 105 based on the PDL's signal propagation delay. An additional power rail 2460 for at least one additional power supply 307a (here VDD) may be provided and may be connected to the standard power rail 2461 for the main power supply 307c (VDDmain).

In case of increased propagation delay in the PDL of the measurement circuit 2444, the number of opened switches of the switch arrays 106 rises, which results in a charge injection from VDD to VDDmain. The switch arrays 106 can be distributed among functional standard cells 2411 all over the chip. The functional standard cells 2411 may reside in the same voltage domain as the measurement circuit 2444 and may illustratively represent circuits to be kept at constant performance. The measurement circuit 2444 is connected to VDDmain (via the PFET power switches 1455), and to VDD (via the switches of the switch arrays 106). Thus, any charge injection from VDD may be seen immediately by the PDL and TDC of the measurement circuit 2444, i.e. there may be an instantaneous feedback from charge injection to delay measurement within at least one clock cycle enabling a fast adaptation of circuit speed according to previously measured delay changes.

FIG. 25 shows a circuit arrangement 2500 according to another aspect of this disclosure.

The circuit arrangement 2500 is to some degree similar to the circuit arrangement 300 shown in FIG. 3, and identical reference signs denote the same or similar elements as there and will not be described in detail again here. Reference is made to the description above.

The circuit arrangement 2500 includes a sensor circuit 2544. The sensor circuit 2544 may include an oscillator 2501 and a detecting circuit 2504 coupled to the oscillator 2501.

The oscillator 2501 may, for example, be configured as a ring oscillator.

The detecting circuit 2504 may, for example, include or be configured as frequency determination circuit.

The sensor circuit 2544 may further include a signal input 2544a that may be coupled to the clock signal input 308 of the circuit arrangement 2500.

The sensor circuit 2544 may further include a signal output 2544b. A digital switch array control signal 105 may be provided at the signal output 2544b of the sensor circuit 2544, as shown.

The sensor circuit 2544 may further include a first power supply input 2544c that may be coupled to the first common power supply node 302. Thus, power may be supplied to the sensor circuit 2544, for example to the oscillator 2501 (e.g. ring oscillator) and to the detecting circuit 2504 (e.g. frequency determination circuit), via the first common power supply node 302. A voltage level at the first common power supply node 302 is denoted as VDDvir, as shown in FIG. 25. The voltage level VDDvir at the first common power supply node 302 may illustratively represent a virtual upper supply voltage (herein also referred to as effective upper supply voltage).

The sensor circuit 2544 may further include a second power supply input 2544d that may be coupled to a second power supply 307b via a second common power supply node 302'. The second power supply 307b may be a lower power supply providing e.g. a lower supply voltage VSS as shown in FIG. 25. Illustratively, the sensor circuit 2544 may be coupled between a virtual upper supply voltage VDDvir at the first common power supply node 302 and a lower supply voltage VSS at the second common power supply node 302'.

The oscillator 2501 is configured to provide a signal (indicated by arrow 2503 in FIG. 25). The signal 2503 may be provided at a signal output of the oscillator 2501.

The signal 2503 provided by the oscillator 2501 may be an oscillating signal. An oscillation frequency of the signal 2503 may be dependent on power supply via the first common power supply node 302. For example, the oscillation frequency of the signal 2503 may be dependent on the voltage difference VDDvir–VSS. In other words, the oscillation frequency may be influenced or controlled by the power supply to the oscillator 2501 via the first common power supply node 302. For example, according to one aspect of this disclosure, increasing the voltage level VDDvir at the first common power supply node 302 (or, increasing charge injection via the first common power supply node 302) may lead to an increase in the oscillation frequency of the signal 2503, while decreasing the voltage level VDDvir (or, decreasing the charge injection via the first common power supply node 302) may lead to a decrease in the oscillation frequency of the signal 2503.

Thus, in case that the oscillation frequency of the oscillator 2501's signal 2503 deviates from a predetermined or nominal value, e.g. due to process and environmental variations (PVT), the voltage level VDDvir at the first common power supply node 302 (or, charge injection via the first common power supply node 302) may be controlled such that the oscillation frequency of the oscillator 2501 returns to the predetermined value. For example, if the oscillation frequency of the signal 2503 increases above the predetermined value, the voltage level VDDvir at the first common power supply node 302 (or, charge injection via the first common power supply node 302) may be decreased to decrease the oscillation frequency again. On the other hand, if the oscillation frequency of the oscillator 2501's signal 2503 decreases below the predetermined value, the voltage level VDDvir at the first common power supply node 302 (or, charge injection via the first common power supply node 302) may be increased to increase the oscillation frequency again.

Control of the voltage level VDDvir at the first common power supply node 302 (or, of charge injection via the first common power supply node 302) may be achieved by means of a switch array 106 coupled between the first common power supply node 302 and a first power supply 307a. The first power supply 307a may be an upper power supply. The first power supply 307a may provide, for example, at least one upper supply voltage VDD, as shown. Although not shown in FIG. 25, the first power supply 307a may provide a plurality of upper supply voltages VDD, for example n upper supply voltages VDD, wherein each of the n upper supply voltages VDD may be coupled to a respective one of n switches of the switch array 106, similarly as described herein above in connection with other circuit arrangements.

The circuit arrangement 2500 further includes the detecting circuit 2504 coupled to the oscillator 2501. The detecting circuit 2504 may, for example, be configured as a frequency determination circuit. The detecting circuit 2504 may be coupled to the signal output of the oscillator 2501.

The detecting circuit 2504 may be configured to detect the signal 2503 provided by the oscillator 2501 and to provide a digital switch array control signal 105 dependent on the oscillation frequency of the signal 2503.

Illustratively, the detecting circuit 2504 may be configured to measure the oscillation frequency of the oscillating signal 2503 provided by the oscillator 2501, and to translate the measured frequency into the digital switch array control signal 105.

The digital switch array control signal 105 may be configured as a digital output word containing p bits (p being a positive integer, i.e. $p \geq 1$).

The circuit arrangement 2500 further includes a switch array 106 coupled between the first common power supply node 302 and the first power supply 307a.

The switch array 106 is configured to control the power supply via the first common power supply node 302 dependent on the digital switch array control signal 105. To this end, the digital switch array control signal 105 (p bit digital output word) may be coupled to at least one control signal input 116 of the switch array 106, as shown.

The p bits of the digital switch array control signal 105 provided by the detecting circuit 2504 may be a binary code representation corresponding to the oscillation frequency of the signal 2503 provided by the oscillator 2501. In other words, it may be possible that an i-th bit ($1 \leq i \leq p$) of the p bits controls $2^{i-1}$ switches of the switch array 106, wherein the switches controlled by two different bits of the p bits are also different. That is, a first bit of the p bits of the digital switch array control signal 105 may control $2^0=1$ switch of the switch array 106, a second bit of the p bits may control $2^1=2$ switches that are different from the switch controlled by the first bit, a third bit of the p bits may control $2^2=4$ switches that are different from the switches controlled by the first and second bits, a fourth bit of the p bits may control $2^3=8$ switches that are different from the switches controlled by the first to third bits, etc., . . . , and a p-th bit of the p bits may control $2^{p-1}$ switches that are different from the switches controlled by the first to (p–1)-th bits. To this end, the individual bits of the digital switch array control signal 105 may in each case be coupled to a respective number of switches of the switch array 106.

It is to be noted that the term "binary code representation corresponding to the oscillation frequency" should not be understood as "binary coding of the oscillator frequency". In other words, the bit sequence of the digital switch array control signal 105 will, in general, not represent the binary coding of the actual value of the oscillator frequency, but will represent a digital value based on the value of the oscillator frequency.

Figure 26:
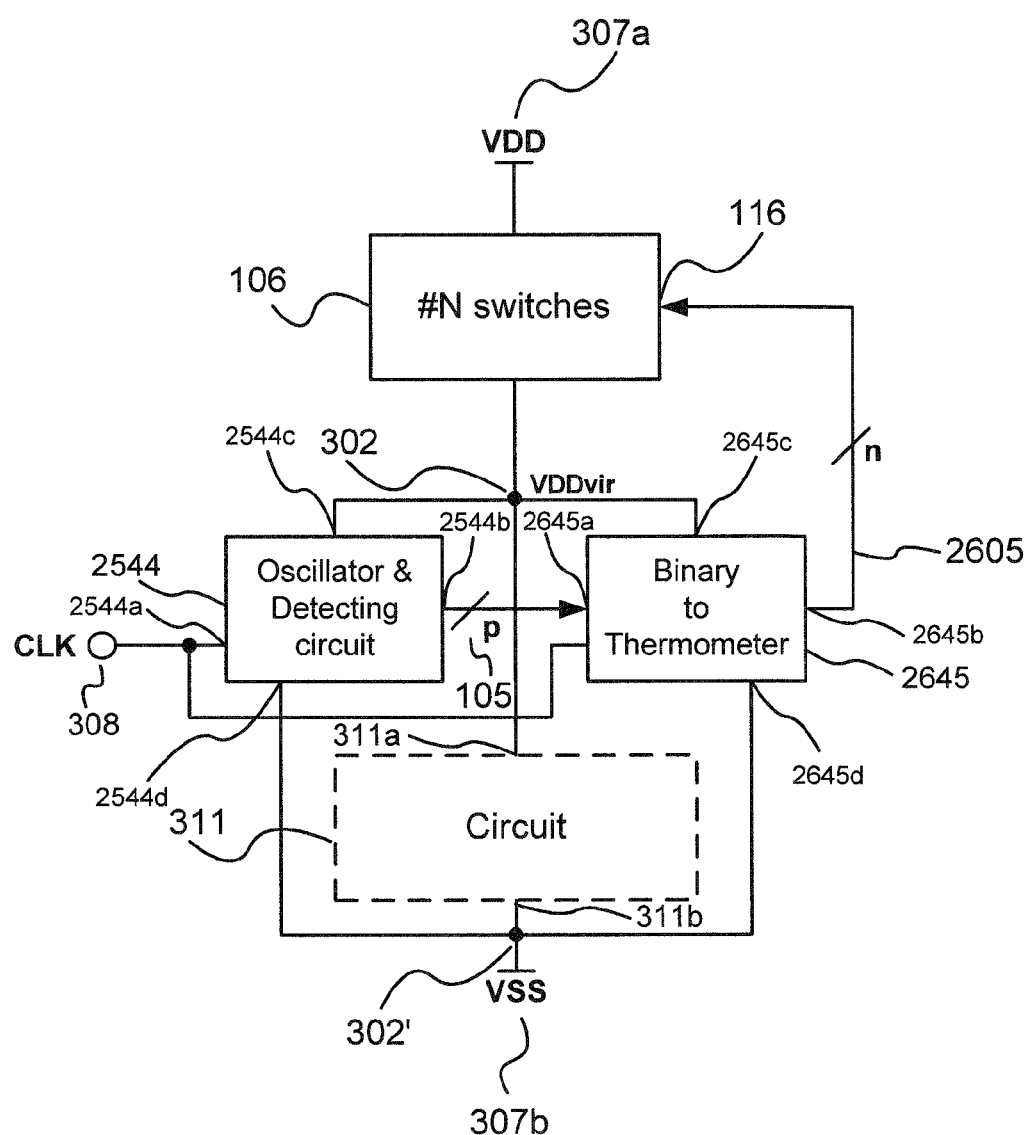
FIG. 26 shows a circuit arrangement according to another aspect of this disclosure.

Alternatively, it may be possible to convert a digital switch array control signal 105 having a binary code representation into a control signal having a thermometer code representation (using e.g. a binary to thermometer code converting circuit, as shown in FIG. 26), and provide the control signal having the thermometer code representation to the switch array 106. In this case, the individual bits of the control signal with the thermometer code representation may be coupled to the switches of the switch array 106 in a similar manner as described herein above in connection with various circuit arrangements.

The circuit arrangement 2500 may further include a circuit 311 to be operated at constant performance (e.g. a core circuit). A first power supply input 311a of the circuit 311 may be coupled to the first common power supply node 302, and a second power supply input 311b of the circuit 311 may be coupled to the lower supply voltage VSS via the second common power supply node 302'. Illustratively, the circuit 311 may be coupled between the virtual upper supply voltage VDDvir at the first common power supply node 302 and the lower supply voltage VSS at the second common power supply node 302'.

The circuit 311 may reside in the same voltage domain as the sensor circuit 2544. That is, the circuit 311, or elements or structures of the circuit 311, may be fed with the same supply voltages as the sensor circuit 2544, i.e. with the virtual upper supply voltage VDDvir via the first common power supply node 302 and the lower supply voltage VSS via the second common power supply node 302', as shown in FIG. 25.

The circuit arrangement 2500 illustratively differs from the circuit arrangement 300 of FIG. 3 in that the delay line 301 and the time-to-digital converter (TDC) 304 of the circuit arrangement 300 have been replaced by the sensor circuit 2544, including the oscillator 2501 (e.g. ring oscillator) and the detecting circuit 2504 (e.g. frequency determination circuit), in the circuit arrangement 2500. Instead of measuring a signal delay of a delay line, as described above in connection with various circuit arrangements, an oscillation frequency of the oscillator 2501 may be measured in the circuit arrangement 2500 of FIG. 25, and based on the measured oscillation frequency, the digital switch array control signal 105 may be provided to the switch array 106 to control power supply via the common power supply node 302. Thus, a feedback loop may be implemented.

FIG. 26 shows a circuit arrangement 2600 according to another aspect of this disclosure.

The circuit arrangement 2600 is to some degree similar to the circuit arrangement 2500 shown in FIG. 25, and identical reference signs denote the same or similar elements as there and will not be described in detail again here. Reference is made to the description above.

The circuit arrangement 2600 differs from the circuit arrangement 2500 in that the circuit arrangement 2600 additionally includes a binary to thermometer code converter (herein also referred to as B2T converter or, short, converter) 2645 that is coupled between the sensor circuit 2544 and the switch array 106. The converter 2645 may include a signal input 2645a that may be coupled to the signal output 2544b of the sensor circuit 2544, and a signal output 2645b that may be coupled to the at least one control signal input 116 of the switch array 106. The converter 2645 may further include a first power supply input 2645c that may be coupled to the first common power supply node 302, and a second power supply input 2645d that may be coupled to the second power supply 307b via the second common power supply node 302'.

The sensor circuit 2544 may be configured in a similar manner as in the circuit arrangement 2500 and may include the oscillator 2501 (e.g. ring oscillator) and the detecting circuit 2504 (e.g. frequency determination circuit) coupled to the oscillator 2501 and detecting the signal 2503 provided by the oscillator 2501. The detecting circuit 2504 may provide the digital switch array control signal 105 dependent on the measured oscillation frequency of the signal 2503 provided by the oscillator 2501.

In the circuit arrangement 2600, the digital switch array control signal 105 may be a digital output word containing p bits ($p \geq 1$), wherein the p bits may be a binary code representation corresponding to the measured frequency. The binary to thermometer code converter 2645 may detect the digital switch array control signal 105 (p bit digital output word) and convert the signal 105 into a control signal 2605 containing n bits ($n \geq 1$), wherein the n bits may be a thermometer code representation corresponding to the binary code representation of the digital switch array control signal 105. The control signal 2605 having the thermometer code then may be used to control the switches of the switch array 106.

Thus, in addition to the replacement of the delay line and TDC, as in the circuit arrangement 2500 of FIG. 25, the circuit arrangement 2600 includes a binary to thermometer code converter 2645 for converting the p bit digital output word 105 (provided by the detecting circuit 2504 and having a binary code) into the n bit digital control signal 2605 to control the switches of the switch array 106.

As will be readily understood, a similar replacement of the delay line and the TDC by an oscillator (e.g. ring oscillator) and a detecting circuit (e.g. frequency determination circuit), as shown in FIG. 25, and possibly provision of a binary to thermometer code converter, as shown in FIG. 26, may be made in various other circuit arrangements described herein, for example in the circuit arrangements shown in FIGS. 4, 5, 6A, 6B, 10, and 12 to 24.

Figure 27A:
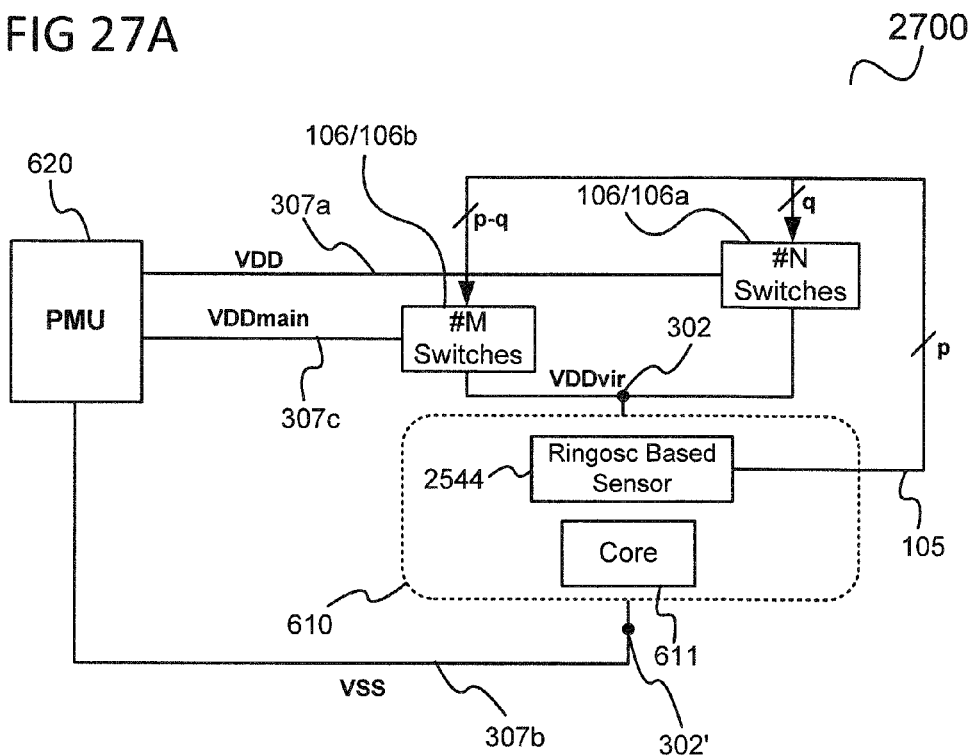
FIG. 27A shows a circuit arrangement according to another aspect of this disclosure.
Figure 27B:
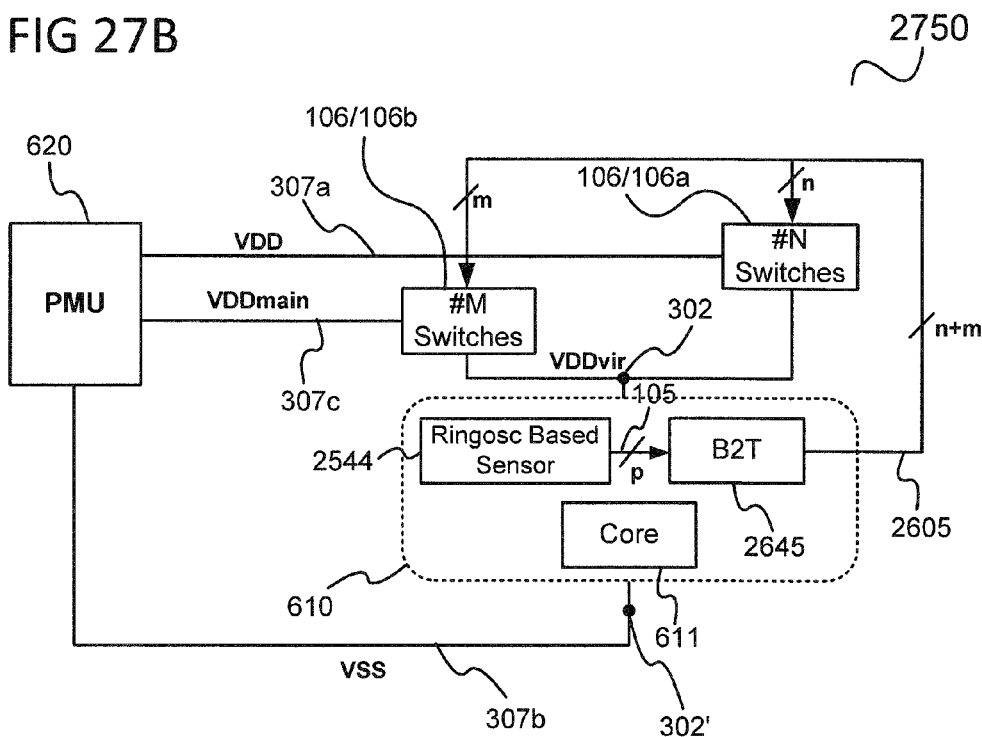
FIG. 27B shows a circuit arrangement according to another aspect of this disclosure.

Further examples for circuit arrangements that may be obtained by the above-described replacement, are shown in FIG. 27A and FIG. 27B.

FIG. 27A shows a circuit arrangement 2700 according to another aspect of this disclosure. The circuit arrangement 2700 is based on the circuit arrangement 750 shown in FIG. 7B, wherein the delay line 301 and TDC 304 are replaced by a ring oscillator based sensor 2544, as described herein above. The ring oscillator based sensor 2544 may include a ring oscillator that provides an oscillating signal, and a detecting circuit (e.g. frequency determination circuit) that provides a digital switch array control signal 105 dependent on the oscillation frequency of the oscillator's signal. The digital switch array control signal 105 may be a p bit digital output word and may have a binary code. The digital switch array control signal 105 is provided to the switch array 106, wherein, for example, q bits ($1 \leq q < p$) of the p bits may be used to control the switches of the first part 106a of the switch array 106 and the remaining p−q bits of the p bits may be used to control the switches of the second part 106b of the switch array 106, as shown.

FIG. 27B shows a circuit arrangement 2750 according to another aspect of this disclosure.

The circuit arrangement 2750 is based on the circuit arrangement 2700 of FIG. 27A and additionally includes a binary to thermometer code (B2T) converter 2645 coupled between the ring oscillator based sensor 2544 and the switch array 106. The converter 2645 may be configured to convert the p bit digital switch array control signal 105 provided by the detecting circuit of the ring oscillator based sensor 2544 into a control signal 2605 having n+m bits and a thermometer code. The control signal 2605 having the thermometer code is then provided to the switch array 106, wherein, for example, n bits of the n+m bits may be used to control the switches of the first part 106a of the switch array 106 and the remaining m bits of the n+m bits may be used to control the switches of the second part 106b of the switch array 106, as shown.

FIG. 28A and FIG. 28B show exemplary implementations of a ring oscillator based sensor for use in circuit arrangements according to various aspects of this disclosure.

FIG. 28A is a schematic view 2800 illustrating an exemplary implementation of a VDD sensor that is based on measurement of a ring oscillator frequency.

The VDD sensor includes a ring oscillator 2501. The ring oscillator 2501 may include a signal input 2501a ("EN"). The ring oscillator 2501 may be enabled by means of an enable signal provided at the signal input 2501a. The ring oscillator 2501 may further include a signal output 2501b. The ring oscillator 2501 may provide an oscillating signal 2503 at the signal output 2501b. The ring oscillator 2501 may further include a first power supply input 2501c that may be coupled to the virtual upper supply voltage VDDvir at the common power supply node 302. The ring oscillator 2501 may further include a second power supply input 2501d that may be coupled to the lower supply voltage VSS provided by the second power supply 307b.

The VDD sensor may further include a first counter 2820 ("Counter Oscillator (CO)") coupled to the ring oscillator 2501. The first counter 2820 may include a first signal input 2820a ("EN") that may be coupled to a first signal input 2835a of the VDD sensor. The first counter 2820 may be enabled by means of an enable signal provided at the first signal input 2835a of the VDD sensor. The first counter 2820 may further include a second signal input 2820b ("RingoIn") that may be coupled to the signal output 2501b of the ring oscillator 2501. The first counter 2820 may detect the oscillating signal 2503 of the ring oscillator 2501 using the second signal input 2820b. The first counter 2820 may further include a third signal input 2820c ("Reset") that may be coupled to a third signal input 2835c of the VDD sensor. The first counter 2820 may further include a signal output 2820d that may be coupled to the switch array 106 (not shown, see e.g. FIG. 25)), which may be coupled between the common power supply node 302 and the first power supply 302a providing the upper supply voltage VDD, as described herein above. The first counter 2820 may provide the digital switch array control signal 105 at the signal output 2820d to control the switch(es) of the switch array 106.

The VDD sensor may further include a second counter 2830 ("Counter Time Reference (CTR)"). The second counter 2830 may include a first signal input 2830a ("EN") that may be coupled to the first signal input 2835a of the VDD sensor. The second counter 2830 may further include a second signal input 2830b ("TimeRef") that may be coupled to a second signal input 2835b of the VDD sensor. The second counter 2830 may further include a third signal input 2830c ("Reset") that may be coupled to the third signal input 2835c of the VDD sensor. The second counter 2830 may further include a signal output 2830d ("Overflow"). An overflow signal may be provided by the second counter 2830 at its signal output 2830d.

The VDD sensor may further include an XOR logic gate 2840 that may be coupled between the second counter 2830 and the ring oscillator 2501. The XOR logic gate 2840 may include a first signal input 2840a that may be coupled to the first signal input 2835a of the VDD sensor. The XOR logic gate 2840 may further include a second signal input 2840b that may be coupled to the signal output 2830d ("Overflow") of the second counter 2830.

The ring oscillator 2501, the first counter 2820 ("Counter Oscillator (CO)") and the second counter 2830 ("Counter Time Reference (CTR)") may be started (enabled) by means of an enable signal having a digital value "one" (EN="1") provided at the first signal input 2835a of the VDD sensor.

As soon as the second counter 2830 ("Counter Time Reference (CTR)") is started it may count a fixed number of cycles of a time reference "TimeRef". As soon as the second counter 2830 flows over, an overflow signal having a digital value "one" (Overflow="1") may be provided at the signal output 2830d of the second counter 2830, and thus an output signal having a digital value "zero" may be provided at the signal output 2840c of the XOR logic gate 2840 so that the ring oscillator 2501 may be stopped (disabled).

The first counter 2820 ("Counter Oscillator (CO)") may count the oscillations of the ring oscillator 2501 during this fixed time reference. Since the ring oscillator 2501 is operated with the supply voltage VDDvir, which may vary e.g. due to power supply variations in the power supply grid, the count after each measurement may vary according to the power variations in the power supply grid. In other words, the number of ring oscillator oscillations during the fixed time reference may depend on power supply to the ring oscillator 2501. For example, the number of ring oscillator oscillations during the fixed time reference (i.e. the oscillator frequency) may increase with an increase in VDDvir, and may decrease with a decrease in VDDvir.

The first counter 2820 and the second counter 2830 may be reset for a next measurement by providing a reset signal at the third signal input 2835c of the VDD sensor.

FIG. 28B is a schematic view 2850 illustrating another exemplary implementation of a VDD sensor that is based on measurement of a ring oscillator frequency.

The VDD sensor of FIG. 28B is similar to the VDD sensor of FIG. 28A and additionally includes a binary to thermometer code converter 2645 coupled between the first counter 2820 and the switch array 106. The converter 2645 may include a signal input 2645a that may be coupled to the signal output 2820d of the first counter 2820, to receive the digital switch array control signal 105 provided by the first counter 2820. The converter 2645 may further include a signal output 2645b that may be coupled to the switch array 106. The converter 2645 may convert the digital switch array control signal 105 of the first counter 2820, which may have a binary code, into a control signal 2605 having a thermometer code, and provide the control signal 2605 at the signal output 2645b to control the switches of the switch array 106.

Figure 29:
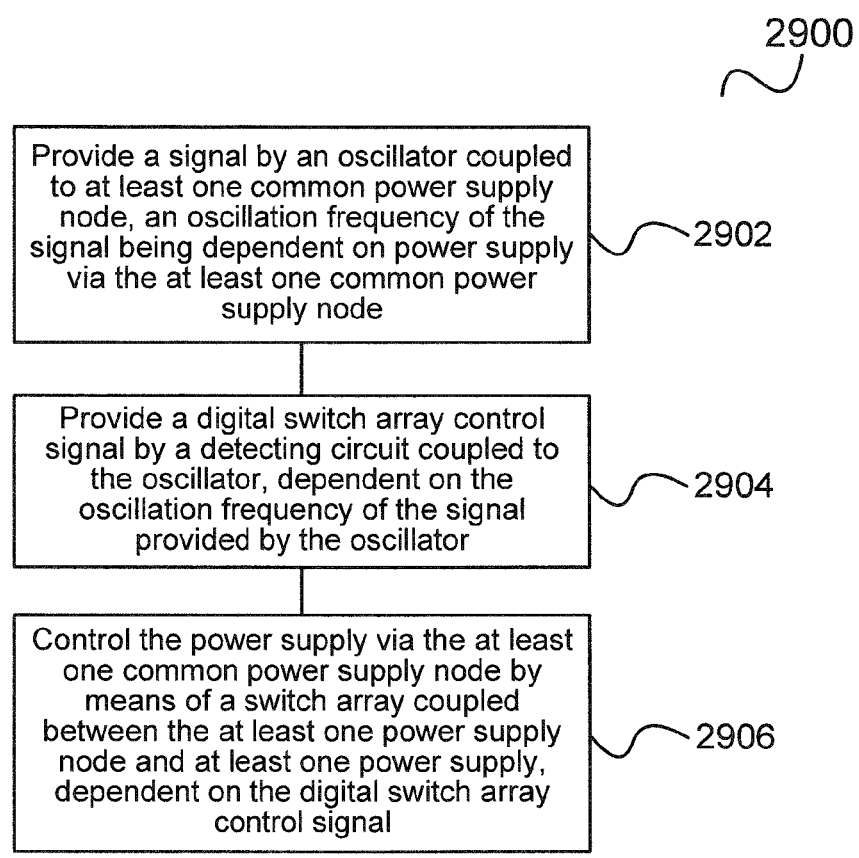
FIG. 29 shows a method for operating a circuit arrangement according to another aspect of this disclosure.
Figure 30:
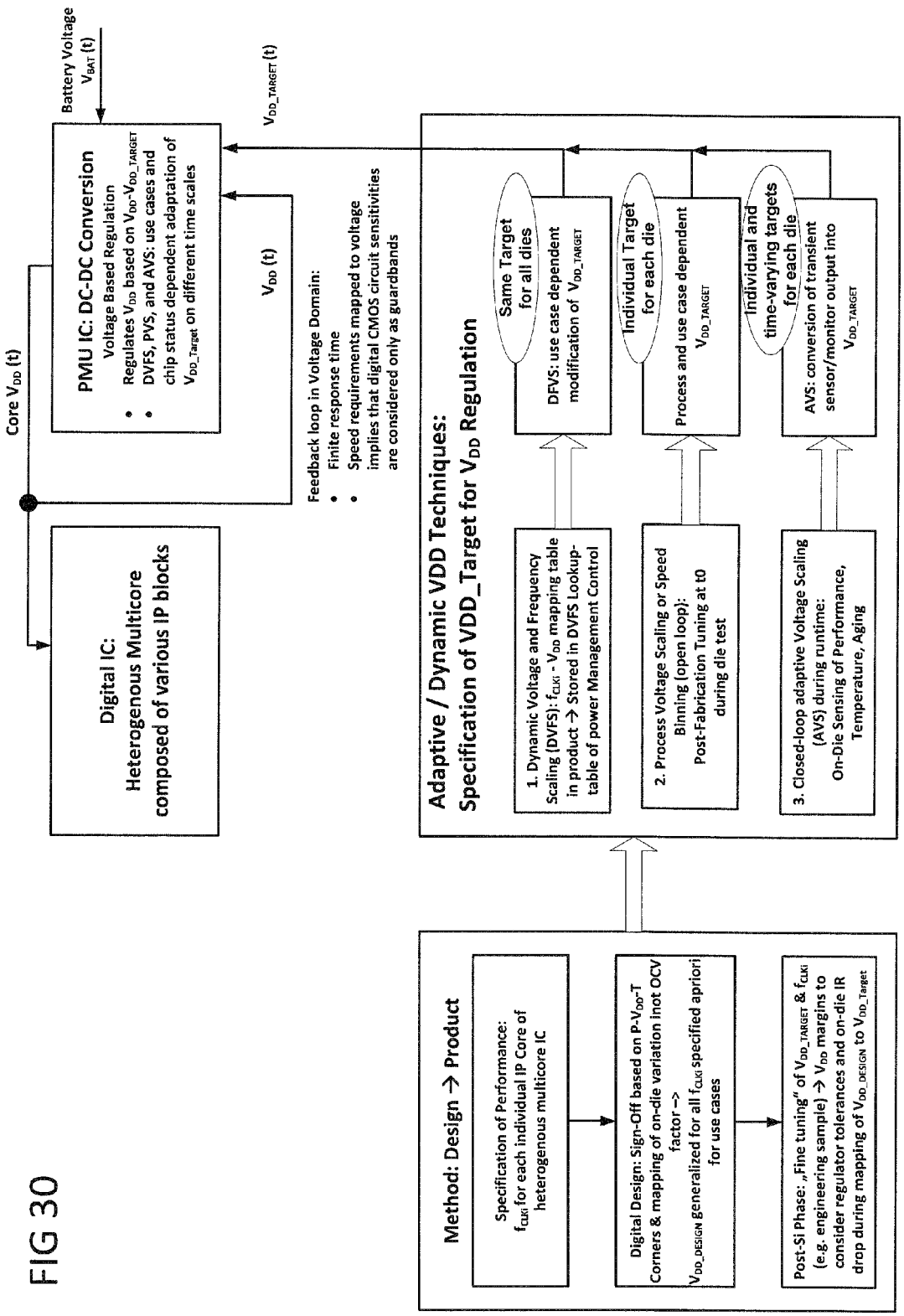
FIG. 30 illustrates conventional adaptive/dynamic VDD techniques.

FIG. 29 shows a method 2900 for operating a circuit arrangement according to another aspect of this disclosure.

In 2902, an oscillator coupled to at least one common power supply node provides a signal, wherein an oscillation frequency of the signal is dependent on power supply via the least one common power supply node. The oscillator may, for example, be configured according to one or more aspects of this disclosure, for example as a ring oscillator.

In 2904, a detecting circuit coupled to the oscillator provides a digital switch array control signal dependent on the oscillation frequency of the signal provided by the oscillator. The detecting circuit may, for example, be configured according to one or more aspects of this disclosure, for example as a frequency determination circuit.

In 2906, a switch array coupled between the at least one common power supply node and at least one power supply (or power supply source), for example, controls the power supply via the at least one common power supply node, dependent on the digital switch array control signal. The switch array may, for example, be configured according to one or more aspects of this disclosure.

In the following, various aspects and potential effects of circuit arrangements and methods described herein are discussed.

Circuit arrangements according to various aspects of this disclosure may allow for keeping the performance of a functional circuit such as e.g. a core circuit constant or substantially constant. The performance of such functional circuit may depend on PVT variations, i.e. variations in e.g. temperature, supply voltage, process, aging, etc. Variations in one or more of the aforementioned quantities or parameters may lead to a deviation of the circuit performance from the circuit's nominal performance.

In order to compensate for such PVT variations and maintain the functional circuit's nominal performance, circuit arrangements according to various aspects of this disclosure may include an electronic component (for example a delay line (e.g. programmable delay line), or an oscillator (e.g. ring oscillator)) that provides a signal (e.g. an output signal of the delay line, or an output signal of the oscillator), wherein the time behavior of the signal changes when PVT variations occur (e.g. a signal delay of the delay line's output signal changes, or an oscillating frequency of the oscillator's output signal changes when PVT variations occur).

The electronic component and the functional circuit may reside in a common voltage domain (e.g. core voltage domain), and power supply to this voltage domain may be controlled with a feedback loop based on the signal provided by the electronic component. The feedback loop may include a detecting circuit that may be coupled to the electronic component and provide a digital switch array control signal to a switch array, based on the time behavior of the electronic component's signal (e.g. a TDC providing a digital output word corresponding to the delay line's signal delay; or a frequency determination circuit providing a digital output word corresponding to the oscillator's oscillation frequency).

The switch array may include at least one switch coupled between the voltage domain (e.g. core voltage domain), in which the electronic component and the functional circuit are located, and at least one power supply (e.g. an upper supply voltage VDD and/or a lower supply voltage VSS). The digital switch array control signal may determine the switching state of the switch array's switch(es) (i.e. open or closed), in other words the number of open and closed switches, so that power supply to the common voltage domain may be controlled.

Circuit arrangements according to various aspects of this disclosure may react globally as well as locally on environmental variations. Thus, a distributed sense and react system may be provided.

Circuit arrangements according to various aspects of this disclosure may have the capability to react very quickly to an unpredictable increase of load current as may be caused, for example, by a system's interrupt handling.

Circuit arrangements according to various aspects of this disclosure may reduce speed margins and/or compensate delay variations.

Circuit arrangements according to various aspects of this disclosure may provide nearly "instantaneous" reaction to delay variations.

A circuit arrangement according to various aspects of this disclosure may include: an electronic component coupled to at least one common power supply node and configured to provide a signal, wherein variation in time of the signal is dependent on power supply via the at least one common power supply node; a detecting circuit coupled to the electronic component, the detecting circuit being configured to detect the signal provided by the electronic component and to provide a digital switch array control signal dependent on the variation in time of the signal; and a switch array coupled between the at least one common power supply node and at least one power supply, the switch array being configured to control the power supply via the at least one common power supply node dependent on the digital switch array control signal.

According to one aspect of this disclosure, the at least one power supply may include or may be an upper power supply (providing e.g. an upper supply voltage) and/or a lower supply (providing e.g. a lower supply voltage).

According to another aspect of this disclosure, the detecting circuit may be coupled to the at least one common power supply node.

According to another aspect of this disclosure, the switch array may include at least one switch, or a plurality of switches, coupled between the at least one common power supply node and the at least one power supply.

According to another aspect of this disclosure, the at least one switch, or the plurality of switches, may include or may be a transistor, for example a field effect transistor, for example a MOS transistor, e.g. a PMOS transistor and/or an NMOS transistor.

According to another aspect of this disclosure, the at least one switch, or the plurality of switches, may include or may be a switched current source.

According to another aspect of this disclosure, the at least one switch, or the plurality of switches, may include or may be a switched current mirror, e.g. a switched MOS current mirror, e.g. a switches PMOS current mirror or a switched NMOS current mirror.

According to another aspect of this disclosure, the digital switch array control signal may include a digital word. The digital word may include at least one bit, or a plurality of bits, corresponding to the at least one switch, or the plurality of switches, of the switch array.

According to another aspect of this disclosure, the electronic component may be coupled to a first common power supply node and a second common power supply node, wherein the switch array includes a first part, e.g. including at least one first switch or a plurality of first switches, coupled between the first common power supply node and a first power supply, and wherein the switch array includes a second part, e.g. including at least one second switch or a plurality of second switches, coupled between the second common power supply node and a second power supply.

According to another aspect of this disclosure, the first power supply may be an upper power supply (providing e.g. an upper supply voltage) and the second power supply may be a lower power supply (providing e.g. a lower supply voltage).

According to another aspect of this disclosure, the circuit arrangement may further include a functional circuit, for example a core circuit, coupled to the at least one common power supply node, wherein the electronic component may be configured such that a nominal variation in time of the signal provided by the electronic component is equal to or substantially equal to a nominal variation in time of a signal provided by at least one circuit structure of the functional circuit.

According to another aspect of this disclosure, the electronic component may include or may be a delay line, wherein the signal provided by the electronic component is a signal propagating through the delay line and provided at a signal output of the delay line, and wherein a propagation delay of the signal propagating through the delay line is dependent on the power supply to the at least one common power supply node.

According to another aspect of this disclosure, the delay line may include at least one delay element, or a plurality of delay elements.

According to another aspect of this disclosure, the delay line may include at least one of the following circuit structures: a critical path or a replica of a critical path; a memory path or a replica of a memory path; an input/output (I/O) path or a replica of an I/O path.

According to another aspect of this disclosure, the delay line may be configured as a programmable delay line. For example, the delay line may be programmed such that the delay line's nominal signal delay is equal to or substantially equal to a nominal signal delay of at least one circuit structure of the functional circuit.

According to another aspect of this disclosure, the delay line may include a signal propagation delay setting input for setting a nominal signal propagation delay of the delay line.

According to another aspect of this disclosure, the detecting circuit may include or may be a time-to-digital converter coupled to the delay line, the time-to-digital converter being configured to detect the signal provided at the output of the delay line and to provide the digital switch array control signal dependent on the propagation delay of the signal by the delay line.

According to another aspect of this disclosure, the digital switch array control signal provided by the time-to-digital converter may represent a thermometer code.

According to another aspect of this disclosure, the switch array may include a plurality of switches coupled between the at least one common power supply node and the at least one power supply; and the time-to-digital converter may include a series connection of a plurality of stages (also referred to as sampling stages) connected to the signal output of the delay line, wherein a signal output of each stage may be in each case coupled to a control terminal of a respective one of the plurality of switches.

According to another aspect of this disclosure, the switch array may include first to n-th switches coupled between the at least one common power supply node and the at least one power supply, n being an integer equal to or greater than one, for example greater than one, wherein the time-to-digital converter may include a series connection of first to n-th stages connected to the signal output of the delay line, and wherein a signal output of each stage may be in each case coupled to a control terminal of a respective one of the first to n-th switches.

According to another aspect of this disclosure, each stage of the time-to-digital converter may include a sampling register, the sampling register including a data signal input, a clock signal input, and an output connected to the output of the stage.

According to another aspect of this disclosure, the circuit arrangement may include a register including a data signal input, a clock signal input and an output, wherein the output of the register may be connected to an input of the delay line; and wherein the clock signal input of the register and the clock signal inputs of the sampling registers may be coupled to a clock signal.

According to another aspect of this disclosure, the switch array may include a plurality of switches coupled between the at least one common power supply node and the at least one power supply; wherein a first switch of the plurality of switches may be configured to change the power supply via the at least one common power supply node by a first amount, wherein a second switch of the plurality of switches may be configured to change the power supply via the at least one common power supply node by a second amount, and wherein the second amount may be different from the first amount.

According to another aspect of this disclosure, the first switch may include or may be a first transistor, for example a MOS transistor, e.g. a PMOS transistor or an NMOS transistor, wherein the second switch may include or may be a second transistor, for example a MOS transistor, e.g. a PMOS transistor or an NMOS transistor, wherein the first and second transistors may have different lengths or widths, or both.

According to another aspect of this disclosure, the first switch may include or may be a first transistor (for example a MOS transistor, e.g. a PMOS transistor or an NMOS transistor) connected in series with a first current source providing a first current; and the second switch may include or may be a second transistor (for example a MOS transistor, e.g. a PMOS transistor or an NMOS transistor) connected in series with a second current source providing a second current; wherein the first and second currents may have different magnitudes.

According to another aspect of this disclosure, the switch array may include first to n-th switches coupled between the at least one common power supply node and the at least one power supply, n being an integer equal to or greater than two; wherein the time-to-digital converter may include a series connection of first to n-th stages connected to the signal output of the delay line, wherein a signal output of each stage may be in each case coupled to a control terminal of a respective one of the first to n-th switches; and wherein at least an i-th switch and a j-th switch (j>i) of the first to n-th switches may be configured such that the j-th switch changes the power supply to the common power supply node by a larger amount than the i-th switch.

According to another aspect of this disclosure, the at least one common power supply node may include a first common power supply node, wherein the switch array may include first to n-th switches, n being an integer equal to or greater than two; the time-to-digital converter may include a series connection of first to n-th stages connected to the signal output of the delay line, wherein a signal output of each stage may be in each case coupled to a control terminal of a respective one of the first to n-th switches; wherein first to k-th switches (k<n) of the first to n-th switches may be coupled between the first common power supply node and a first power supply; and wherein (k+1)-th to n-th switches of the first to n-th switches may be coupled between the first common power supply node and a second power supply.

According to another aspect of this disclosure, the first power supply may be an upper power supply (providing e.g. an upper supply voltage) and the second power supply may be a lower power supply (providing e.g. a lower supply voltage).

According to another aspect of this disclosure, the circuit arrangement may include a logic circuit coupled between the detecting circuit (e.g. the time-to-digital converter) and the switch array.

According to another aspect of this disclosure, the logic circuit may be configured to provide at least one of the following functionalities: a buffering functionality; a hysteresis functionality; a filter functionality; an enable/disable functionality; a bitwise re-mapping functionality; an encoding functionality; a decoding functionality; a compression functionality; a decompression functionality.

According to another aspect of this disclosure, the electronic component may include or may be an oscillator, for example, a ring oscillator; wherein the signal provided by the electronic component may be a signal provided at an output of the oscillator; and wherein an oscillation frequency of the signal may be dependent on the power supply to the at least one common power supply node.

According to another aspect of this disclosure, the detecting circuit may include or may be a frequency determination circuit coupled to the oscillator (e.g. ring oscillator), the frequency determination circuit being configured to detect the signal provided at the output of the oscillator and to provide the digital switch array control signal dependent on the oscillation frequency of the signal.

According to another aspect of this disclosure, the frequency determination circuit may include a counter coupled to the output of the oscillator (e.g. ring oscillator) and configured to count a number of oscillations of the oscillator during a predetermined reference time interval.

According to another aspect of this disclosure, the detecting circuit may include an enabling circuit coupled to the oscillator (e.g. ring oscillator) and configured to enable the oscillator for the predetermined reference time interval.

According to another aspect of this disclosure, the circuit arrangement may further include a binary-to-thermometer-code converter coupled between the detecting circuit (e.g. the frequency determination circuit, e.g. a signal output of the counter) and the switch array.

According to another aspect of this disclosure, the circuit arrangement may include at least one additional electronic component coupled to the at least one common power supply node and configured to provide at least one additional signal, wherein variation in time of the at least one additional signal is dependent on power supply to the at least one common power supply node, and wherein the at least one additional signal is time-shifted with respect to the signal of the electronic component; at least one additional detecting circuit coupled to the at least one additional electronic component, the at least one additional detecting circuit being configured to detect the at least one additional signal provided by the at least one additional electronic component and to provide at least one additional digital switch array control signal dependent on the variation in time of the at least one additional signal; wherein the switch array may include at least one first switch and at least one additional switch coupled between the at least one common power supply node and the at least one power supply; wherein the switch array may be configured to control the power supply to the at least one common power supply node dependent on the digital switch array control signal and the at least one additional digital switch array control signal; wherein the at least one first switch may be controlled by the digital switch array control signal provided by the detecting circuit, and the at least one additional switch may be controlled by the at least one additional digital switch array control signal provided by the at least one additional detecting circuit.

According to another aspect of this disclosure, the at least one additional electronic component may include at least one additional delay line; wherein the at least one additional signal provided by the at least one additional electronic component may be a signal propagating through the at least one additional delay line and provided at an output of the at least one additional delay line; wherein a propagation delay of the signal propagating through the at least one additional delay line may be dependent on the power supply to the at least one common power supply node.

According to another aspect of this disclosure, the at least one additional delay line may include at least one delay element, or a plurality of delay elements.

According to another aspect of this disclosure, the at least one additional delay line may include at least one of the following circuit structures: a critical path or a replica of a critical path; a memory path or a replica of a memory path; an I/O path or a replica of an I/O path.

According to another aspect of this disclosure, the at least one additional delay line may be configured as a programmable delay line including a signal propagation delay setting input for setting a nominal signal propagation delay of the at least one additional delay line.

According to another aspect of this disclosure, the at least one additional detecting circuit may include at least one additional time-to-digital converter coupled to the at least one additional delay line, the at least one additional time-to-digital converter being configured to detect the signal provided at the output of the at least one additional delay line and to provide the at least one additional digital switch array control signal dependent on the propagation delay of the signal by the at least one additional delay line.

According to another aspect of this disclosure, the at least one additional digital switch array control signal provided by the at least one additional time-to-digital converter may represent a thermometer code.

According to another aspect of this disclosure, the circuit arrangement may further include at least one additional logic circuit coupled between the at least one additional time-to-digital converter and the switch array.

According to another aspect of this disclosure, the at least one additional logic circuit may be configured to provide at least one of the following functionalities: a buffering functionality; a hysteresis functionality; a filter functionality; an enable/disable functionality; a bitwise re-mapping functionality; an encoding functionality; a decoding functionality; a compression functionality; a decompression functionality.

According to another aspect of this disclosure, the at least one additional electronic component may include or may be at least one additional oscillator (e.g. ring oscillator); wherein the signal provided by the at least one additional electronic component may be a signal provided at an output of the at least one additional oscillator; wherein an oscillation frequency of the signal may be dependent on the power supply to the at least one common power supply node.

According to another aspect of this disclosure, the at least one additional detecting circuit may include or may be at least one additional frequency determination circuit coupled to the at least one additional oscillator, the at least one additional frequency determination circuit being configured to detect the signal provided at the output of the at least one additional oscillator and to provide the at least one additional digital switch array control signal dependent on the oscillation frequency of the signal.

According to another aspect of this disclosure, the at least one additional frequency determination circuit may include at least one additional counter coupled to the output of the at least one additional oscillator and configured to count a number of oscillations of the at least one additional ring oscillator during the predetermined reference time interval.

According to another aspect of this disclosure, the at least one additional detecting circuit may include at least one additional enabling circuit coupled to the at least one additional oscillator and configured to enable the at least one additional oscillator for the predetermined reference time interval.

According to another aspect of this disclosure, the at least one additional detecting circuit may include at least one additional binary-to-thermometer-code converter coupled between an output of the at least one additional counter and the switch array.

According to another aspect of this disclosure, the circuit arrangement may include at least one functional circuit, for example at least one core circuit, coupled to the at least one common power supply node.

According to another aspect of this disclosure, the circuit arrangement may further include at least one offset control switch coupled between the at least one common power supply node and a main power supply and configured to control an offset power supply to the at least one common power supply node.

According to another aspect of this disclosure, the circuit arrangement may further include an additional electronic component coupled to a main power supply and configured to provide an additional signal, wherein variation in time of the additional signal may be dependent on power supply by the main power supply; an additional detecting circuit coupled to the additional electronic component, the additional detecting circuit being configured to detect the additional signal provided by the additional electronic component and to provide an additional digital switch array control signal dependent on the variation in time of the additional signal; wherein the switch array may include at least one first switch coupled between the at least one common power supply node and the at least one power supply, and at least one additional switch coupled between the at least one common power supply node and the main power supply; wherein the switch array may be configured to control the power supply via the at least one common power supply node dependent on the digital switch array control signal and the additional digital switch array control signal, wherein the at least one first switch may be controlled by the digital switch array control signal and the at least one additional switch may be controlled by the additional digital switch array control.

According to another aspect of this disclosure, a circuit arrangement may include: an electronic component coupled to at least one common power supply node and configured to provide a signal; a detecting circuit coupled to the electronic component, the detecting circuit configured to detect a power supply dependent signal propagation delay of the signal and to provide a digital switch array control signal dependent on the detected signal propagation delay; a switch array coupled between the at least one common power supply node and at least one power supply, the switch array being configured to control power supply to the at least one common power supply node dependent on the digital switch array control signal.

According to another aspect of this disclosure, a circuit arrangement may include: a delay line coupled to at least one common power supply node and configured to provide a signal, wherein a delay of the signal is dependent on power supply to the at least one common power supply node; a time-to-digital converter coupled to the delay line, the time-to-digital converter being configured to detect the signal provided by the delay line and to provide a digital switch array control signal dependent on the delay of the signal; a switch array coupled between the at least one common power supply node and at least one power supply, the switch array being configured to control the power supply to the at least one common power supply node dependent on the digital switch array control signal.

The delay line may be configured as programmable delay line.

The switch array may include at least one switch coupled between the at least one common power supply node and the at least one power supply, the at least one switch being controlled by the digital control signal.

The circuit arrangement may further include a functional circuit coupled to the at least one common power supply node, wherein a nominal signal delay of the delay line may be equal to or substantially equal to a nominal signal delay of at least one circuit structure in the functional circuit.

According to another aspect of this disclosure, a circuit arrangement may include: an oscillator coupled to at least one common power supply node and configured to provide a signal, wherein an oscillation frequency of the signal is dependent on power supply to the at least one common power supply node; a detecting circuit coupled to the oscillator, the detecting circuit being configured to detect the signal provided by the oscillator and to provide a digital switch array control signal dependent on the oscillation frequency of the signal; a switch array coupled between the at least one common power supply node and at least one power supply, the switch array being configured to control the power supply to the at least one common power supply node dependent on the digital switch array control signal.

The switch array may include at least one switch coupled between the at least one common power supply node and the at least one power supply, the at least one switch being controlled by the digital control signal.

According to another aspect of this disclosure, a method for operating a circuit arrangement may include: providing a signal by an electronic component coupled to at least one common power supply node, wherein variation in time of the signal is dependent on power supply to the least one common power supply node; providing a digital switch array control signal dependent on the variation in time of the signal provided by the electronic component; controlling the power supply to the at least one common power supply node by means of a switch array coupled between the at least one common power supply node and at least one power supply, dependent on the digital switch array control signal.

According to another aspect of this disclosure, a method for operating a circuit arrangement may include: providing a signal by a delay line coupled to at least one common power supply node, wherein a delay of the signal is dependent on power supply to the least one common power supply node; providing a digital switch array control signal dependent on the delay of the signal provided by the delay line; controlling the power supply to the at least one common power supply node by means of a switch array coupled between the at least one common power supply node and at least one power supply, dependent on the digital switch array control signal.

According to another aspect of this disclosure, a method for operating a circuit arrangement may include: providing a signal by an oscillator coupled to at least one common power supply node, wherein an oscillation frequency of the signal is dependent on power supply to the least one common power supply node; providing a digital switch array control signal dependent on the oscillation frequency of the signal provided by the oscillator; controlling the power supply to the at least one common power supply node by means of a switch array coupled between the at least one common power supply node and at least one power supply, dependent on the digital switch array control signal.

While the invention has been particularly shown and described with reference to specific aspects of this disclosure, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement comprising:
an electronic component coupled to at least one common power supply node and configured to provide a first signal having a variation in time that is based on power supply via the at least one common power supply node;
a detecting circuit coupled to the electronic component, the detecting circuit being configured to detect the first signal and to provide a digital switch array control signal based on the variation in time of the first signal;
a switch array coupled between the at least one common power supply node and at least one power supply source;
at least one additional electronic component coupled to the at least one common power supply node and configured to provide at least one additional signal, wherein variation in time of the at least one additional signal is dependent on power supply via the at least one common power supply node, and wherein the at least one additional signal is time-shifted with respect to the first signal;
at least one additional detecting circuit coupled to the at least one additional electronic component, the at least one additional detecting circuit being configured to detect the at least one additional signal and to provide at least one additional digital switch array control signal based on the variation in time of the at least one additional signal;
wherein the switch array comprises at least one first switch and at least one additional switch coupled between the at least one common power supply node and the at least one power supply source;
wherein the switch array is configured to control the power supply via the at least one common power supply node based on the digital switch array control signal and the at least one additional digital switch array control signal;
wherein the at least one first switch is controlled by the digital switch array control signal and the at least one additional switch is controlled by the at least one additional digital switch array control signal.

2. The circuit arrangement of claim 1,
wherein the switch array comprises at least one switch coupled between the at least one common power supply node and the at least one power supply source;
wherein the at least one switch comprises at least one of the following:
a transistor;
a switched current source;
a switched current mirror.

3. The circuit arrangement of claim 1, further comprising:
a functional circuit coupled to the at least one common power supply node having at least one circuit structure for providing a second signal, wherein a nominal variation in time of the first signal is substantially equal to a nominal variation in time of the second signal.

4. The circuit arrangement of claim 1,
wherein the switch array comprises a plurality of switches coupled between the at least one common power supply node and the at least one power supply source; and
wherein the digital switch array control signal comprises a digital word comprising a plurality of bits corresponding to the plurality of switches.

5. The circuit arrangement of claim 1,
wherein the electronic component is coupled to a first common power supply node and a second common power supply node;
wherein the switch array comprises a first portion coupled between the first common power supply node and a first power supply source; and
wherein the switch array comprises a second portion coupled between the second common power supply node and a second power supply source.

6. The circuit arrangement of claim 1,
wherein the electronic component comprises a delay line;
wherein the first signal is a signal propagating through the delay line and provided at a signal output of the delay line;
wherein a propagation delay of the signal propagating through the delay line is based on the power supply via the at least one common power supply node.

7. The circuit arrangement of claim 6,
wherein the delay line comprises at least one of the following circuit structures:
a critical path or a replica of a critical path;
a memory path or a replica of a memory path;
an input-output path or a replica of an input-output path.

8. The circuit arrangement of claim 6,
wherein the delay line is configured as a programmable delay line.

9. The circuit arrangement of claim 6,
wherein the detecting circuit comprises a time-to-digital converter coupled to the delay line, the time-to-digital converter being configured to detect the signal provided at the signal output of the delay line and to provide the digital switch array control signal based on the propagation delay of the signal.

10. The circuit arrangement of claim 9,
wherein the switch array comprises a plurality of switches coupled between the at least one common power supply node and the at least one power supply source;
wherein the time-to-digital converter comprises a series connection of a plurality of stages connected to the signal output of the delay line, wherein a signal output of each stage is in each case coupled to a control terminal of a respective one of the plurality of switches.

11. The circuit arrangement of claim 1,
wherein the switch array comprises a plurality of switches coupled between the at least one common power supply node and the at least one power supply source;
wherein a first switch of the plurality of switches is configured to change the power supply via the at least one common power supply node by a first amount;
wherein a second switch of the plurality of switches is configured to change the power supply via the at least one common power supply node by a second amount;
wherein the second amount is different from the first amount.

12. The circuit arrangement of claim 1,
further comprising a logic circuit coupled between the detecting circuit and the switch array.

13. The circuit arrangement of claim 12,
wherein the logic circuit is configured to provide at least one of the following functionalities:
a buffering functionality;
a hysteresis functionality;
a filter functionality;
an enable/disable functionality;
a bitwise re-mapping functionality;
an encoding functionality;
a decoding functionality;
a compression functionality;
a decompression functionality.

14. The circuit arrangement of claim 1,
wherein the electronic component comprises an oscillator;
wherein the first signal is a signal provided at a signal output of the oscillator;

wherein an oscillation frequency of the signal is based on the power supply via the at least one common power supply node.

15. The circuit arrangement of claim 14, wherein the oscillator is a ring oscillator.

16. The circuit arrangement of claim 14, wherein the detecting circuit comprises a frequency determination circuit coupled to the oscillator, the frequency determination circuit being configured to detect the first signal provided at the signal output of the oscillator and to provide the digital switch array control signal based on the oscillation frequency of the signal.

17. The circuit arrangement of claim 16, further comprising:
a binary-to-thermometer-code converter coupled between the detecting circuit and the switch array.

18. A circuit arrangement comprising:
an electronic component coupled to at least one common power supply node and configured to provide a first signal having a variation in time that is based on power supply via the at least one common power supply node;
a detecting circuit coupled to the electronic component, the detecting circuit being configured to detect the first signal and to provide a digital switch array control signal based on the variation in time of the first signal;
a switch array coupled between the at least one common power supply node and at least one power supply source;
an additional electronic component coupled to a main power supply source and configured to provide an additional signal, wherein variation in time of the additional signal is based on power supply by the main power supply source;
an additional detecting circuit coupled to the additional electronic component, the additional detecting circuit being configured to detect the additional signal provided by the additional electronic component and to provide an additional digital switch array control signal based on the variation in time of the additional signal;
wherein the switch array comprises at least one first switch coupled between the at least one common power supply node and the at least one power supply source, and at least one additional switch coupled between the at least one common power supply node and the main power supply source;
wherein the switch array is configured to control the power supply via the at least one common power supply node based on the digital switch array control signal and the additional digital switch array control signal,
wherein the at least one first switch is controlled by the digital switch array control signal and the at least one additional switch is controlled by the additional digital switch array control signal.

19. A method for operating a circuit arrangement, the method comprising:
providing a signal by an electronic component coupled to at least one common power supply node, wherein variation in time of the signal is dependent on power supply to the least one common power supply node;
providing a digital switch array control signal dependent on the variation in time of the signal provided by the electronic component;
providing at least one additional signal by at least one additional electronic component coupled to the at least one common power supply node, wherein variation in time of the at least one additional signal is dependent on power supply to the at least one common power supply node, and wherein the at least one additional signal is time-shifted with respect to the first signal;
providing at least one additional digital switch array control signal based on the variation in time of the at least one additional signal and the at least one additional digital switch array control signal;
controlling the power supply to the at least one common power supply node by means of a switch array coupled between the at least one common power supply node and at least one power supply source, dependent on the digital switch array control signal and on the at least one additional digital switch array control signal wherein the switch array comprises at least one first switch and at least one additional switch coupled between the at least one common power supply node and the at least one power supply source and wherein the at least one first switch is controlled by the digital switch array control signal and the at least one additional switch is controlled by the at least one additional digital switch array control signal.

20. A method for operating a circuit arrangement, the method comprising:
providing a signal by an electronic component coupled to at least one common power supply node, wherein variation in time of the signal is dependent on power supply to the least one common power supply node;
providing a digital switch array control signal dependent on the variation in time of the signal provided by the electronic component;
providing an additional signal by an additional electronic component coupled to a main power supply source, wherein variation in time of the additional signal is based on power supply by the main power supply source;
providing an additional digital switch array control signal based on the variation in time of the additional signal controlling the power supply to the at least one common power supply node by means of a switch array coupled between the at least one common power supply node and at least one power supply source, dependent on the digital switch array control signal and on the additional digital switch array control signal wherein the switch array comprises at least one first switch coupled between the at least one common power supply node and the at least one power supply source, and at least one additional switch coupled between the at least one common power supply node and the main power supply source and wherein the at least one first switch is controlled by the digital switch array control signal and the at least one additional switch is controlled by the additional digital switch array control signal.

* * * * *